(12) United States Patent
Araki et al.

(10) Patent No.: US 10,541,073 B2
(45) Date of Patent: *Jan. 21, 2020

(54) SUPERCONDUCTING COIL AND SUPERCONDUCTING DEVICE

(71) Applicant: Kabushiki Kaisha Toshiba, Minato-ku (JP)

(72) Inventors: Takeshi Araki, Koto (JP); Kenji Tasaki, Nakano (JP); Hirotaka Ishii, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 409 days.

This patent is subject to a terminal disclaimer.

(21) Appl. No.: 15/446,471

(22) Filed: Mar. 1, 2017

(65) Prior Publication Data

US 2018/0061541 A1 Mar. 1, 2018

(30) Foreign Application Priority Data

Aug. 31, 2016 (JP) .................................. 2016-169812
Feb. 9, 2017 (JP) .................................. 2017-021950

(51) Int. Cl.
*H01F 6/06* (2006.01)
*C04B 35/45* (2006.01)
(Continued)

(52) U.S. Cl.
CPC ........... *H01F 6/06* (2013.01); *C04B 35/4508* (2013.01); *C04B 35/624* (2013.01);
(Continued)

(58) Field of Classification Search
CPC . H01F 6/06; C04B 35/4508; C04B 35/62222; C04B 35/624
See application file for complete search history.

(56) References Cited

U.S. PATENT DOCUMENTS

2005/0159298 A1* 7/2005 Rupich ............... H01L 39/2425
502/100
2006/0058195 A1 3/2006 Araki et al.
(Continued)

FOREIGN PATENT DOCUMENTS

DE 11 2015 003 735 T5 5/2017
EP 2 055 677 A1 5/2009
(Continued)

OTHER PUBLICATIONS

Office Action dated Aug. 20, 2019 in Japanese Patent Application No. 2017-021950. 10 pages (with English translation).
(Continued)

*Primary Examiner* — Paul A Wartalowicz
(74) *Attorney, Agent, or Firm* — Oblon, McClelland, Maier & Neustadt, L.L.P.

(57) ABSTRACT

A superconducting coil of an embodiment includes a superconducting wire including an oxide superconductor layer. The oxide superconductor layer has a continuous Perovskite structure including rare earth elements, barium (Ba), and copper (Cu). The rare earth elements include a first element which is praseodymium (Pr), at least one second element selected from the group consisting of neodymium (Nd), samarium (Sm), europium (Eu), and gadolinium (Gd), at least one third element selected from the group consisting of yttrium (Y), terbium (Tb), dysprosium (Dy), and holmium (Ho), and at least one fourth element selected from the group consisting of erbium (Er), thulium (Tm), ytterbium (Yb), and lutetium (Lu).

17 Claims, 40 Drawing Sheets

(51) Int. Cl.
   *C04B 35/624*   (2006.01)
   *C04B 35/622*   (2006.01)
(52) U.S. Cl.
   CPC ............ *C04B 35/62222* (2013.01); *C04B 2235/3215* (2013.01); *C04B 2235/3224* (2013.01); *C04B 2235/3225* (2013.01); *C04B 2235/3282* (2013.01)

(56) References Cited

U.S. PATENT DOCUMENTS

| | | | |
|---|---|---|---|
| 2009/0270263 A1* | 10/2009 | Aoki | C23C 18/1216 505/470 |
| 2014/0066311 A1 | 3/2014 | Araki et al. | |
| 2014/0066314 A1* | 3/2014 | Maeda | H01L 39/247 505/230 |
| 2017/0236623 A1 | 8/2017 | Jin et al. | |
| 2018/0047487 A1 | 2/2018 | Araki et al. | |

FOREIGN PATENT DOCUMENTS

| | | |
|---|---|---|
| EP | 2 704 224 A1 | 3/2014 |
| EP | 3 282 492 A1 | 2/2018 |
| JP | 2017-057114 A | 3/2017 |
| WO | WO 2016/024528 A1 | 2/2016 |
| WO | WO 2017/145401 A1 | 8/2017 |

OTHER PUBLICATIONS

"Superconducting material and Superconducting Element Research Report" Industrial Engineering Council, Technical Division of Japan, 2010, 112 Pages.

Martin W. Rupich, et al., "Advances in Second Generation High Temperature Superconducting Wire Manufacturing and R&D at American Superconductor Corporation", Superconductor Sci. Technol., vol. 23, 2010, pp. 1-9.

P. Mele, et al., "Incorporation of double artificial pinning centers in $YBa_2Cu_3O_{7-\delta}$ films", Physica C., vol. 468, 2008, pp. 1631-1634.

* cited by examiner c-AXIS DIRECTION

SUPERCONDUCTING COIL AND SUPERCONDUCTING DEVICE

CROSS-REFERENCE TO RELATED APPLICATION

This application is based upon and claims the benefit of priority from Japanese Patent Application No. 2016-169812, filed on Aug. 31, 2016, and Japanese Patent Application No. 2017-021950, filed on Feb. 9, 2017, the entire contents of which are incorporated herein by reference.

FIELD

Embodiments described herein relate generally to a superconducting coil and a superconducting device.

BACKGROUND

Superconducting devices for most applications except a power transmission cable are used in a magnetic field. In a case of a power transmission cable, when cooling is performed around 4 K using liquid helium, cooling cost is enormous. Therefore, a superconductor used for a power transmission cable is limited to a high-temperature oxide superconductor.

The superconductor used for a power transmission cable is a yttrium (Y)-based wire material. The superconductor used for a power transmission cable is mostly a Y-based wire material manufactured by a metalorganic deposition using trifluoroacetates (TFA-MOD) method.

When a superconductor is applied to a coil, the superconductor is exposed to a magnetic field except a special case such as a superconducting current limiter for suppressing an influence of generation of a magnetic field. A characteristic of a superconductor is reduced by a Lorentz force or the like in a magnetic field. Therefore, it is assumed to use a metal-based superconductor at a temperature of 4 K, to use a Bi-based superconductor at a temperature of 15 to 20 K, and to use a Y-based superconductor at a temperature of 30 to 50 K.

When superconduction is applied to a coil, mainly, a metal-based superconductor has been used at 4 K. However, when a superconducting coil is immersed in liquid helium to be used, the amount of helium necessary at an initial stage of immersion is about four times the volume of a container. For example, the amount of helium necessary for immersion in a 400 liter (L) container is 1600 L.

The price of helium is rising, and will further rise in the future. Helium is produced together with natural gas stored in an upper portion of bedrock. Therefore, helium is not produced in a shale gas field positioned at a lower portion of bedrock. It is considered that the amount of helium produced together with natural gas has already exceeded a peak, and it is considered that helium will be further exhausted in the future to raise the price.

The price of helium has risen approximately to 5000 yen per liter even now. For example, if 1600 L is required for immersion in a 400 L container, helium cost of eight million yen is required. Therefore, in recent years, a superconducting system capable of being used by freezer cooling has been expected. It is expected to use a superconductor not at a temperature of 4 K at which cooling cost is large but basically at a temperature of 30 K or higher.

A superconducting coil requires a technique of vacuum heat insulation. Reduction of the degree of vacuum makes cooling maintenance by a freezer difficult, and stops an entire system. Therefore, maintenance of the degree of vacuum is an important problem in a superconduction application system.

Sealing of many metal welded portions is indispensable for maintenance of the degree of vacuum. When sealing is weakened, vacuum heat insulation cannot be maintained, and maintenance such as vacuum drawing is required again. This case increases maintenance cost or lowers reliability of a system.

In general, a metal welded portion is further deteriorated, and a leak possibility thereof is increased when vibration is applied thereto at a low temperature. A metal bond is a bond held by transfer of a free electron. The mobility of a free electron is reduced by cooling to an extremely low temperature, and a metal bond is weakened. Particularly, it is considered that a large damage is given by reception of vibration at 4 K. Therefore, it is desirable to use a Bi-based superconductor at 15 to 20 K or to use a Y-based superconductor at 30 to 50 K for a superconducting coil.

A Bi-based superconductor or a Y-based superconductor is used as a high-temperature metal oxide superconductor, but is used at a low temperature of a liquid nitrogen temperature or lower in a magnetic field. Particularly, the Bi-based superconductor has an additional problem. In the Bi-based superconductor, a minimum silver ratio at a cross section of a wire material is 60%, and cost thereof is high. Oxygen permeation is required during a heat treatment. In order to improve strength, a precious metal such as gold is required, and cost thereof is further increased. However, it is difficult to obtain a sufficient strength. Therefore, it is difficult to use the Bi-based superconductor for a large device in which a hoop stress of several tens tons is applied to a coil.

Because of the above reasons, manufacturing withdrawal of a Bi-based wire material has occurred successively, and a Y-based wire material is mostly used as a superconducting wire used for a superconducting coil.

In general, a superconductor which is not limited to a Y-based wire material can be present with a magnetic flux as long as it is a second type superconductor. A technique for causing a superconducting characteristic even in a magnetic field by fixing a magnetic flux to a part is an artificial pin technique. It is considered that an artificial pin requires a size of about 3 nm at about 30 K although the size of the artificial pin depends on an application temperature.

In formation of an artificial pin in a Y-based superconducting wire, a TFA-MOD method which has dominated a power transmission cable market has not obtained a satisfactory result in a magnetic field application so far. In the present situation, an effective artificial pin cannot be formed, and a coil used in a magnetic field has not been manufactured even by way of trial. In this system, an artificial pin of $Dy_2O_3$ or the like is formed. However, the size thereof is as huge as 20 to 30 nm, and it is considered that such an artificial pin does not act as an artificial pin.

An artificial pin having a huge size is not effective in two points. One of the points is that reduction of the number of artificial pins lowers a pinning effect. When a volume of an artificial pin occupied in a wire material is constant in order to maintain the amount of a current, the number of artificial pins of 30 nm is 1/1000 of the number of artificial pins of 3 nm. Therefore, there is a risk that a magnetic flux could not be fixed sufficiently.

The other one of the points is that the too large size of an artificial pin lowers a pinning effect. When the size of an artificial pin is large, many magnetic fluxes enter the artificial pin. A force of an artificial pin to hold a magnetic flux is applied only to an interface between superconduction and non-superconduction. Therefore, when a plurality of magnetic fluxes enters an artificial pin, a stress of the total amount of a Lorentz force is added, and the magnetic flux goes through the interface. Therefore, there is a risk that a magnetic flux could not be fixed sufficiently.

A physical deposition method such as a pulsed laser deposition (PLD) method or a metal organic chemical vapor deposition (MOCVD) method has been developed as a leading magnetic field application in this situation. In the physical deposition method, an artificial pin is introduced easily, and a $BaZrO_3$ (BZO) artificial pin is often introduced. Many efforts have been made in order to control the size of an artificial pin to 3 nm. In recent years, an artificial pin of about 5 nm has been developed.

As for this BZO artificial pin, a quenching burning accident has often occurred in application thereof to a coil, and it seems that there is no successful example. In addition, it is said that the quenching burning accident occurs at a current value lower than a half of a current value capable of causing energization. For example, when a manufacturer says that energization is possible up to 100 A for a superconducting wire which can be energized at 200 A, it is said that the quenching burning accident occurs by energization at 80 A. As an extreme example, there is a report that destabilization occurs at about 25% of a maximum current value.

A cause of this quenching burning accident has not been necessarily clarified. Realization of a superconducting coil which has suppressed a quenching burning accident is expected.

There is also a report of a result in which uniformity of a generated magnetic field is deteriorated not to satisfy a spec even when the case has not caused a quenching burning accident. Realization of a superconducting coil capable of generating a stable magnetic field is also expected.

DETAILED DESCRIPTION

Figure 1A:
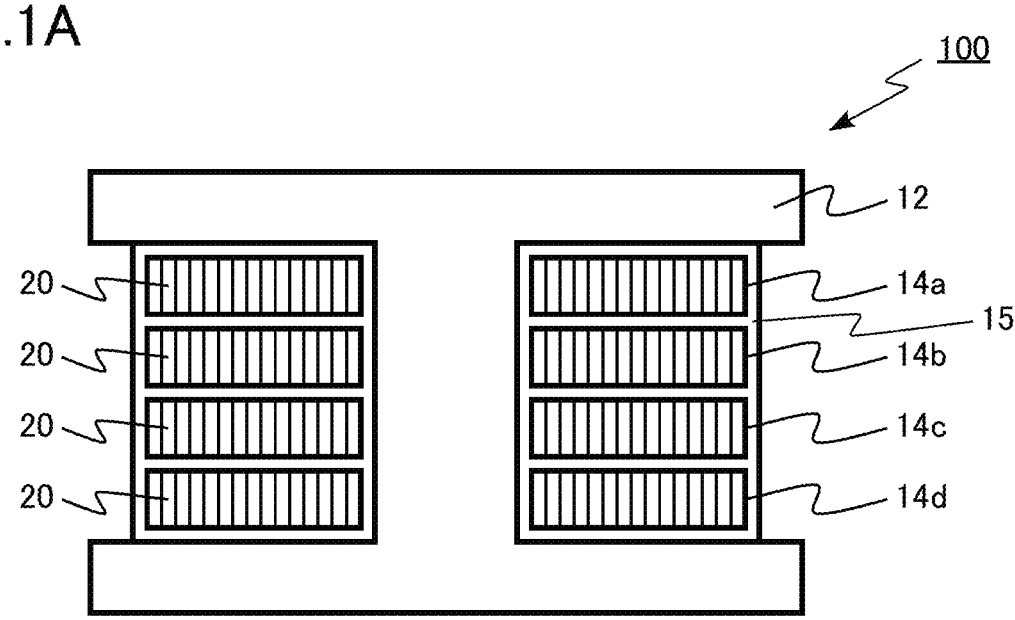
FIGS. 1A and 1B are schematic views of a superconducting coil of a first embodiment.

A superconducting coil of an embodiment includes a superconducting wire including an oxide superconductor layer. The oxide superconductor layer has a continuous Perovskite structure including a rare earth element, barium (Ba), and copper (Cu). The rare earth element contains a first element which is praseodymium (Pr), at least one second element selected from the group consisting of neodymium (Nd), samarium (Sm), europium (Eu), and gadolinium (Gd), at least one third element selected from the group consisting of yttrium (Y), terbium (Tb), dysprosium (Dy), and holmium (Ho), and at least one fourth element selected from the group consisting of erbium (Er), thulium (Tm), ytterbium (Yb), and lutetium (Lu).

Here, a crystallographically continuous structure is assumed to be a "single crystal". A crystal having a low inclination angle grain boundary having a difference of 1.0 degree or less in a c-axis direction is also assumed to be a "single crystal".

Here, a pinning atom (PA) is a rare earth element acting as an artificial pin of an oxide superconductor layer. PA forms a non-superconducting unit cell. Only praseodymium (Pr) is used for PA.

Here, a supporting atom (SA) is a rare earth element for promoting clustering of an artificial pin. A trivalent ionic radius of SA is smaller than a trivalent ionic radius of PA, and is larger than a trivalent ionic radius of MA described below.

Here, a matrix atom (MA) is a rare earth element for forming a matrix phase of an oxide superconductor layer.

Here, a counter atom (CA) is a rare earth element for forming a cluster with PA or SA. A trivalent ionic radius of CA is smaller than a trivalent ionic radius of MA.

Here, a first generation type atom-replaced artificial pin (first ARP) means an artificial pin in which a non-superconducting unit cell containing PA is ultimately dispersed in a matrix phase of a superconducting unit cell containing MA. Ultimate dispersion is a form in which a non-superconducting unit cell is present alone in a matrix phase.

Here, a second generation type clustered atom-replaced artificial pin (second CARP) means an artificial pin in which a unit cell containing PA, a unit cell containing SA, and a unit cell containing CA are clustered in a matrix phase of a superconducting unit cell containing MA. The second CARP has a larger artificial pin size than the first ARP.

Here, a third generation type clustered atom-replaced artificial pin (third CARP) means an artificial pin in which a unit cell containing PA and a unit cell containing CA are clustered in a matrix phase of a superconducting unit cell containing MA. The third CARP is different from the second CARP in containing no SA.

Here, the "superconducting device" is a generic name of a device using a superconductor.

Hereinafter, a superconducting coil of an embodiment is described with reference to the drawings.

First Embodiment

A superconducting coil of the present embodiment includes a superconducting wire. The superconducting wire contains an oxide superconductor layer. The oxide superconductor layer has a continuous Perovskite structure containing rare earth elements, barium (Ba), and copper (Cu) The rare earth element contains a first element which is praseodymium (Pr), at least one second element selected from the group consisting of neodymium (Nd), samarium (Sm), europium (Eu), and gadolinium (Gd), at least one third element selected from the group consisting of yttrium (Y), terbium (Tb), dysprosium (Dy), and holmium (Ho), and at least one fourth element selected from the group consisting of erbium (Er), thulium (Tm), ytterbium (Yb), and lutetium (Lu).

Figure 1B:
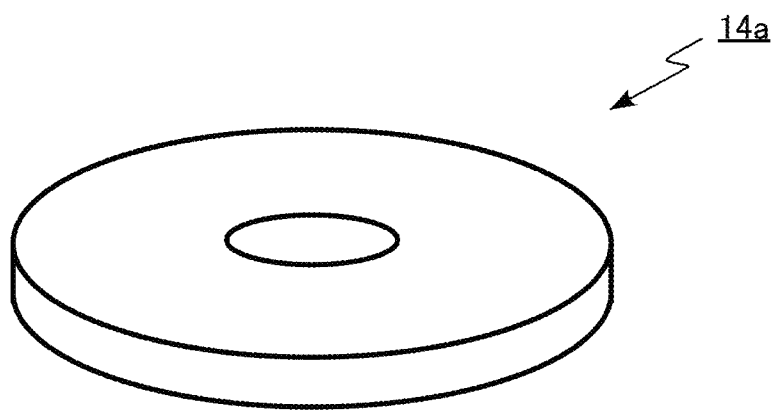

FIGS. 1A and 1B are schematic views of a superconducting coil of the present embodiment. FIG. 1A is a cross-sectional view, and FIG. 1B is a perspective view of a pancake coil as a part of the superconducting coil.

In a superconducting coil 100, as illustrated in FIG. 1A, four pancake coils 14a, 14b, 14c, and 14d as illustrated in FIG. 1B are stacked around a shaft of a bobbin 12. The pancake coils 14a, 14b, 14c, and 14d are formed by winding a superconducting wire 20 in a spiral form. For example, surroundings of the pancake coils 14a, 14b, 14c, and 14d are covered with an impregnation resin layer 15 such as an epoxy resin.

The superconducting coil 100 of the present embodiment can be in various forms such as a saddle form. The superconducting coil 100 of the present embodiment can be used for various applications such as a heavy particle radiotherapeutic device, a superconducting magnetically-levitated train, and a test coil for nuclear fusion.

Figure 2A:
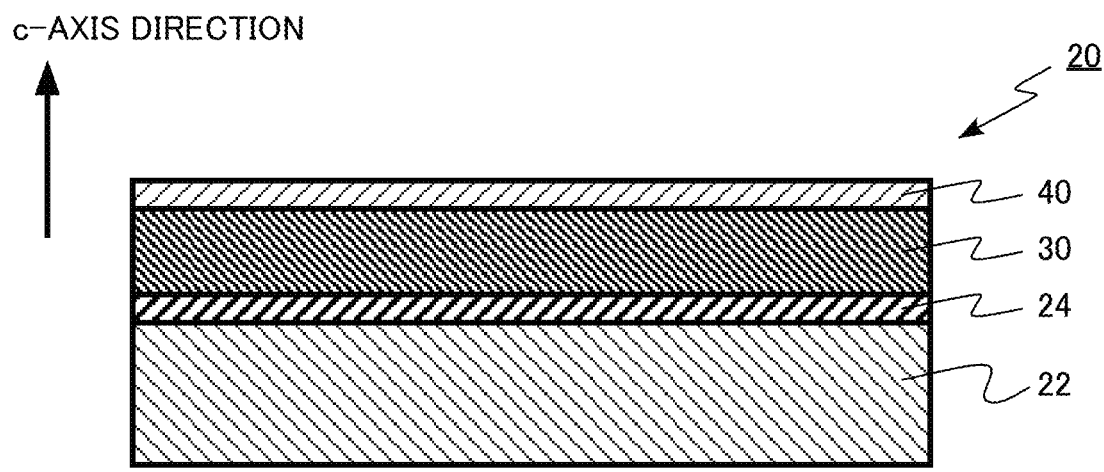
FIGS. 2A and 2B are schematic cross-sectional views of a superconducting wire in the first embodiment.
Figure 2B:
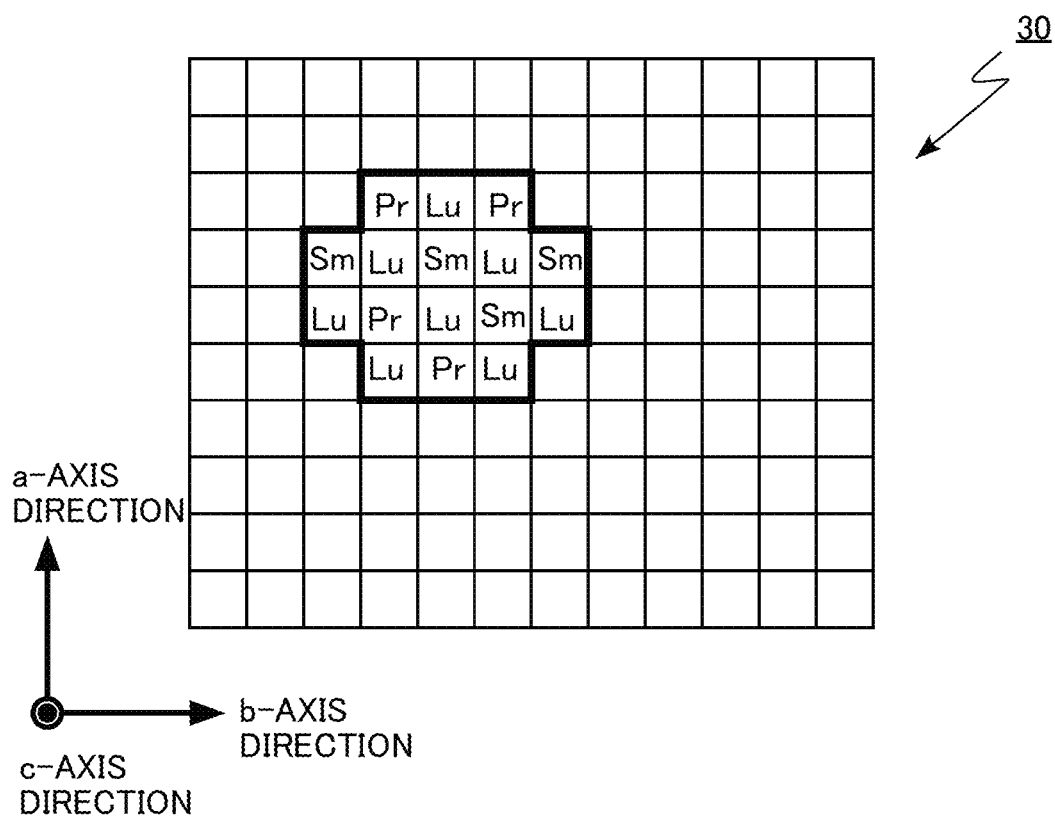

FIGS. 2A and 2B are schematic cross-sectional views of the superconducting wire in the present embodiment. FIG. 2A is an entire view, and FIG. 2B is an enlarged schematic cross-sectional view of the superconducting wire.

As illustrated in FIG. 2A, the superconducting wire 20 includes a tape-shaped substrate 22, an intermediate layer 24, an oxide superconductor layer 30, and a metal layer 40. The substrate 22 increases a mechanical strength of the oxide superconductor layer 30. The intermediate layer 24 is a so-called oriented intermediate layer. The intermediate layer 24 is provided in order to orient the oxide superconductor layer 30 to obtain a single crystal when a film of the oxide superconductor layer 30 is formed. The metal layer 40 is a so-called stabilizing layer. The metal layer 40 protects the oxide superconductor layer 30. In addition, the metal layer 40 causes a current to flow in a bypass even when a superconducting state becomes partially unstable during actual use of the superconducting wire 20.

For example, the tape-shaped substrate 22 is formed of a metal tape such as a nickel-tungsten alloy. For example, the intermediate layer 24 is formed of yttrium oxide ($Y_2O_3$), yttria stabilized zirconia (YSZ), and cerium oxide ($CeO_2$) from the substrate 22 side. For example, a layer structure of the substrate 22 and the intermediate layer 24 is nickel-tungsten alloy/yttrium oxide/yttria stabilized zirconia/cerium oxide. In this case, the oxide superconductor layer 30 is formed on cerium oxide.

As the substrate 22 and the intermediate layer 24, for example, an ion beam assisted deposition (IBAD) substrate can be used. When the IBAD substrate is used, the substrate 22 is a non-oriented layer. The intermediate layer 24 is, for example, formed of a five-layer structure. For example, lower two layers are non-oriented layers, an oriented source layer is formed thereon by an IBAD method, and two metal oxide oriented layers are formed thereon. In this case, the uppermost oriented layer lattice-matches with the oxide superconductor layer 30.

The oxide superconductor layer 30 has a continuous Perovskite structure containing a rare earth element, barium (Ba), and copper (Cu). The rare earth element contains a first element which is praseodymium (Pr), at least one second element selected from the group consisting of neodymium (Nd), samarium (Sm), europium (Eu), and gadolinium (Gd), at least one third element selected from the group consisting of yttrium (Y), terbium (Tb), dysprosium (Dy), and holmium (Ho), and at least one fourth element selected from the group consisting of erbium (Er), thulium (Tm), ytterbium (Yb), and lutetium (Lu).

Hereinafter, the first element is referred to as a pinning atom (PA), the second element is referred to as a supporting atom (SA), the third element is referred to as a matrix atom (MA), and the fourth element is referred to as a counter atom (CA).

The oxide superconductor layer 30 in the present embodiment contains a second generation type clustered atom-replaced artificial pin (second CARP).

The kind of a rare earth element contained in the oxide superconductor layer 30 can be identified using secondary ion mass spectrometry (SIMS).

The oxide superconductor layer 30 is formed of a single crystal having a continuous Perovskite structure. For example, the Perovskite structure is described by $REBa_2Cu_3O_{7-y}$ ($-0.2 \leq y \leq 1$) (hereinafter, REBCO). RE is a rare earth site.

For example, the layer thickness of the oxide superconductor layer 30 is 0.1 μm or more and 10 μm or less. For example, the entire oxide superconductor layer 30 is formed of a single crystal in a layer thickness direction.

For example, the single crystal is present in a range of 50 nm or more from the substrate 22 side of the oxide superconductor layer 30 and 70% or less of an average layer thickness of the oxide superconductor layer 30 in the oxide superconductor layer 30. For example, the single crystal has a size of 500 nm×100 nm or more in a cross section of the oxide superconductor layer 30 in a layer thickness direction thereof.

For example, the oxide superconductor layer 30 contains fluorine of $2.0 \times 10^{15}$ atoms/cc or more and $5.0 \times 10^{19}$ atoms/cc or less and carbon of $1.0 \times 10^{17}$ atoms/cc or more and $5.0 \times 10^{20}$ atoms/cc or less. The fluorine and carbon contained in the oxide superconductor layer 30 are residual elements caused by forming a film of the oxide superconductor layer 30 by a TFA-MOD method. For example, the fluorine and carbon in the oxide superconductor layer 30 are present in a grain boundary of a single crystal.

For example, the fluorine contained in the oxide superconductor layer 30 has a concentration of $2.0 \times 10^{16}$ atoms/cc or more. For example, the carbon contained in the oxide superconductor layer 30 has a concentration of $1.0 \times 10^{18}$ atoms/cc or more.

For example, the concentration of each of the fluorine and carbon in the oxide superconductor layer 30 can be measured using SIMS.

For example, the metal layer 40 is formed of a metal containing silver (Ag) or copper (Cu) as a base material, and may be an alloy. The metal layer 40 may contain a small amount of precious metal such as gold (Au).

FIG. 2B is an enlarged schematic cross-sectional view of the oxide superconductor layer 30, viewed from above a film thereof, that is, from a direction of the c-axis thereof. Each square indicates a unit cell in a single crystal.

FIG. 2B illustrates a case where PA is praseodymium (Pr), SA is samarium (Sm), MA is yttrium (Y), and CA is lutetium (Lu). The oxide superconductor layer 30 is formed of a PBCO unit cell containing praseodymium (Pr), a SmBCO unit cell containing samarium (Sm), a YBCO unit cell containing yttrium (Y), and a LuBCO unit cell containing lutetium (Lu).

Squares indicating unit cells of PrBCO, SmBCO, and LuBCO are represented by Pr, Sm, and Lu, respectively. A hollow square in FIG. 2B indicates a YBCO unit cell as a matrix phase.

The unit cells of PrBCO, SmBCO, and LuBCO form an assembly in YBCO as a matrix phase in the oxide superconductor layer 30. This assembly is referred to as a cluster. In FIG. 2B, an area surrounded by a bold solid line indicates a cluster.

PrBCO is a non-superconductor. A cluster containing PrBCO acts as an artificial pin of the oxide superconductor layer 30.

A relationship of a trivalent ionic radius among praseodymium (Pr), samarium (Sm), yttrium (Y), and lutetium (Lu) satisfies Pr>Sm>Y>Lu. In a cluster, PrBCO and SmBCO each containing a rare earth element larger than YBCO as a matrix phase and LuBCO containing a rare earth element smaller than YBCO are assembled. Hereinafter, a unit cell containing a rare earth element larger than a matrix phase is referred to as a large unit cell, and a unit cell containing a rare earth element smaller than a matrix phase is referred to as a small unit cell.

A unit cell containing MA is a matrix phase. The content of MA is the largest among the contents of rare earth elements contained in the oxide superconductor layer 30. For example, when the number of atoms of rare earth elements is N(RE), and the number of atoms of MA as the third element is N(MA), N(MA)/N(RE)≥0.6 is satisfied. In other words, a molar ratio of MA in a rare earth element contained in the oxide superconductor layer 30 is 0.6 or more.

For example, a quantitative ratio of the number of atoms of a rare earth element or the number of moles thereof in the oxide superconductor layer 30 can be calculated based on a result of concentration measurement of an element using SIMS.

Figure 3:
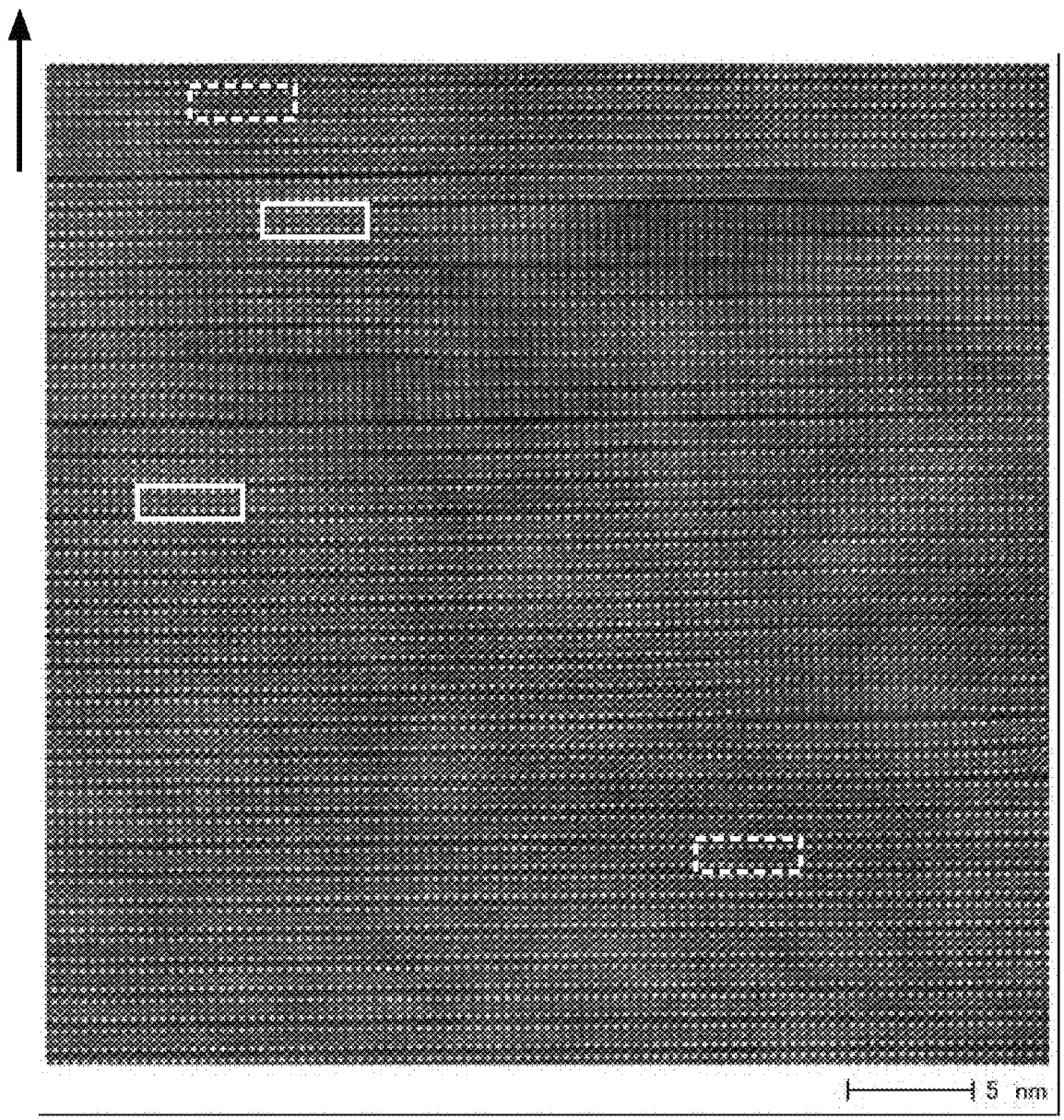
FIG. 3 is a transmission electron microscopy image of an oxide superconductor layer in the first embodiment.

FIG. 3 is a transmission electron microscopy (TEM) image of the oxide superconductor layer 30 in the present embodiment. More specifically, FIG. 3 is a high-angle annular dark field scanning TEM (HAADF-STEM) image.

The image is an observed image at a magnification of 4000000. FIG. 3 is a cross section in a layer thickness direction of the oxide superconductor layer 30, that is, in a direction parallel to the c-axis. FIG. 3 is a cross-sectional view of a sample in which the numbers of atoms of praseodymium (Pr), samarium (Sm), and lutetium (Lu) are 4%, 4%, and 8%, respectively when the number of atoms of a rare earth element in the oxide superconductor layer 30 is assumed to be 100%.

From the observed image in FIG. 3, an oriented Perovskite structure at an atomic level can be confirmed. It is found that there is no different phase in the oxide superconductor layer 30 but unit cells having the same lattice constant are arranged. In other words, the oxide superconductor layer 30 in FIG. 3 is formed of a single crystal having a Perovskite structure.

In FIG. 3, all the single crystals have a Perovskite structure in a layer thickness direction. A single crystal has a size of 500 nm×100 nm or more.

In FIG. 3, an area indicated by a white solid line frame is a cluster. Among atoms arranged in three rows in a horizontal direction in the white solid line frame, atoms in two rows upper and lower are in a barium (Ba) site. Atoms in an intermediate row therebetween are in a rare earth site.

Also in an area indicated by a white broken line frame, similarly, among atoms arranged in three rows in a horizontal direction, atoms in two rows upper and lower are in a barium (Ba) site, and atoms in an intermediate row therebetween are in a rare earth site. The atoms in the rare earth site in the area indicated by the white solid line frame are brighter than the atoms in the rare earth site in the area indicated by the white broken line frame.

In a HAADF-STEM image, an element having a larger atomic weight emits light more brightly. The area indicated by the white solid line frame contains praseodymium (Pr), samarium (Sm), and lutetium (Lu) each having a larger atomic weight than yttrium (Y), and therefore is considered to be brighter than the area indicated by the white broken line frame.

For example, in the HAADF-STEM image of the oxide superconductor layer 30, when brightness of barium is represented by I(Ba) and brightness of an rare earth element sandwiched by barium is represented by I(RE), a first area and a second area satisfying that I(RE)/I(Ba) in the first area is 1.3 times or more I(RE)/I(Ba) in the second area are present. The first area is a cluster.

For example, as illustrated in FIG. 3, each of the first area and the second area is an area containing 10 atoms in a rare earth site arranged in one row in a horizontal direction and 10 atoms in a barium site in each of two rows upper and lower, sandwiching the rare earth site. In FIG. 3, the white solid line frame indicates the first area, and the white broken line frame indicates the second area.

As the TEM image in FIG. 3 indicates, lattice distortion is generated in a barium site, and it is considered that the degree of the distortion is more than one degree. However, as FIG. 3 indicates, a gap between atoms adjacent to each other is clearly almost constant, and it can be assumed that a bonding as a crystal is present. Therefore, the structure in FIG. 3 is defined as a single crystal.

Figure 4:
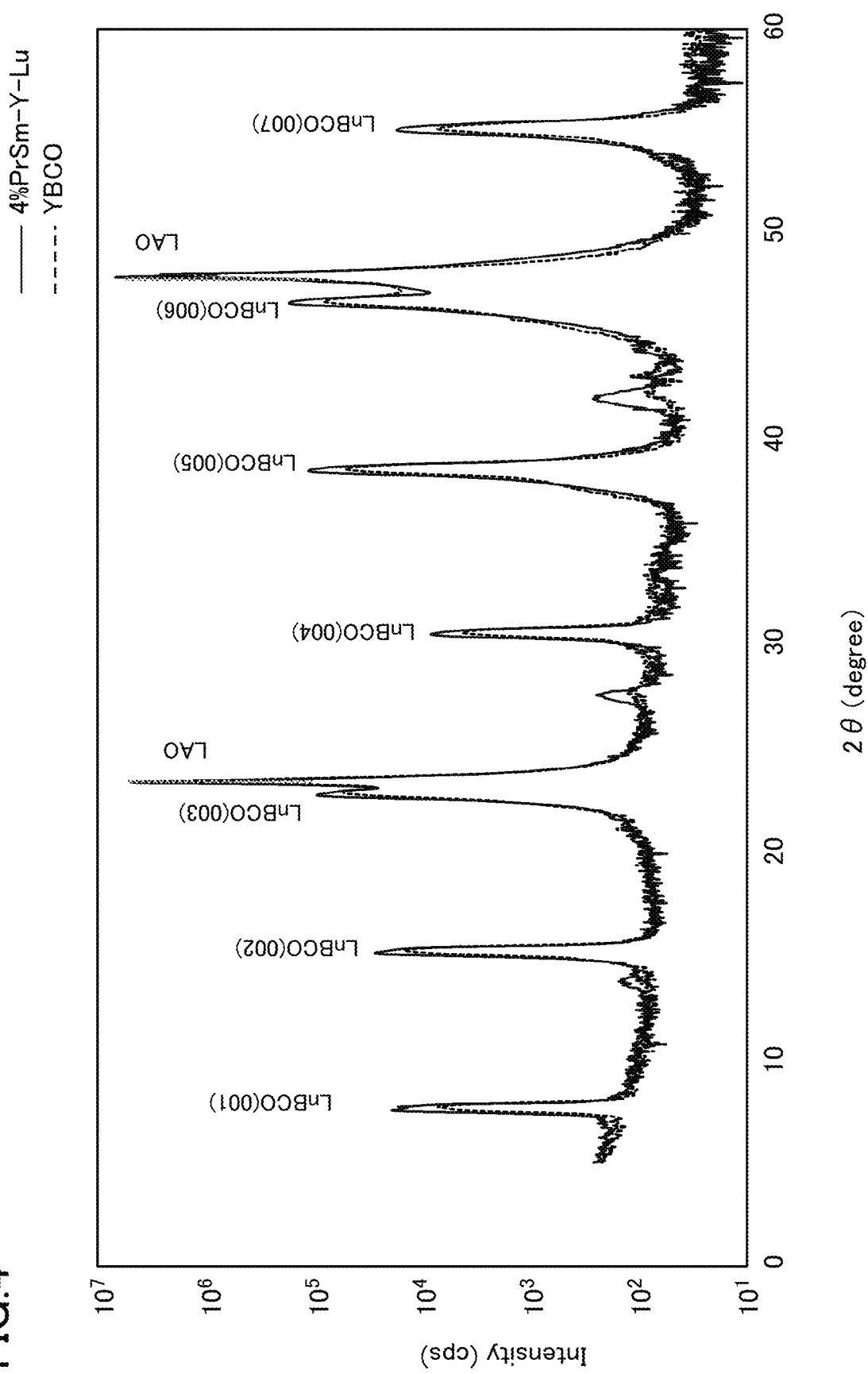
FIG. 4 is a diagram illustrating a result of X-ray diffraction measurement of the oxide superconductor layer in the first embodiment.
Figure 5:
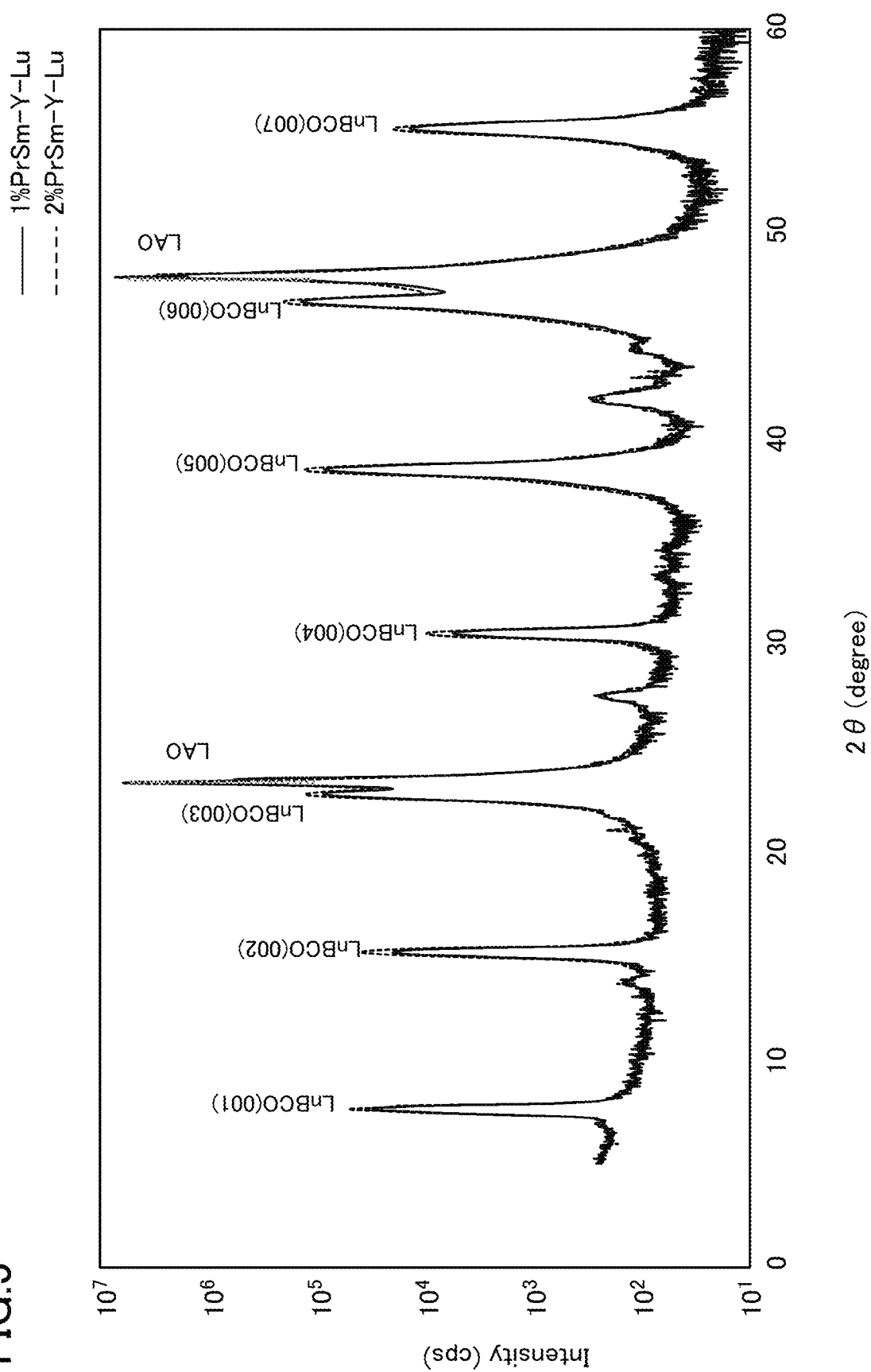
FIG. 5 is a diagram illustrating a result of X-ray diffraction measurement of the oxide superconductor layer in the first embodiment.

FIGS. 4 and 5 are diagrams illustrating a result of X-ray diffraction (XRD) measurement of the oxide superconductor layer 30 in the present embodiment. Measurement was performed for the oxide superconductor layer by a 2θ/ω method in XRD measurement.

FIG. 4 illustrates a result of measurement of a sample of YBCO containing no rare earth element other than yttrium, and a sample in which the contents of praseodymium, samarium, yttrium, and lutetium in the rare earth element are 4%, 4%, 84%, and 8%, respectively. FIG. 5 illustrates a result of measurement of a sample in which the contents of praseodymium, samarium, yttrium, and lutetium in the rare earth element is 1%, 1%, 96%, and 2%, respectively, and a sample in which the contents of praseodymium, samarium, yttrium, and lutetium in the rare earth element are 2%, 2%, 92%, and 4%, respectively.

In FIG. 4, peaks of the sample containing praseodymium, samarium, and lutetium coincide with those of YBCO, and any other clear peaks are not confirmed. Separation of a peak is not observed even in the sample containing praseodymium, samarium, and lutetium. Therefore, it is found that the sample containing praseodymium, samarium, and lutetium is also formed of a single crystal having a continuous Perovskite structure.

In FIG. 5, separation of a peak is not observed. Therefore, it is found that the sample containing praseodymium, samarium, and lutetium is formed of a single crystal having a continuous Perovskite structure.

In FIGS. 4 and 5, a peak of LAO used for a substrate also appears.

Next, a method for manufacturing the superconducting coil 100 of the present embodiment is described. First, the superconducting wire 20 is manufactured. The intermediate layer 24 is formed on the tape-shaped substrate 22, the oxide superconductor layer 30 is formed on the intermediate layer 24, and the metal layer 40 is formed on the oxide superconductor layer 30. The oxide superconductor layer 30 is formed by a TFA-MOD method.

In formation of the oxide superconductor layer 30, first, an aqueous solution containing an acetate of a first element which is praseodymium (Pr), an acetate of at least one second element selected from the group consisting of neodymium (Nd), samarium (Sm), europium (Eu), and gadolinium (Gd), an acetate of at least one third element selected from the group consisting of yttrium (Y), terbium (Tb), dysprosium (Dy), and holmium (Ho), and an acetate of at least one fourth element selected from the group consisting of erbium (Er), thulium (Tm), ytterbium (Yb), and lutetium (Lu), an acetate of barium (Ba), and an acetate of copper (Cu) is prepared. Subsequently, the aqueous solution is mixed with a perfluorocarboxylic acid mainly containing trifluoroacetic acid to prepare a mixed solution, and the mixed solution is subjected to a reaction and purification to prepare a first gel. Subsequently, an alcohol containing methanol is added to the first gel and is dissolved therein to prepare an alcohol solution, and the alcohol solution is subjected to a reaction and purification to prepare a second gel. Subsequently, an alcohol containing methanol is added to the second gel and is dissolved therein to prepare a coating solution in which a total weight of residual water and residual acetic acid is 2% by weight or less, and the coating solution is applied on a substrate to form a gel film. Subsequently, the gel film is subjected to calcining at 400° C. or lower to form a calcined film. Subsequently, the calcined film is subjected to firing under a humidified atmosphere at 725° C. or higher and 850° C. or lower and oxygen annealing to form an oxide superconductor film, that is, the oxide superconductor layer 30.

The perfluorocarboxylic acid desirably contains 98 mol % or more trifluoroacetic acid from a viewpoint of preventing reduction of superconducting characteristics.

Figure 6:
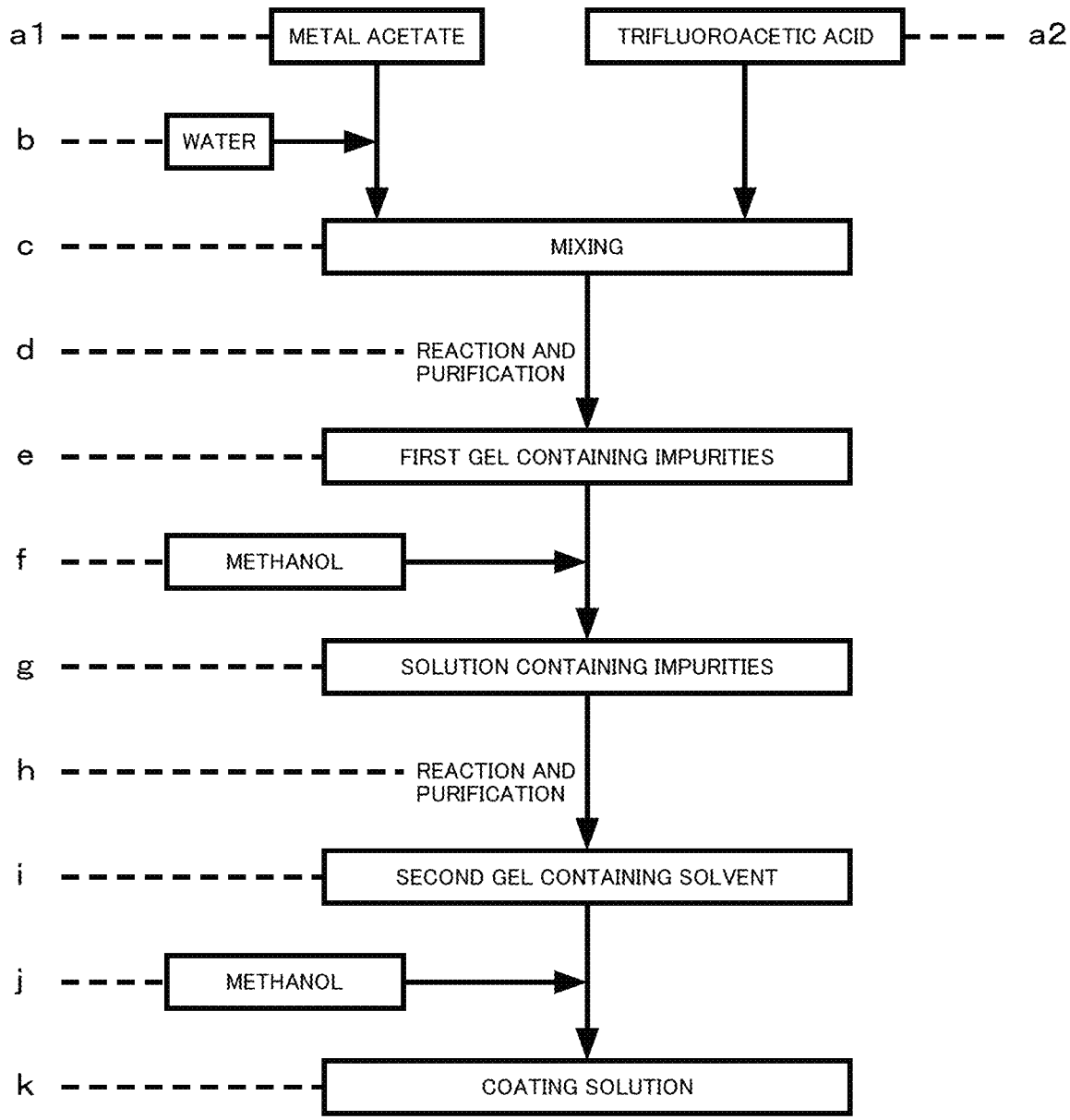
FIG. 6 is a flowchart exemplifying preparation of a coating solution in the first embodiment.

FIG. 6 is a flowchart exemplifying preparation of a coating solution in the present embodiment. Hereinafter, a case where PA as the first element is praseodymium (Pr), SA as the second element is samarium (Sm), MA as the third element is yttrium (Y), and CA as the fourth element is lutetium (Lu) is exemplified.

As illustrated in FIG. 6, a metal acetate of each of yttrium, praseodymium, samarium, lutetium, barium, and copper is prepared (a1). Trifluoroacetic acid is prepared (a2). Subsequently, the prepared metal acetate is dissolved in water (b), and is mixed with the prepared trifluoroacetic acid (c). The obtained solution is subjected to a reaction and purification (d) to obtain a first gel containing impurities (e). Subsequently, the obtained first gel is dissolved in methanol (f) to prepare a solution containing impurities (g). The obtained solution is subjected to a reaction and purification, and impurities are removed (h) to obtain a second gel containing a solvent (i). Furthermore, the obtained second gel is dissolved in methanol (j) to prepare a coating solution (k).

As a metal acetate, metal salts are mixed at RE site (Y, Pr, Sm, Lu):Ba:Cu=1:2:3. Mixing is performed such that the content of Pr in the RE site is 0.00000001 or more and 0.20 or less. After mixing and the reaction, the total content of the residual water and acetic acid in the coating solution is reduced to 2 wt % or less by a high purity solution purifying process using a stabilized solvent-into-gel (SIG) method. The SIG method in the present embodiment is a method for highly purifying a solution to be partially stabilized for preventing decomposition of PrBCO, and is a partially stabilized solvent-into-gel (PS-SIG) method. For example, mixing is performed such that a value of Pr/(Y+Pr+Sm+Lu) is 0.0025.

Figure 7:
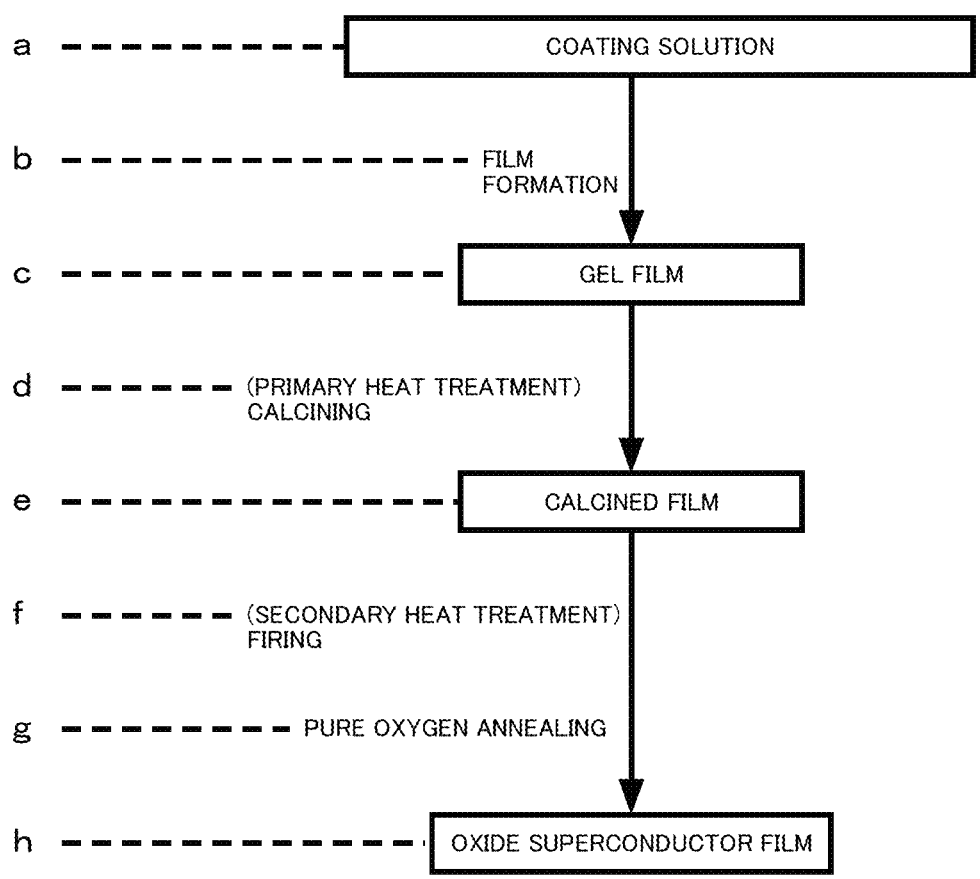
FIG. 7 is a flowchart exemplifying a method for forming a film of a superconductor from the coating solution in the first embodiment.

FIG. 7 is a flowchart exemplifying a method for forming a film of a superconductor from the coating solution in the present embodiment.

As illustrated in FIG. 7, first, the coating solution prepared in advance is prepared (a). For example, a film is formed by applying the coating solution on a substrate by a die coating method (b) to obtain a gel film (c). Subsequently, the obtained gel film is subjected to calcining as a primary heat treatment, and an organic substance is decomposed (d) to obtain a calcined film (e). Furthermore, this calcined film is subjected to firing as a secondary heat treatment (f), and then, for example, is subjected to pure oxygen annealing (h) to obtain an oxide superconductor film (h).

Figure 8:
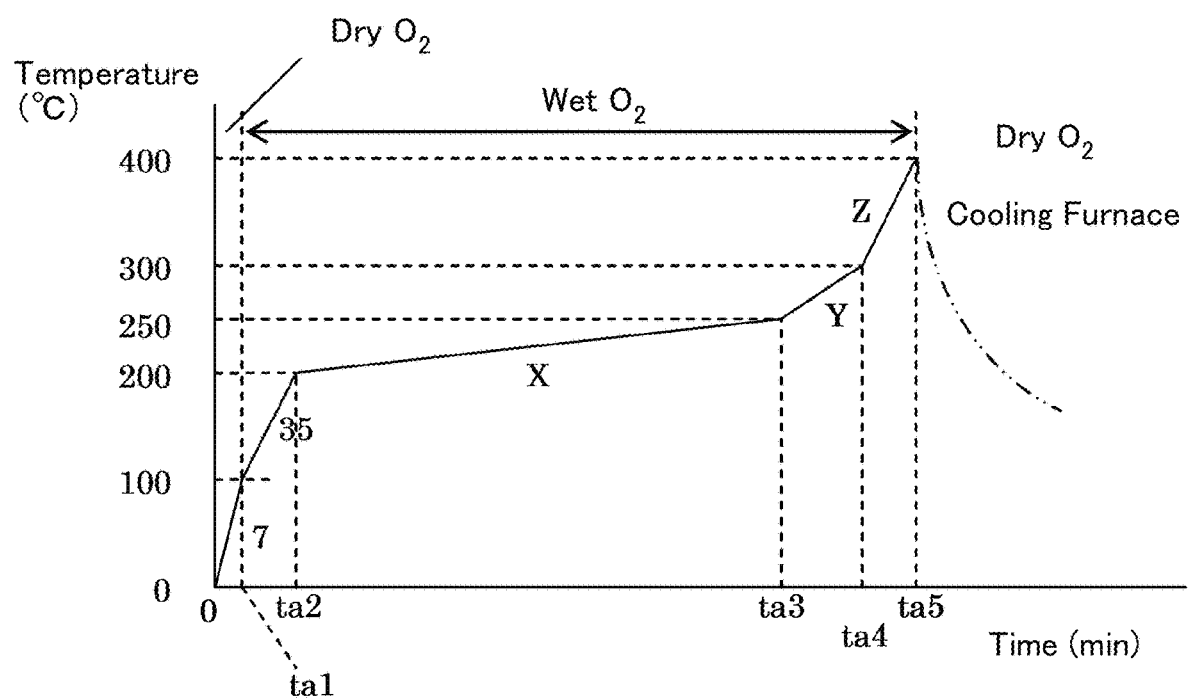
FIG. 8 is a diagram illustrating a typical calcining profile in the first embodiment.

FIG. 8 is a diagram illustrating a typical calcining profile in the present embodiment. Calcining under normal pressure decomposes a trifluoroacetate mainly at 200° C. or higher and 250° C. or lower. In order to prevent the temperature from entering the region, a temperature-rising rate is reduced around 200° C. By gradually raising the temperature to 250° C., a substance decomposed from the trifluoroacetate contains fluorine or oxygen, which easily remains in the film due to a hydrogen bond. The temperature is raised to 400° C. in order to remove the substance. A final temperature is generally from 350 to 450° C. In this way, a semitransparent brown calcined film formed of an oxide or a fluoride is obtained.

Figure 9:
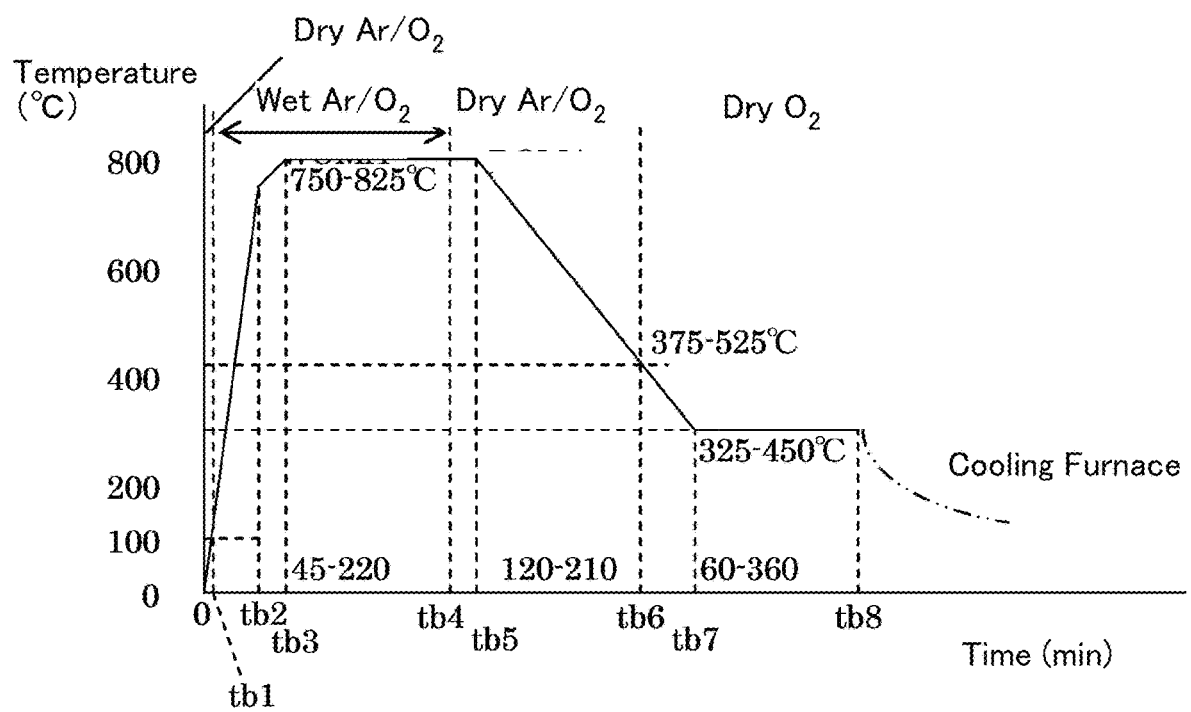
FIG. 9 is a diagram illustrating a typical firing profile in the first embodiment.

FIG. 9 is a diagram illustrating a typical firing profile in the present embodiment. Until tb1 at 100° C., a dry mixed gas is used. However, subsequently, humidification is performed. A humidification starting temperature may be 100° C. or higher and 400° C. or lower. It is considered that formation of a pseudo-liquid layer starts around 550° C. Humidification is performed at a temperature of 550° C. or lower such that a pseudo-liquid layer is uniformly formed while a humidified gas is spread in the film.

FIG. 9 illustrates a typical temperature profile of firing at 800° C. The profile is a gradual temperature-rising profile at 775° C. or higher and 800° C. or lower such that temperature overshoot at tb3 does not occur. Even in this profile, overshoot of 2 to 3° C. may remain at 800° C., but does not cause a particular problem. An oxygen partial pressure at a maximum temperature depends on a matrix phase. In a case of firing of a YBCO superconductor, the optimal oxygen partial pressure is 1000 ppm at 800° C., and becomes half whenever the temperature is lowered by 25° C. therefrom. That is, the optimal oxygen partial pressure is 500 ppm at 775° C., and is 250 ppm at 750° C. In this firing, a YBCO-based material forms $YBa_2Cu_3O_6$. At this time, the YBCO-based material is not a superconductor.

In firing at a maximum temperature, a dry gas is caused to flow at tb4 before the temperature starts to be lowered after completion of firing. A humidified gas decomposes a superconductor to generate an oxide at 700° C. or lower, and therefore oxygen annealing is performed at tb6, and the oxygen number of the superconductor is changed from 6.00 to 6.93. A substance becomes a superconductor at this oxygen number. However, only PrBCO is not a superconductor although having a Perovskite structure. The valence of Pr is unknown, and therefore the oxygen number of a unit cell thereof is also unknown, but Pr is considered to have the large oxygen number. This is because the valence of Pr is between three and four and the oxygen number is increased in accordance therewith in a unit cell. An oxygen annealing starting temperature is 375° C. or higher and 525° C. or lower. Subsequently, the temperature is maintained, and then a furnace is cooled from tb8.

By the above manufacturing method, the superconducting wire 20 containing the oxide superconductor layer 30 is manufactured.

Figure 10:
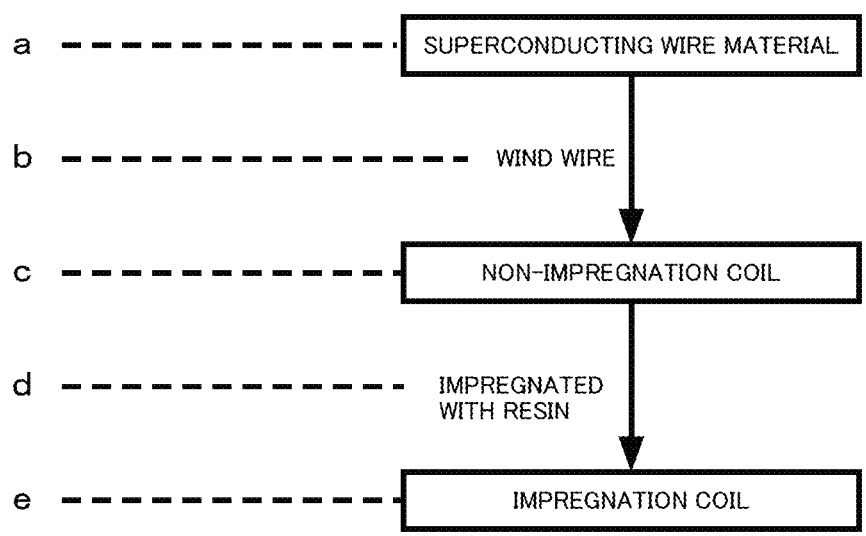
FIG. 10 is a flowchart exemplifying a method for manufacturing the superconducting coil of the first embodiment.

FIG. 10 is a flowchart exemplifying a method for manufacturing the superconducting coil 100 from the superconducting wire 20 of the present embodiment.

As illustrated in FIG. 10, first, the superconducting wire 20 prepared in advance is prepared (a). Subsequently, the superconducting wire 20 is wound around a shaft of the bobbin 12 to form the pancake coils 14a, 14b, 14c, and 14d (b). The pancake coils 14a, 14b, 14c, and 14d in this state are non-impregnation coils (c). Subsequently, the pancake coils 14a, 14b, 14c, and 14d are impregnated with a resin such as an epoxy resin (d). The impregnation resin layer 15 is formed around each of the pancake coils 14a, 14b, 14c, and 14d to obtain impregnation coils (e).

An impregnation coil has a higher mechanical strength than a non-impregnation coil.

By the above manufacturing method, the superconducting coil 100 of the present embodiment is manufactured.

Next, the functions and the effects of the superconducting coil 100 of the present embodiment are described.

The superconducting coil 100 of the present embodiment uses the superconducting wire 20 containing clustered PrBCO as an artificial pin. The superconducting wire 20 has an excellent magnetic field characteristic. Therefore, a characteristic of the superconducting coil 100 used in a magnetic field is improved. In addition, by using the superconducting wire 20, a quenching burning accident of the superconducting coil 100 can be suppressed. Furthermore, by using the superconducting wire 20, the superconducting coil 100 to generate a stable magnetic field is realized.

First, improvement of a magnetic field characteristic by the superconducting wire 20 in the present embodiment is described.

The superconducting wire 20 in the present embodiment contains YBCO as a matrix phase in the oxide superconductor layer 30. PrBCO as a non-superconductor is clustered together with SmBCO and LuBCO as superconductors in a matrix phase. This cluster acts as an atomic level artificial pin to improve a magnetic field characteristic.

The oxide superconductor layer 30 in the present embodiment is formed of PA, SA, MA, and CA. SA and CA cause a clustering phenomenon. PA is incorporated into a cluster as a part of SA, and a clustered atom-replaced artificial pin (CARP) is formed. This clustered atom-replaced artificial pin improves a magnetic field characteristic.

Figure 11:
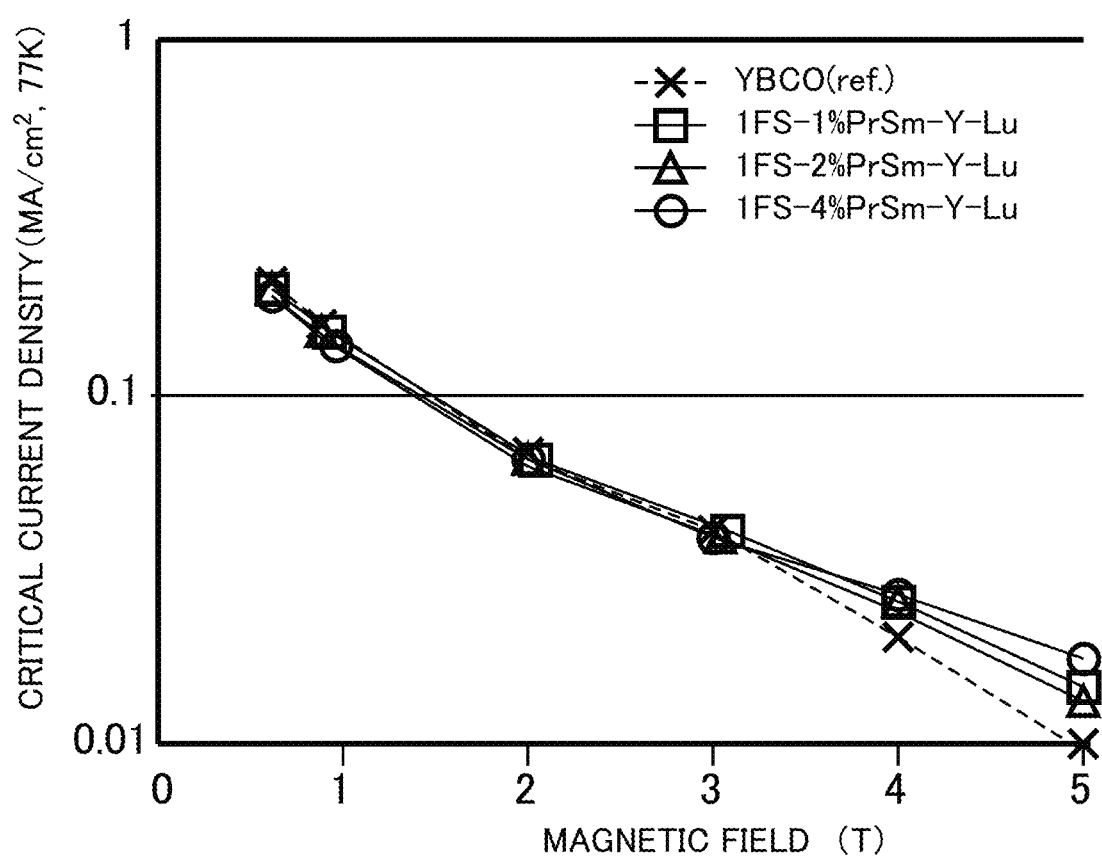
FIG. 11 is an explanatory diagram of functions and effects of the first embodiment.

FIG. 11 is an explanatory diagram of functions and effects of the present embodiment. FIG. 11 is a diagram illustrating a relationship between a magnetic field of the superconducting wire 20 in the present embodiment and a critical current density thereof. FIG. 11 illustrates a measurement result at a temperature of 77 K.

FIG. 11 illustrates a measurement result of a sample of YBCO containing no rare earth element other than yttrium (in FIG. 11, crossed mark) in a comparative embodiment, and a measurement result of a sample in which the contents of praseodymium, samarium, yttrium, and lutetium in the rare earth element are 1%, 1%, 96%, and 2%, respectively (in FIG. 11, square mark), a sample in which the contents of praseodymium, samarium, yttrium, and lutetium in the rare earth element are 2%, 2%, 92%, and 4%, respectively (in FIG. 11, triangle mark), and a sample in which the contents of praseodymium, samarium, yttrium, and lutetium in the rare earth element are 4%, 4%, 84%, and 8%, respectively (in FIG. 11, circle mark) in the present embodiment. The horizontal axis indicates a magnetic field (T), and the vertical axis indicates a Jc value ($MA/cm^2$).

As clear from FIG. 11, in the present embodiment, a critical current density higher than that in a comparative embodiment is obtained particularly in a region higher than 3 T.

A ratio of praseodymium occupied in the rare earth element (Pr ratio) is desirably 10 ppb (=0.00000001) or more. By the ratio of 10 ppb or more, an effect for improving a magnetic field characteristic is obtained.

When the number of atoms of a rare earth element is N(RE), and the number of atoms of the first element as PA, that is, praseodymium is N(PA), a Pr ratio can be represented by N(PA)/N(RE). Therefore, 0.00000001≤N(PA)/N(RE) is desirably satisfied.

When the ratio of praseodymium becomes more than 50% with respect to the sum of praseodymium and samarium, a Jc value is lowered. When the ratio of praseodymium is less than 5%, there is a risk that an effect for improving a magnetic field characteristic could not be obtained.

Therefore, when the number of atoms of the first element as PA is N(PA), and the number of atoms of the second element as SA is N(SA), 0.05≤N(PA)/(N(PA)+N(SA))≤0.5 is desirably satisfied.

When the number of atoms of a rare earth element is N(RE), and the number of atoms of the third element as MA is N(MA), N(MA)/N(RE)≥0.6 is desirably satisfied. When the ratio is less than the above range, a ratio of a superconducting unit cell is reduced, and there is a risk that a sufficient superconducting characteristic could not be obtained.

When the number of atoms of the third element as MA is N (MA), and the number of atoms of yttrium contained in the third element is N(Y), N(Y)/N(MA)≥0.5 is desirably satisfied. A material of yttrium (Y) is relatively inexpensive, and therefore cost of the superconducting wire 20 can be reduced.

When the number of atoms of a rare earth element is N(RE), the number of atoms of the first element as PA is N(PA), and the number of atoms of the second element as SA is N(SA), (N(PA)+N(SA))/N(RE)≤0.2 is desirably satisfied. Therefore, (N(PA)+N(SA))/N(RE)≤0.1 is desirably satisfied. When the ratio is more than the above range, a ratio of a superconducting unit cell is reduced, and there is a risk that a sufficient superconducting characteristic could not be obtained.

When the number of atoms of the first element as PA is N(PA), the number of atoms of the second element as SA is N(SA), and the number of atoms of the fourth element as CA is N(CA), 0.8×N(CA)≤N(PA)+N(SA)≤1.2×N(CA) is desirably satisfied. When the above condition is not satisfied, the number of PA, SA, or CA not forming a cluster is increased, and a superconducting characteristic may be reduced.

The oxide superconductor layer 30 desirably contains fluorine of $2.0 \times 10^{15}$ atoms/cc or more and $5.0 \times 10^{19}$ atoms/cc or less and carbon of $1.0 \times 10^{17}$ atoms/cc or more and $5.0 \times 10^{20}$ atoms/cc or less.

For example, it is considered that residual fluorine and residual carbon maintain a magnetic field characteristic in such a very high magnetic field to exceed 15 T.

The fluorine contained in the oxide superconductor layer 30 more desirably has a concentration of $2.0 \times 10^{16}$ atoms/cc or more from the above viewpoint. For example, the carbon contained in the oxide superconductor layer 30 more desirably has a concentration of $1.0 \times 10^{18}$ atoms/cc or more.

It is assumed that a cluster containing PrBCO is not formed but PrBCO is ultimately dispersed in a matrix phase of YBCO in the oxide superconductor layer. Ultimate dispersion is a state in which PrBCO is dispersed as a single unit cell in a matrix phase of YBCO.

It is considered that trivalent Pr forms a Perovskite structure, and becomes tetravalent subsequently, and a unit cell thereof thereby becomes non-superconductive. It is considered that a ⅓ Perovskite unit cell which has received Pr at that time is contracted by about 14%, and becomes non-superconductive. It is considered that the deformation is transferred to a first adjacent unit cell in an a/b plane and the four unit cells also become non-superconductive. In this way, when a cluster is not formed but Pr is ultimately dispersed, a "5 times degradation phenomenon" in which Jc degradation of five times the Pr content is observed is confirmed.

Next, an effect for suppressing a quenching burning accident of the superconducting coil of the present embodiment and an effect for stabilizing a generated magnetic field are described.

As described above, a superconducting wire formed by a physical deposition method easily causes a quenching burning accident. It is considered that a cause thereof may be an inner bypass current (IBC). It is considered that IBC causes a quenching burning accident because a current meanders in a superconducting wire and an energy not contributing to formation of a magnetic field becomes a heat energy. In addition, it is considered that a magnetic field generated by a superconducting coil due to IBC becomes unstable.

It is considered that IBC is caused by a difference in a local critical temperature (Tc) in a superconducting wire. When a superconducting wire has portions having different Tcs, local critical current density (Jc) values in the portions, that is, local critical current (Ic) values are different from one another. In a superconductor in which Tc is lowered, IBC is necessarily caused, and for example, in $YBa_2Cu_3O_{7-x}$ (YBCO) having a satisfactory Jc, Tc=90.7 K is obtained, but IBC is caused even at Tc=89.7 K.

When a difference in easiness of flowing of a local current occurs at 77 K, for example, even at the time of cooling at 30 K, it is considered that the tendency is not changed. In a superconductor having a similar structure, a Jc-B-T curve exhibits a similar tendency. Therefore, in a portion in which a current easily flows, a current easily flows even at 77 K or 30 K. There are some portions in which this tendency is reversed, but it is considered that the tendency is maintained generally. Therefore, it is considered that IBC is caused even at a low temperature.

A BZO artificial pin itself acts as an obstacle, reduces the amount of oxygen therearound, and becomes non-superconductive to cause IBC. Even in a superconducting wire formed by a TFA-MOD method, Tc is lowered by radiation irradiation. That is, even in a superconducting wire formed by a TFA-MOD method, it is considered that IBC is caused by radiation irradiation.

It is very difficult to measure IBC at a steady state. For example, in a superconducting wire requiring 0.01% as a magnetic field accuracy, instantaneous fluctuation of a current value is at a level of 0.01%. Naturally, quenching of a superconductor is measured at a level of μV. Therefore, it is difficult to observe a displacement smaller than this by several digits, and it is necessary to perform measurement by enlarging an influence of IBC. It is considered that it is effective to perform measurement by increasing a current value in a short time therefor.

When a current value is increased largely in a short time, an electromotive force of a noise due to IBC is increased if IBC is present, and measurement is easy. From this fact, it is considered that we can know how large a possibility of a quenching burning accident is when presence of IBC is measured indirectly, and a coil is formed.

This is an IBC indirect measurement method. A current value up to Ic is measured by increasing a current in about four seconds (a current value up to 1.25 times of Ic value is measured in five seconds), and comparison can be made by defining a fluctuation of a voltage up to 90% of an Ic value as V(IBC).

In the IBC indirect measurement method, V(IBC) as a fluctuation of a voltage is determined. It is considered that largeness of a possibility of a quenching burning accident can be compared by comparing V(IBC) between materials.

Definition of V(IBC) calculation is as follows. A current is increased up to an Ic value in a fixed time (four seconds in this case), a maximum voltage Vmax and a minimum voltage Vmin observed in data up to 90% of the Ic value are used, and V(IBC) is determined by subtracting 0.20 μV as a noise of a measurement system background. That is, V(IBC) is represented by the following formula.

$$V(IBC) = Vmax - Vmin - 0.20$$

In IBC indirect measurement of a superconducting wire containing a BZO artificial pin manufactured by a physical deposition method, an extremely large V(IBC) is confirmed. V(IBC)=36.05 μV is obtained at 50 K/5 T. This is a value obtained by increasing a current in a short time, and therefore this value cannot be compared directly with 1 μV/cm obtained by superconducting transfer. However, IBC may be the cause of quenching burning.

There is also a superconducting wire hardly causing IBC. This is a superconducting wire containing a $Dy_2O_3$ artificial pin having a diameter of 20 nm to 30 nm, manufactured by a TFA-MOD method. This superconducting wire maintains a Perovskite structure of YBCO and has Tc of 90.7 K. This superconducting wire satisfies V(IBC)=0.14 μV at 50 K/5 T, which is only 1/250 of a wire material manufactured by a physical deposition method.

A reason why V(IBC) of the superconducting wire containing a $Dy_2O_3$ artificial pin, manufactured by a TFA-MOD method is small is considered to be that a current goes straight in most parts of a Perovskite structure in the superconducting wire, and the current flows in a bypass only when hitting against $Dy_2O_3$. In a BZO artificial pin, Tc is locally different, Ic or Jc is also locally different, and therefore it is considered that a current does not necessarily go straight. Presence or absence of IBC can be said as presence or absence of this straight current in other words.

However, in the superconducting wire containing a $Dy_2O_3$ artificial pin, an effect of the artificial pin can be hardly expected. This is because $Dy_2O_3$ is grown freely in a pseudo-liquid phase during firing, and is grown into a size of 20 nm to 30 nm. $Dy_2O_3$ does not act as an artificial pin because of being too large.

In this way, in the Y-based superconducting wire, when a coil is formed with a wire material having a large V(IBC), an excessive energy disappears to become heat, which may lead to a quenching burning accident. In addition, it is considered that a generated magnetic field is not stable. On the other hand, in a TFA-MOD method wire material having a small V(IBC), a force of an artificial pin cannot be expected, and therefore a magnetic field characteristic is not improved.

Therefore, when a superconducting wire having a small V(IBC) and containing an effective artificial pin is manufactured, suppression of a quenching burning accident can be expected. In addition, stability of a formed magnetic field can be expected.

Figure 12:
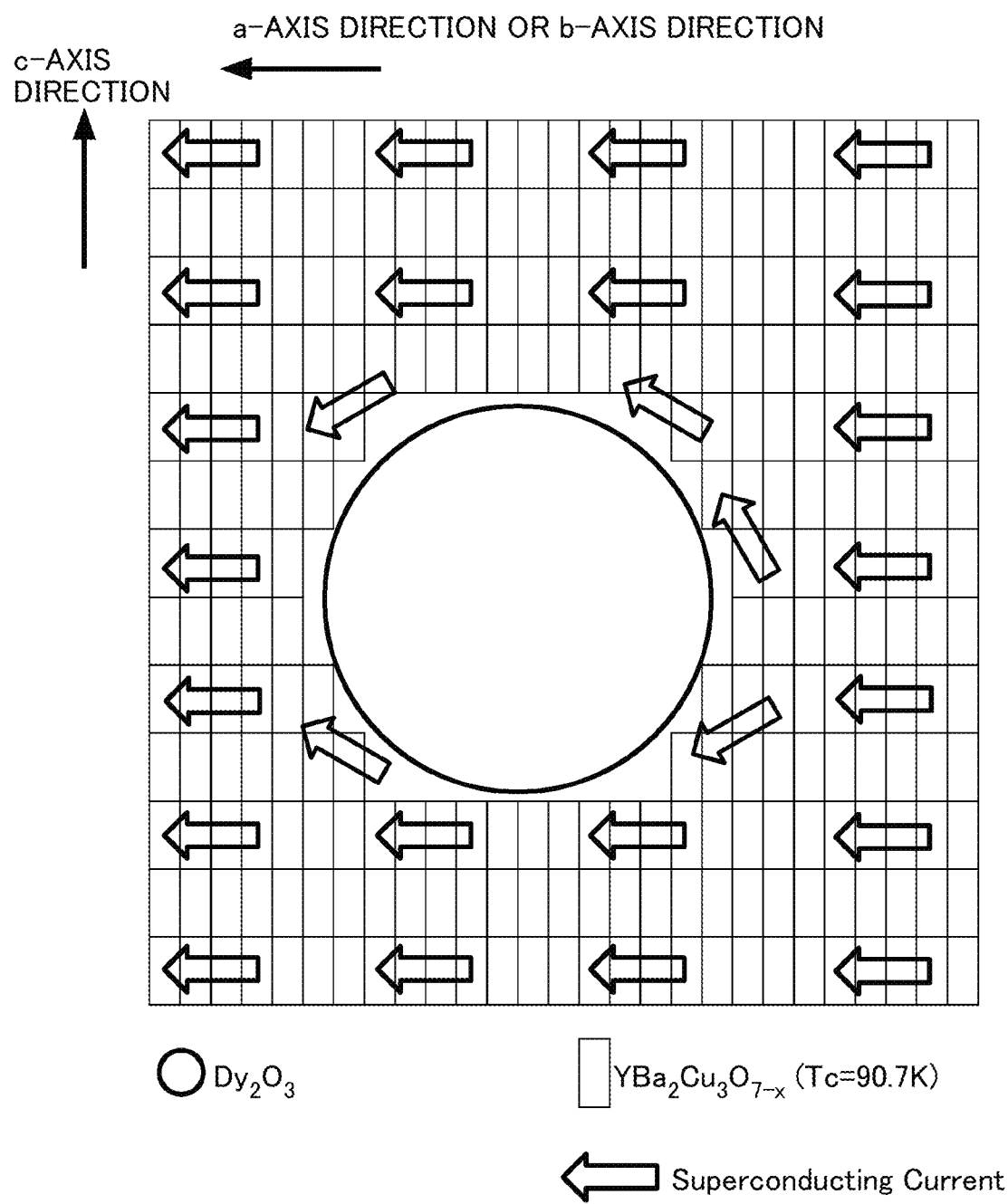
FIG. 12 is an explanatory diagram of functions and effects of the first embodiment.

FIG. 12 is an explanatory diagram of functions and effects of the present embodiment. FIG. 12 is a schematic diagram illustrating an internal structure of a superconducting wire containing a $Dy_2O_3$ artificial pin, manufactured by a TFA-MOD method. $Dy_2O_3$ is formed in a matrix phase of YBCO. For example, $Dy_2O_3$ has a diameter of 20 nm to 30 nm.

In the superconducting wire in FIG. 12, a matrix phase of YBCO maintains a Perovskite structure, and Tc thereof is 90.7 K. The superconducting wire exhibits a high value in Jc measurement in liquid nitrogen. This indicates that Tc is lowered in a small portion and a superconducting current flows sufficiently even at a liquid nitrogen temperature.

In a TFA-MOD method, a pseudo-liquid phase is formed during firing, and a unit cell is grown. Therefore, a particle of $Dy_2O_3$ or the like not forming a Perovskite structure is easily assembled singly, and is grown into a large size.

When a superconducting current flows, most of the current flows linearly. However, the current flows in a bypass when hitting against a $Dy_2O_3$ particle. In order to express the degree of a current flowing in a bypass, a current bypass index Ib is defined. The current bypass index Ib is an index indicating the amount reduced from the amount in which a current originally should flow due to occurrence of IBC. The current bypass index Ib can be calculated geometrically.

Figure 13A:
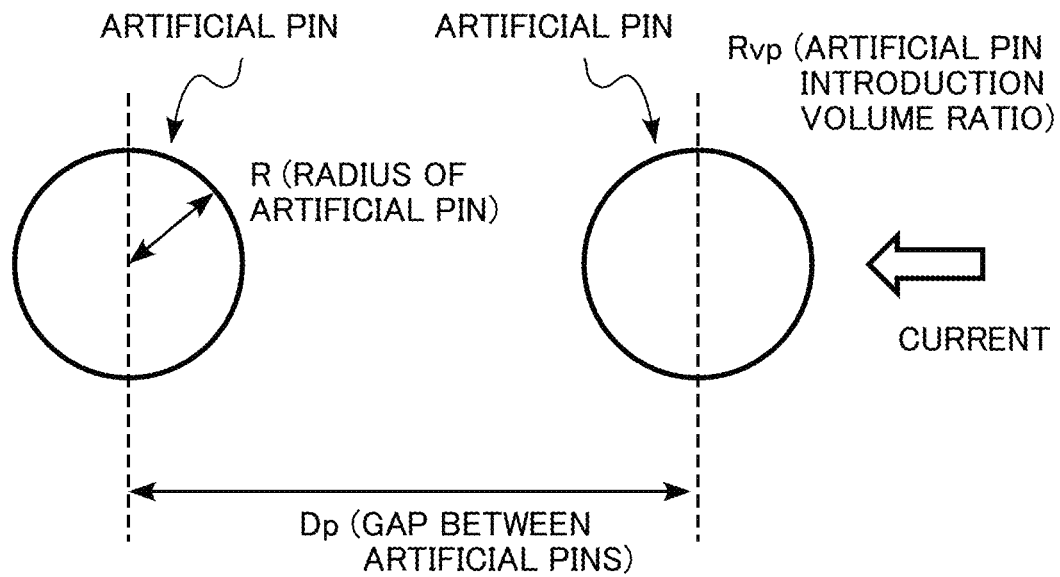
FIGS. 13A and 13B are explanatory diagrams of functions and effects of the first embodiment.
Figure 13B:
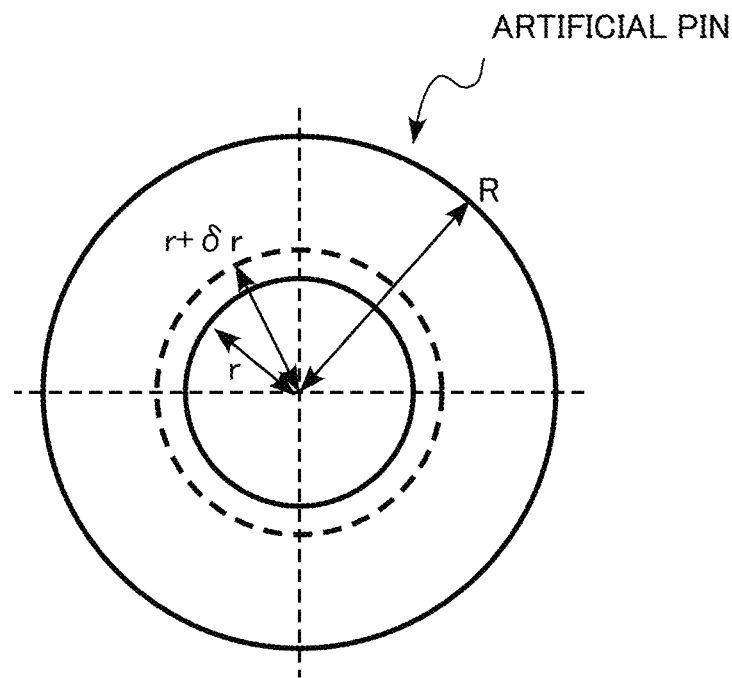

FIGS. 13A and 13B are explanatory diagrams of functions and effects of the present embodiment. FIGS. 13A and 13B are explanatory diagrams of a method for determining a current bypass index Ib in a superconducting wire containing an artificial pin.

As illustrated in FIG. 13A, an artificial pin is assumed to be a sphere having a radius R, a gap between the artificial pins is represented by Dp, and an artificial pin introduction volume ratio is represented by Rvp.

The artificial pin introduction volume ratio Rvp can be represented as follows.

$$Rvp = (4\pi R^3/3)/(\pi R^2 Dp)$$
$$= 4R/(3Dp)$$

Therefore, the gap between the artificial pins Dp can be represented as follows.

$$Dp = 4R/(3Rvp)$$

Transfer of (R−r) is necessary such that a current at a position of r from the center of the artificial pin illustrated in FIG. 13B bypasses the artificial pin. Integration is performed in order to determine an average value (average transfer distance Dm) of a transfer distance in an entire superconducting wire.

$$\int_0^R 2\pi r(R-r)dr [-\tfrac{2}{3} \times \pi r^3 + \pi R r^2]_0^R = \pi R^3/3 \quad \text{[Mathematical formula 1]}$$

The average transfer distance Dm can be represented as follows.

$$Dm = (\pi R^3/3)/\pi R^2 = R/3$$

The average transfer distance Dm is a distance of a current laterally transferred in an average while the current advances by the distance Dp. An average current bypass ratio (Rib) can be calculated as follows.

$$Rib = Dm/Dp$$
$$= (R/3)/(4R/3Rvp)$$
$$= Rvp/4$$

The average current bypass ratio (Rib) is an index indicating the amount of transfer in a direction perpendicular to a stretching direction of a wire material when a current advances by a unit length in the stretching direction. It is found that Rib does not depend on a radius R of an artificial pin but depends only on the artificial pin introduction volume ratio Rvp.

The current bypass index Ib can be calculated as follows.

$$Ib = 1 - \cos\theta$$

$$\tan\theta = Rib = Rvp/4$$

$$\theta = \arctan(Rvp/4)$$

$$Ib = 1 - \cos\{\arctan(Rvp/4)\}$$

The current bypass index Ib does not depend on a radius R of an artificial pin but depends only on the artificial pin introduction volume ratio Rvp. The current bypass index Ib indicates the amount reduced from the amount in which a current originally should flow when an actual current advances with an angle θ.

For example, in an extreme case, when a current advances with an angle of 45 degrees, the current in the current direction is reduced about by 29%, and therefore the loss amount is represented by Ib. That is, Ib=29% is obtained.

Table 1 indicates a calculated value of the current bypass index Ib with respect to the artificial pin introduction volume ratio Rvp.

TABLE 1

| | Artificial pin introduction volume ratio Rvp | | | | |
|---|---|---|---|---|---|
| | 4% | 8% | 12% | 16% | 20% |
| Current bypass index Ib | 0.0050% | 0.020% | 0.045% | 0.080% | 0.12% |

In a case of an artificial pin having Tc maintained, Ib=0.12% is obtained even at Rvp=20%. Even at an artificial pin introduction volume ratio of 20%, a bypass current in the amount only at this level is generated. Therefore, an influence of IBC can be suppressed to a lower level.

In a superconducting wire having Tc maintained, the amount of a bypass current is small. However, as described above, when the size of an artificial pin is large like a $Dy_2O_3$ artificial pin, an effect for improving a magnetic field characteristic cannot be expected.

Figure 14:
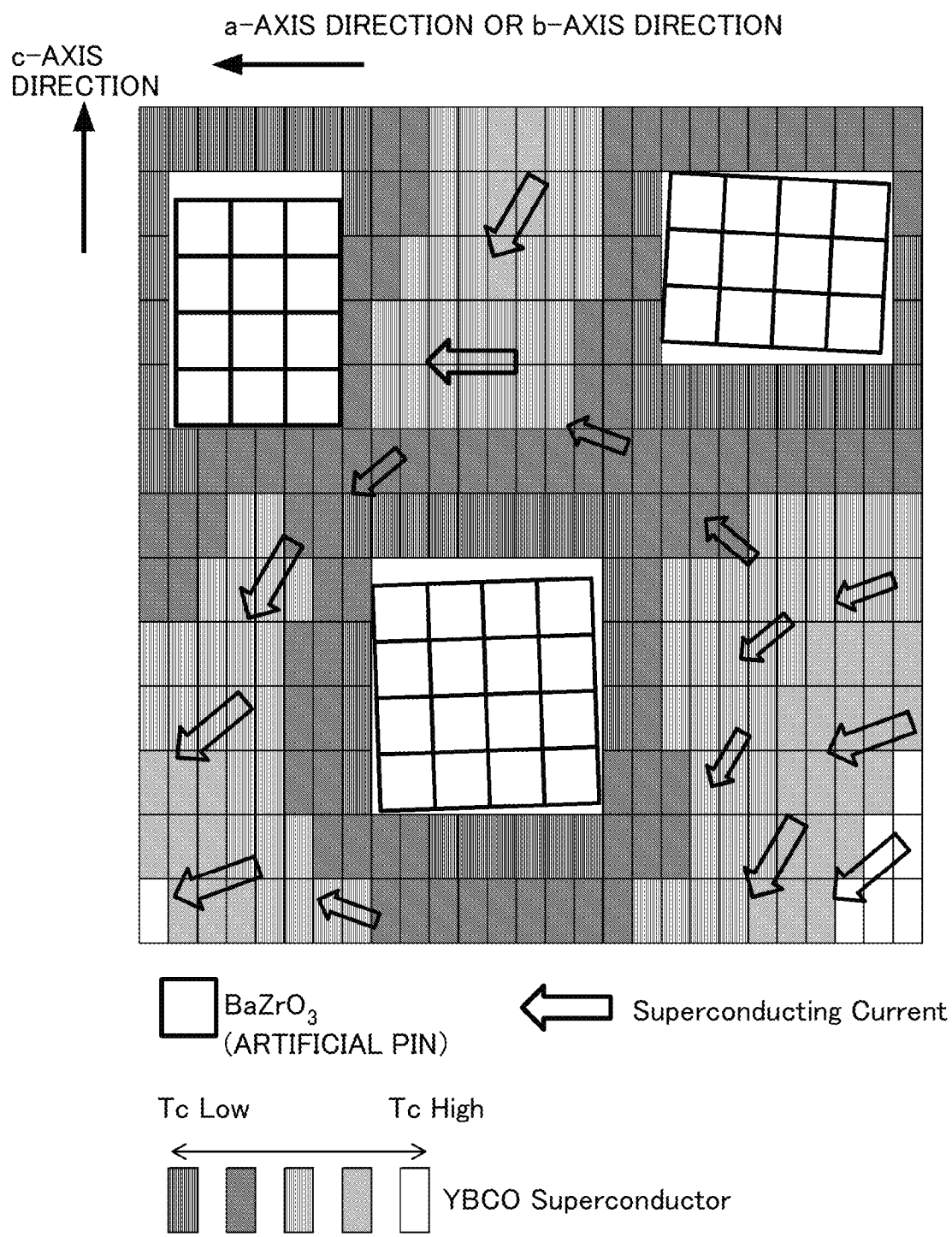
FIG. 14 is an explanatory diagram of functions and effects of the first embodiment.

FIG. 14 is an explanatory diagram of functions and effects of the present embodiment. FIG. 14 is a schematic diagram illustrating an internal structure of a superconducting wire containing a $BaZrO_3$ (BZO) artificial pin, manufactured by a physical deposition method.

The BZO artificial pin has a Perovskite structure, and the size of the artificial pin can be smaller than that of $Dy_2O_3$. However, there is lattice mismatch at a level of about 9% between BZO and YBCO. Therefore, a gap is present between BZO and YBCO. A non-superconductive property of the gap portion is increased.

When YBCO is adjacent to BZO, BZO extracts an oxygen atom of YBCO, and therefore it is known that Jc or Tc of YBCO is lowered. Therefore, it is considered that a structure having an internal distribution of Tc as illustrated in FIG. 14 is formed. In FIG. 14, the densely hatched portion in a matrix phase of YBCO is a region having lower Tc, and the lightly hatched portion is a region having higher Tc.

The region having lower Tc often has a smaller Jc value in comparison with other regions having the same temperature. In superconducting wires having the same structure, the same tendency for largeness of a Jc value in the wire material is maintained even at a low temperature as that in a high temperature. Presence of a difference in a Jc value in a wire material leads to formation of IBC.

Particularly, when a current having an amount close to a Jc value flows, an influence of IBC is large. In a case of a current having a smaller amount than a Jc value, each region relatively has extra room for a current capacity, and therefore a current flows straight. However, when a current flows around a Jc value, few regions have extra room for a current capacity in an entire wire material, and an influence of current bypass is increased in the wire material.

It is estimated that the influence of IBC is larger as a magnetic field is stronger. FIG. 14 illustrates a state in which a current flows from the right to the left, but an individual current deviates from a vector direction thereof. A component flowing in a current direction becomes smaller than 100%, an excess current becomes a heat energy, and it is considered that a possibility of a quenching burning accident is further increased.

In order to obtain both improvement of a magnetic field characteristic and suppression of a quenching burning accident, for example, it is considered that the $Dy_2O_3$ artificial pin in FIG. 12 is manufactured so as to have a small size, or an influence of the BZO artificial pin in FIG. 14 is reduced.

However, when a different phase other than a Perovskite structure is formed during firing in a TFA-MOD method, growing occurs in a liquid phase at 800° C. Therefore, a particle is grown rapidly, and it is difficult to make the size of the $Dy_2O_3$ artificial pin smaller than 20 nm to 30 nm. Also in a physical deposition method, a pin not forming a Perovskite structure becomes larger similarly.

On the other hand, an artificial pin forming a Perovskite structure like the BZO artificial pin forms a gap in a lattice, or extracts an oxygen atom to make a superconducting characteristic non-uniform. Therefore, it is also difficult to reduce an influence of the BZO artificial pin on a superconducting characteristic.

Figure 15:
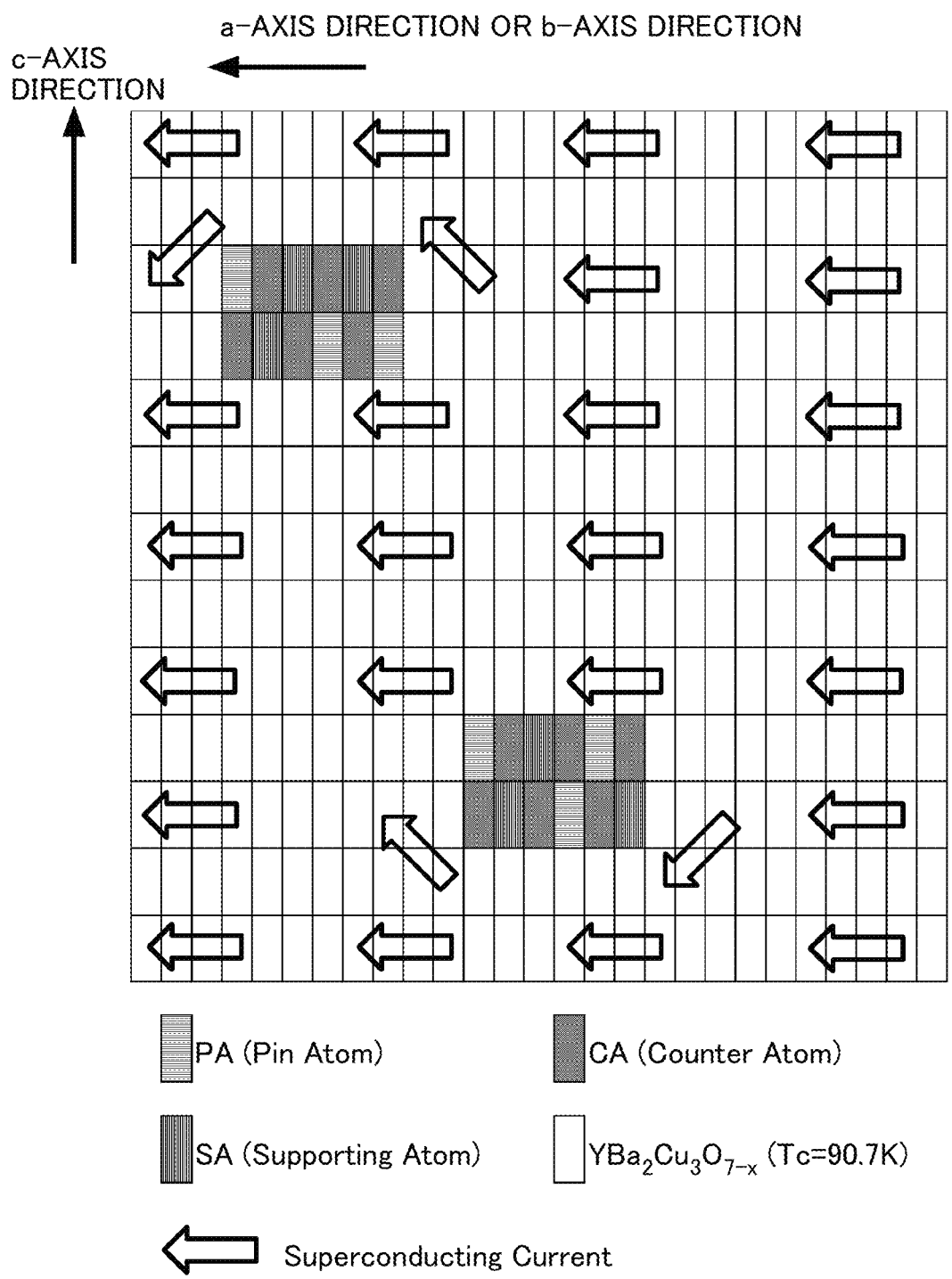
FIG. 15 is an explanatory diagram of functions and effects of the first embodiment.

FIG. 15 is an explanatory diagram of functions and effects of the present embodiment. FIG. 15 is a schematic diagram illustrating an internal structure of the superconducting wire 20 in the present embodiment.

FIG. 15 is an enlarged schematic cross-sectional view obtained by observing the oxide superconductor layer 30 in such a manner that the substrate 22 is present on a lower side and the metal layer 40 is present on an upper side. Each rectangle indicates a unit cell in a single crystal. The length of a c-axis of a unit cell is about three times the length of an a-axis or the length of a b-axis. Therefore, when a unit cell is observed, the unit cell is observed as illustrated in FIG. 15.

In FIG. 15, the hollow rectangle indicates a unit cell containing a matrix atom (MA) in a matrix phase in a rare earth site. For example, Y or the like is an element to enter a rare earth site. The unit cell indicated by horizontal lines indicates a pinning atom (PA) acting as an artificial pin. Only Pr is a rare earth element to form PA. The unit cell indicated by vertical lines indicates a supporting atom (SA) in a supporting phase, and for example, Sm is used. Only SA is not necessarily required. The unit cell indicated by checkers indicates a counter atom (CA) in a counter phase. For example, Yb or the like is used in a rare earth site.

MA occupies 60% in terms of the number of elements. The kind of an element of MA is not limited to one, but Gd, Ho, Dy or the like may be used in addition to Y. Upper limit values of PA+SA and CA are each 20%. Each of PA and SA is a large unit cell when a Perovskite structure is formed, and CA is a small unit cell. These large and small unit cells are assembled by a clustering phenomenon in which assembling occurs due to shape anisotropy. In FIG. 15, assembled states are illustrated at two positions.

In FIG. 15, PA unit cells adjacent to each other in an a/b axis direction are non-superconductive, and a cluster obtained by assembling some unit cells is an artificial pin in which a superconducting state has been reduced by 75% in an average. The empty portion indicates a YBCO superconductor, and Tc thereof is considered to be 90.7 K except a portion adjacent to Pr. Therefore, as illustrated in FIG. 15, a superconducting current flows straight in a stretching direction of a wire material except a clustered artificial pin (CARP). Therefore, it is possible to realize improvement of a magnetic field characteristic and suppression of a quenching burning accident.

The superconducting coil 100 of the present embodiment contains an artificial pin having a small size, and therefore improves a magnetic field characteristic. In addition, lowering of Tc in a matrix phase can be also suppressed, and therefore an influence of IBC can be reduced.

When a superconducting current flows, it is considered that IBC generates an unnecessary voltage, and an energy loss leads to generation of a heat energy to cause a quenching burning accident.

CARP in the present embodiment is a system containing MA as YBCO, and hardly generates IBC even when 4%Pr (PA), 4%Sm(SA), and 8%Lu(CA) are added. As described above, it is difficult to observe IBC directly, and therefore IBC can be examined by an IBC indirect measurement method for detecting V(IBC) by increasing a current value to the vicinity of Jc in a short time.

For example, in the above structure, V(IBC)=0.11 µV is obtained at 50 K/5 T, and it is found that this is an extremely small value.

A large Ic value calculated is disadvantageous for V(IBC). When an inductance component is involved, V(IBC) is proportional to a current. A current is increased up to an Ic value in about four seconds, and therefore the current flows in a direction which is not an original current component. Even when V(IBC) is generated by a Lorentz force or the like in a magnetic field applied by the current, V(IBC) is also proportional to a current value. Therefore, it is considered that influence of IBC (If(IBC)) of an inner bypass current can be represented by a quotient of an Ic value.

$$If(IBC)=V(IBC)/Ic$$

At present, it is not necessarily possible to specify a value of If(IBC) capable of using a coil without causing a quenching burning accident. However, a superconducting wire of a $Dy_2O_3$ artificial pin has an achievement result of a switching operation performed 30 times using a current limiter. In addition, a quenching burning accident is observed when a superconducting wire of a BZO artificial pin is applied to a coil. Therefore, it is considered that the value of If(IBC) capable of using a coil without causing a quenching burning accident is between If(IBC) values of these superconducting wires. If(IBC) values at 50 K/5 T were 0.004 and 0.361, respectively.

The IBC indirect measurement method is measurement to try to detect V(IBC) by increasing a current in four seconds up to an Ic value and increasing V(IBC). If a quenching burning accident can be avoided when a voltage can be suppressed to 2 µV at 100 A by this measurement method, If(IBC)=0.020 is a boundary value. In argument here, this value is used as a provisional index value. When a relationship between a quenching burning accident and If(IBC) is clarified, it is considered that the boundary value will be clarified.

As described above, according to the present embodiment, a superconducting coil capable of suppressing a quenching burning accident can be realized. In addition, a superconducting coil having a magnetic field characteristic improved and capable of generating a stable magnetic field can be realized.

Second Embodiment

A superconducting coil of the present embodiment is similar to that of the first embodiment except that the second element is limited to at least one selected from the group consisting of neodymium (Nd) and samarium (Sm), the third element is limited to at least one selected from the group consisting of yttrium (Y), dysprosium (Dy), and holmium (Ho), and the fourth element is limited to at least one selected from the group consisting of erbium (Er) and thulium (Tm). Therefore, description of matters overlapping with the first embodiment is omitted.

In the present embodiment, a difference between an ionic radius of MA as the third element and an ionic radius of CA as the fourth element is relatively small, and a nucleation frequency is thereby increased. Therefore, the size of an artificial pin is reduced, and a superconducting coil having an excellent magnetic field characteristic particularly in a low temperature region can be achieved.

Particularly preferably, the second element is samarium (Sm), the third element is at least one selected from the group consisting of yttrium (Y) and holmium (Ho), and the fourth element is thulium (Tm) from a viewpoint of achieving a superconducting coil having an excellent magnetic field characteristic in a low temperature region.

Hereinafter, functions and effects of the present embodiment are described, and a CARP forming model is also described.

Figure 16:
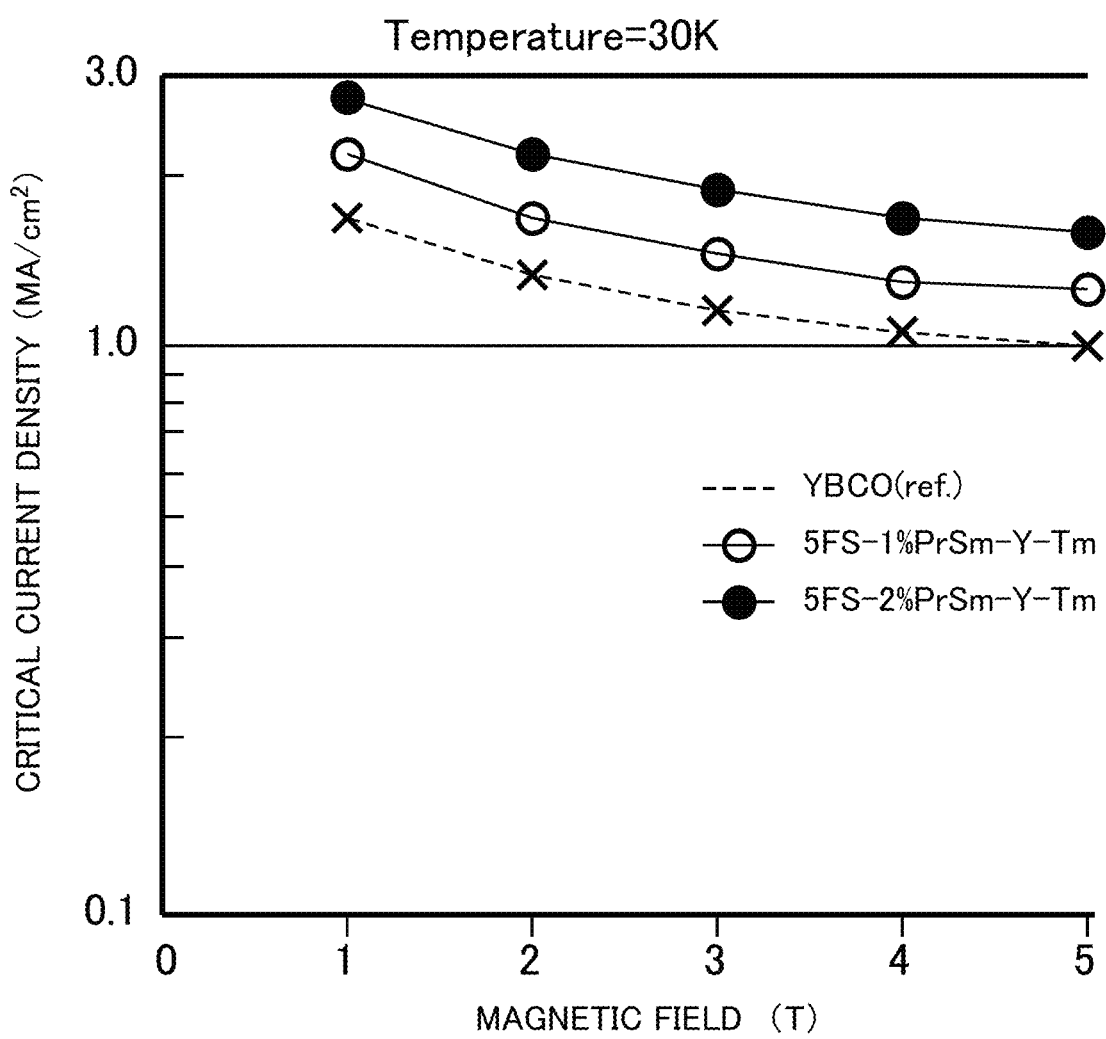
FIG. 16 is an explanatory diagram of functions and effects of a second embodiment.

FIG. 16 is an explanatory diagram of functions and effects of the present embodiment. FIG. 16 is a diagram illustrating a relationship between a magnetic field of the superconducting wire 20 in the present embodiment and a critical current density thereof. FIG. 16 illustrates a measurement result at a temperature of 30 K.

FIG. 16 illustrates a measurement result of a sample of YBCO containing no rare earth element other than yttrium (in FIG. 16, crossed mark) in a comparative embodiment, and a measurement result of a sample in which the contents of praseodymium, samarium, yttrium, and thulium in the rare earth element are 1%, 1%, 96%, and 2%, respectively (in FIG. 16, black circle mark), and a sample in which the contents of praseodymium, samarium, yttrium, and thulium in the rare earth element are 2%, 2%, 92%, and 4%, respectively (in FIG. 16, white circle mark) in the present embodiment. The horizontal axis indicates a magnetic field (T), and the vertical axis indicates a Jc value ($MA/cm^2$).

As clear from FIG. 16, in the present embodiment, a critical current density higher than that in a comparative embodiment is obtained.

For example, in a case of application to a power transmission cable or a current limiter, it is required to improve a magnetic field characteristic in a temperature region of 77 K to 50 K. On the other hand, for example, in a case of application to a superconducting coil used for a heavy particle radiotherapeutic device or a magnetically-levitated train, it is required to improve a magnetic field characteristic around 30 K. Therefore, it is also required to improve a magnetic field characteristic in a low temperature region.

In order to cause an effect as an artificial pin to be exhibited in a low temperature region, it is necessary to reduce the size of the artificial pin. This is because a smaller size makes an area adjacent to a superconductor larger even when the same artificial pin volume is introduced, and a potential difference on the surface becomes a microscopic pin force of the artificial pin. Therefore, when CARP is used as an artificial pin, it is necessary to reduce the size of CARP. In order to reduce the size of CARP, it is necessary to find the size of CARP currently achieved and to control the size to a small size. However, it is difficult to find the size of CARP.

A $BaZrO_3$ artificial pin which was developed in the past has a separated structure because of having a different lattice constant from YBCO in a matrix phase, and has a clear interface. Therefore, it is easy to specify a position of BZO. Therefore, it is also easy to find the size.

However, CARP has a completely different structure from conventional BZO, and a part of a continuous Perovskite structure forms an artificial pin. Therefore, it is difficult to determine whether a sample is CARP or a YBCO superconductor even by TEM observation. It is extremely difficult to observe the size of CARP directly.

It is difficult to observe the size of CARP directly. However, a sample obtains a small effect for improving a magnetic field characteristic using a pin size control technology at a temperature of 30 K and a magnetic field of 1 T to 3 T. Considering the size based on a conventional report example, this sample is estimated to have an artificial pin size of about 15 nm to 20 nm. Therefore, the size of CARP is analogized to be about 15 nm to 20 nm.

A position in which CARP is present is analogized from fluctuation of a position of a Cu atom which can be observed by TEM, or the like, and there is a high possibility that CARP is distributed in a lump shape in the whole of a film. The lump-shaped CARP is distributed in the film substantially uniformly, and it is estimated that the CARP has a diameter of 15 nm to 20 nm. Therefore, if a CARP forming model (CARP growth model) can be understood, the size of CARP can be controlled by application of the model.

PA, SA, and CA are assembled by a clustering phenomenon, PA makes four adjacent unit cells in an a/b plane non-superconductive, and the above CARP is thereby formed. It is estimated that the whole of CARP functions as an artificial pin. In order to control the size of CARP, it is necessary to find a unit cell serving as a starting point to form CARP.

There is a high possibility that the starting point to form CARP is CA. In a Perovskite structure of YBCO, there is a correlation between an ionic radius of an element to enter a Y site and an optimal oxygen partial pressure at the time of film formation. The optimal oxygen partial pressure is a value at which a Jc value of a resulting superconductor is the largest in liquid nitrogen. In addition, the oxygen partial pressure has a reverse correlation with an ionic radius.

For example, LaBCO has an optimal oxygen partial pressure of 0.2 ppm, NdBCO has an optimal oxygen partial pressure of 5 ppm, and SmBCO has an optimal oxygen partial pressure of 20 ppm. The size of an ionic radius is indicated by La>Nd>Sm>Y>Tm>Yb>Lu. YBCO has an optimal oxygen partial pressure of 1000 ppm. It is considered that TmBCO, YbBCO, and LuBCO have optimal oxygen partial pressures of about 2000 ppm, 3000 ppm, and 4000 ppm, respectively although exact values thereof are not clear.

It is considered that a difference in an effective ionic radius between elements is determined by a logarithmical difference from an optimal oxygen partial pressure of YBCO. As for a difference from an optimal oxygen partial pressure of YBCO, an optimal oxygen partial pressure of SmBCO to constitute CARP is 1/50 of that of YBCO, that is there is a difference of 50 times. TmBCO has a difference of two times, YbBCO has a difference of three times, and LuBCO has a difference of four times. There is no data for PrBCO, but the data is between La and Nd, and is estimated to be from 0.2 ppm to 5 ppm, but is considered to be about 1 ppm. CA has the smallest difference in an effective ionic radius from YBCO. As a difference in an ionic radius is smaller, a nucleation frequency should be relatively higher, and there is a high possibility that the starting point to grow CARP is CA. PA or SA has a lower nucleation frequency than CA.

An important factor to determine the size of CARP is a nucleation frequency in MA and CA. When a nucleation frequency in CA is 1/1000000 of MA, one CA is grown with respect to 1000000 MAs, and surrounding elements to constitute CARP are assembled. These elements form CARP. It is assumed that one CA is grown with respect to 1000000 MAs at CA=Lu. In addition, it is assumed that one CA is grown with respect to 10000 MAs at CA=Tm.

In CARP containing Lu, a nucleus is generated at a possibility of 1/1000000. After nucleation, CARP is formed until a concentration of surrounding elements to constitute CARP is diluted. At this time, it can be easily estimated that considerably large CARP is formed. If the concentration of elements to constitute CARP is 8%, one CARP formed of 12500 unit cells is formed in 1000000 MA unit cells.

On the other hand, in a case of Tm, the nucleation frequency is 1/10000. This case means that 100 Tm nuclei are generated in a region in which Lu-CARP is formed. That is, 12500 unit cells are equally divided into about 100, and 100 CARPs each formed of 125 unit cells are formed.

Figure 17A:
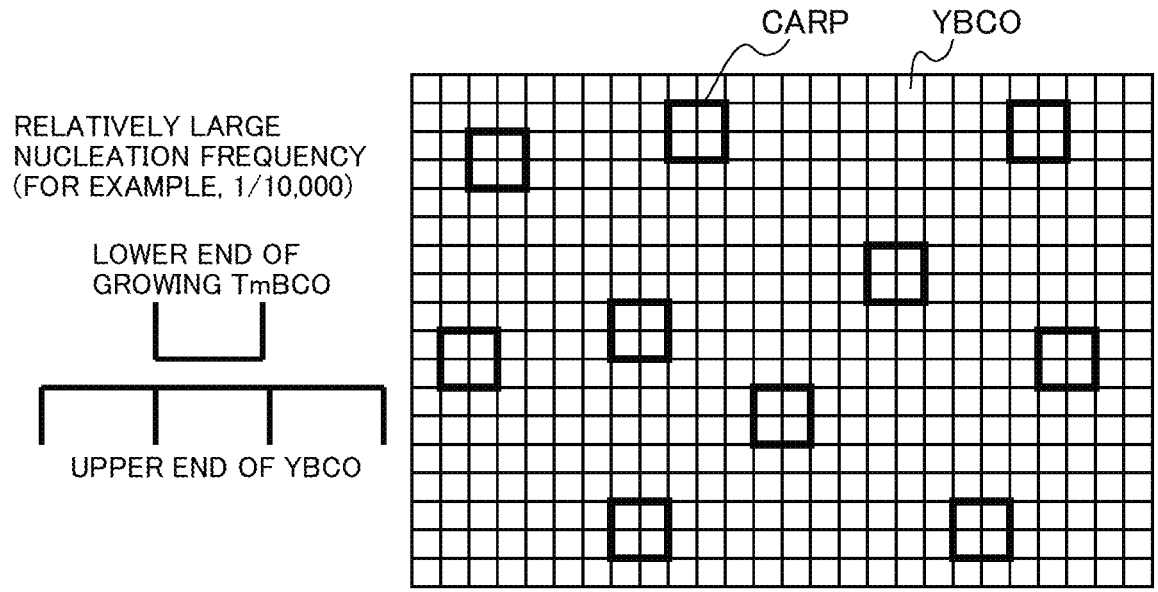
FIGS. 17A and 17B are explanatory diagrams of functions and effects of the second embodiment.
Figure 17B:
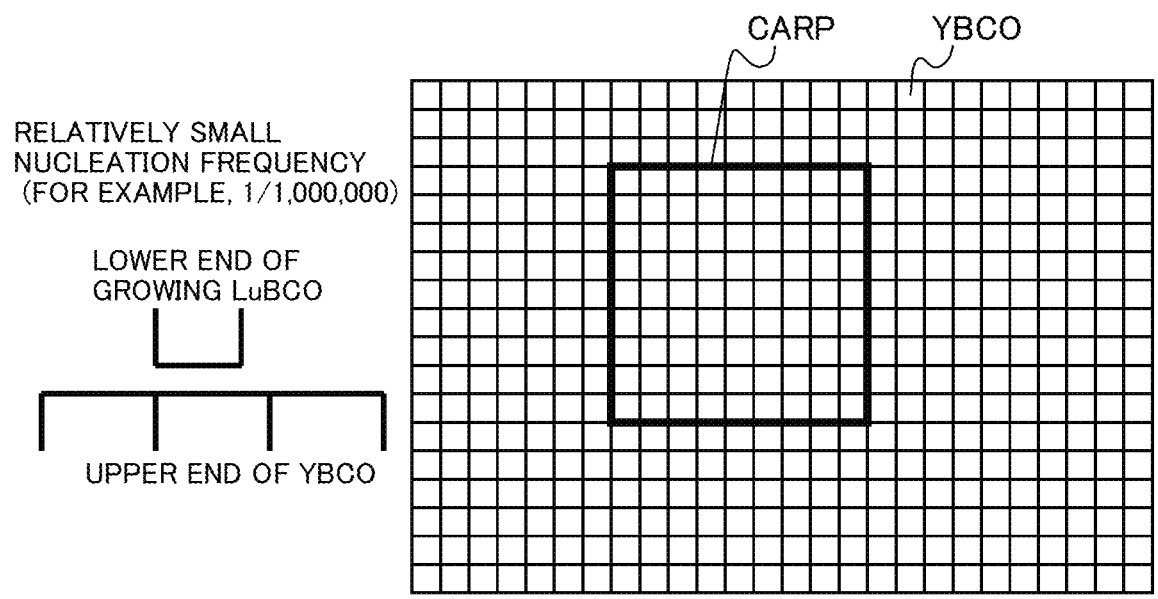

FIGS. 17A and 17B are diagrams illustrating functions and effects of the second embodiment. FIGS. 17A and 17B are diagrams schematically illustrating a difference in growth of CARP when CAs having different ionic radii are applied.

FIG. 17A illustrates a case where CA is Tm. FIG. 17B illustrates a case where CA is Lu. Tm has a smaller difference in an ionic radius from Y than Lu. Therefore, a difference between a unit cell size of TmBCO and a unit cell size of YBCO is smaller than a difference between a unit cell size of YbBCO and a unit cell size of YBCO, and makes a nucleation frequency larger.

In a case where CA is Lu, nucleation does not easily occur. When nucleation occurs, surrounding elements to constitute CARP are assembled to form CARP. Therefore, such a large CARP as illustrated in FIG. 17B is formed. On the other hand, in a case where CA is Tm, a nucleation velocity is large, and therefore many nuclei are generated. Elements to constitute CARP move to each of many nuclei, and form CARP. The amount of the elements to constitute CARP moving to each of many nuclei is small. Therefore, as illustrated in FIG. 17A, the size of CARP is smaller than that in a case where CA is Lu.

It is estimated that CARP formed at Pr:Sm:Yb=1:1:2, having the same size is formed even when the amount of elements to constitute CARP becomes twice. It is assumed that sample 1 at Pr:Sm:Yb=1:1:2(%) and sample 2 at Pr:Sm:Yb=2:2:4 are film-formed.

The Yb nucleation amount of the latter is twice that of the former, and therefore the number of CARP in the same volume is twice. A region which can include elements to constitute CARP is ½. However, the concentration of elements to constitute CARP in the region is twice, and therefore the same size of CARP is obtained as a result.

Furthermore, in general, even in a case of n times of 1:1:2, the same result is obtained. When films having the same ratio of PA:SA:CA but different total amounts are formed, the size is the same but only the number of CARP is increased.

In the above case, for example, when only CA is increased from PA:SA:CA=1:1:2 to obtain PA:SA:CA=1:1:8, the volume of elements to constitute CARP is the same (CA excess amount 6% does not form CARP), but the nucleation number is four times the number before increase in CA. That is, CARP is formed in the number four times the number of conventional CA. It has been thereby confirmed that a characteristic of Yb-based CARP is increasing at 30 K/1 to 3 T. This is a CARP forming model which is clear at present.

Particularly effective means for reducing the size of CARP are (1) increase only in CA and (2) use of CA having a higher nucleation frequency. When the nucleation number is increased, the final size of CARP is determined by the amount of elements to constitute CARP. The size of CARP in the current CARP growth model can be described as follows.

$$D(CP) = k \times M(CP) \times V(MA)/V(CA)$$

In the above formula, the signs are defined as follows.
D(CP): average diameter of CARP (Diameter of CARP)
M(CP): molar number per unit volume of elements to constitute CARP (Mass of CARP)
V(MA): nucleation velocity (frequency) of MA (Velocity of MA nucleation)
V(CA): nucleation velocity (frequency) of CA (Velocity of CA nucleation)
k: constant in CARP growth model (CARP constant)

In order to reduce D(CP) to cause an effect to be exhibited at 30 K, it is only required to reduce V(MA) or increase V(CA) when M(CP) is the same. An element which can be used for MA is restricted. When Gd is used for 100% MA, precipitation occurs easily in a solution. Therefore, it is a key to reduction of D(CP) and improvement of a characteristic at 30 K to select an element for CA or to mix and use CAs.

When the above (1) is used as a means for reducing the size of CARP, an effect is confirmed by using Yb for CA. However, increase in the amount of CA forms a region having a low Tc inside, and may lead to increase in an inner bypass current. However, at present, a significant bad effect has not been confirmed.

In a coil application in which formation of a voltage due to an inner bypass current is desirably avoided, it is considered that an effect is more effectively caused to be exhibited at 30 K using only the technology of (2) as a means for reducing the size of CARP. That is, a technology to increase V(CA) is desired while PA+SA=CA in the amount is maintained.

In order to achieve large V(CA), it is known that lattice mismatch with MA is only required to be reduced. A nucleation frequency of CA is determined by lattice mismatch with MA. When lattice mismatch is zero, that is, when MA itself generates a nucleus on MA, a velocity is the largest, of course.

However, as lattice mismatch is increased, the nucleation frequency or the nucleation velocity is reduced. It is said that growth of cube on cube does not occur in lattice mismatch more than 7%. That is, a state in which the velocity is zero is obtained.

There is no specific report on an experimental result indicating the degree of increase in a nucleation velocity when lattice mismatch is 4%, 3%, or 2%. However, according to a calculation scientist, reduction in lattice mismatch by 1% will increase the nucleation velocity about by 10 times.

It is considered that it is difficult to measure a strict lattice constant directly at a time point at which a Perovskite structure is formed by a TFA-MOD method to generate an HF gas. It is estimated that lattice mismatches in a case where Lu, Yb, and Tm come to a Y site are 4%, 3%, and 2%, respectively. It is considered that the nucleation velocity of Yb is about 10 times that of Lu, and the nucleation velocity of Tm is about 100 times that of Lu.

The nucleation velocity is mainly adjusted by adding Er or Yb based on Tm. When Tm has a large nucleation velocity, Yb is mixed therewith partially. When the velocity is not sufficient, Er is mixed therewith. A superconductor having a high characteristic at 30 K is thereby obtained. In addition, a region other than a CARP region is constituted by MA. Therefore, disorder of a voltage due to an inner bypass current is small. In addition, even when CARP is formed in a small size, a noise of the inner bypass current is small.

As for the disorder of a voltage due to an inner bypass current, huge disorder of a voltage has been confirmed in a BZO artificial pin. CARP formed of Yb, that is, Yb-CARP has a voltage noise of only about 1/300 of the BZO artificial pin. It is considered that this small voltage noise depends on a displacement from an advancing direction after movement of a superconducting current by a certain distance. It is considered that the voltage noise is associated with a ratio of a displacement in a direction perpendicular to the advancing direction of a current.

As Table 1 indicates calculation results, only Ib=0.020% is obtained at Rvp=8%. In addition, this value does not depend on a radius R in a case where an artificial pin is assumed to be a sphere. That is, theoretically, CARP is considered to be an artificial pin which does not increase an inner bypass current and does not increase a noise even when the pin size of CARP is reduced.

From the above calculation, when CA containing at least Tm or Er is manufactured, and MA is Y, improvement of a characteristic at 30 K can be expected due to clustering. A superconducting wire containing the CARP does not generate a large voltage noise theoretically. By forming a coil using this CARP-containing superconducting wire having a new structure, a superconducting coil which is hardly quenched can be obtained.

Third Embodiment

A superconducting coil of the present embodiment includes a superconducting wire. The superconducting wire contains an oxide superconductor layer. The oxide superconductor layer has a continuous Perovskite structure containing a rare earth element, barium (Ba), and copper (Cu). The rare earth element contains a first element which is praseodymium (Pr), at least one second element selected from the group consisting of gadolinium (Gd), yttrium (Y), terbium (Tb), dysprosium (Dy), and holmium (Ho), and at least one third element selected from the group consisting of erbium (Er), thulium (Tm), ytterbium (Yb), and lutetium (Lu).

The superconducting coil of the present embodiment is different from the first embodiment in that an oxide superconductor layer 30 contains no supporting atom (SA) in the first embodiment. Hereinafter, description of matters overlapping with the first embodiment is omitted.

The oxide superconductor layer 30 in the present embodiment contains a third generation type clustered atom-replaced artificial pin (third CARP).

The oxide superconductor layer 30 in the present embodiment is formed of PA, MA, and CA. The first element is a pinning atom (PA), the second element is a matrix atom (MA), and the third element is a counter atom (CA).

By adjusting an average size of MA and making an average ionic radius of each of PA and CA closer to that of MA directly, a cluster is formed to act as an artificial pin.

In the oxide superconductor layer 30 in the present embodiment, SA as a superconducting unit cell is not present, and therefore a potential in an artificial pin site is equal to a complete non-superconductor. Therefore, a pin force becomes a theoretically maximum value.

When the number of atoms of a rare earth element is N(RE), and the number of atoms of the second element as MA is N(MA), $N(MA)/N(RE) \geq 0.6$ is desirably satisfied. When the ratio is less than the above range, a ratio of a superconducting unit cell is reduced, and there is a risk that a sufficient superconducting characteristic could not be obtained.

When the number of atoms of the second element is N(MA), and the number of atoms of yttrium contained in the second element as MA is N(Y), $N(Y)/N(MA) \geq 0.5$ is desirably satisfied. A material of yttrium (Y) is relatively inexpensive, and therefore cost of an oxide superconductor can be reduced.

When the number of atoms of a rare earth element is N(RE), and the number of atoms of the first element as PA is N(PA), $0.00000001 \leq N(PA)/N(RE)$ is desirably satisfied. When the ratio is less than the above range, there is a risk that a sufficient effect for improving a magnetic field characteristic could not be obtained.

When the number of atoms of a rare earth element is N(RE), and the number of atoms of the first element as PA is N(PA), $N(PA)/N(RE) \leq 0.2$ is desirably satisfied. In addition, when the number of atoms of a rare earth element is N(RE), and the number of atoms of the first element as PA is N(PA), $N(PA)/N(RE) \leq 0.1$ is more desirably satisfied. When the ratio is more than the above range, a ratio of a superconducting unit cell is reduced, and there is a risk that a sufficient superconducting characteristic could not be obtained.

As described above, according to the present embodiment, a superconducting coil capable of suppressing a quenching burning accident can be realized similarly to the first embodiment. In addition, a superconducting coil having a magnetic field characteristic improved and capable of generating a stable magnetic field can be realized.

Fourth Embodiment

A superconducting device of the present embodiment is a superconducting device including the superconducting coil of the first or second embodiment. Hereinafter, description of matters overlapping with the first or second embodiment is omitted.

Figure 18:
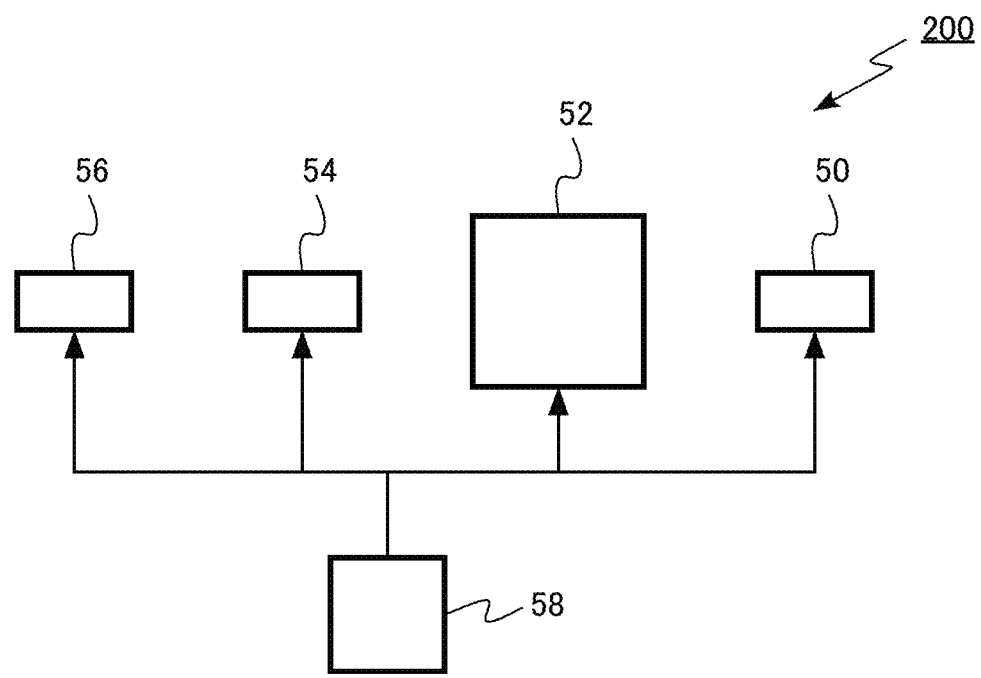
FIG. 18 is a block diagram of a superconducting device of a fourth embodiment.
Figure 19A:
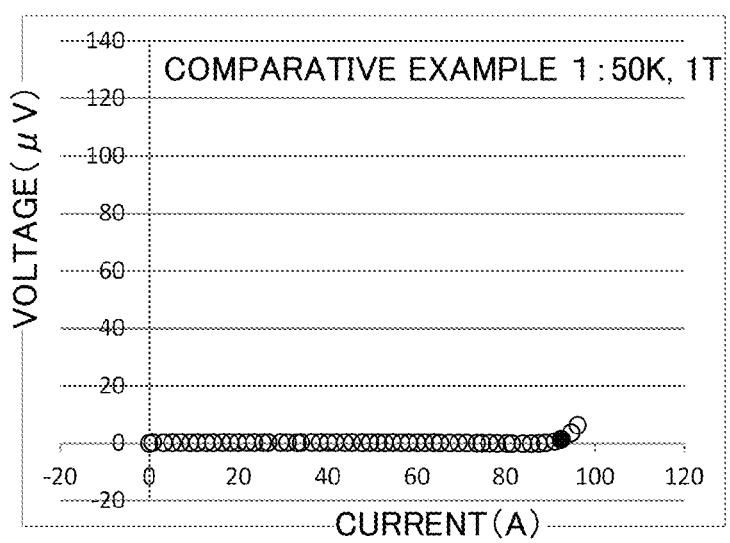
FIGS. 19A, 19B, and 19C are graphs illustrating a current voltage characteristic in Comparative Example 1.
Figure 19B:
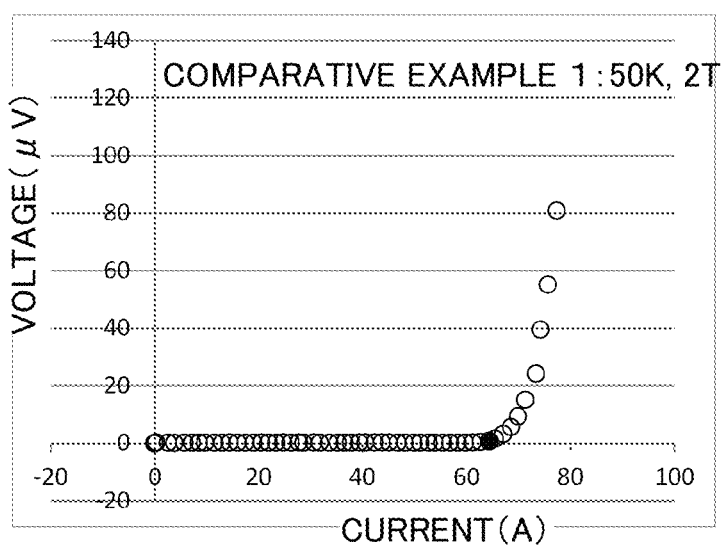
Figure 19C:
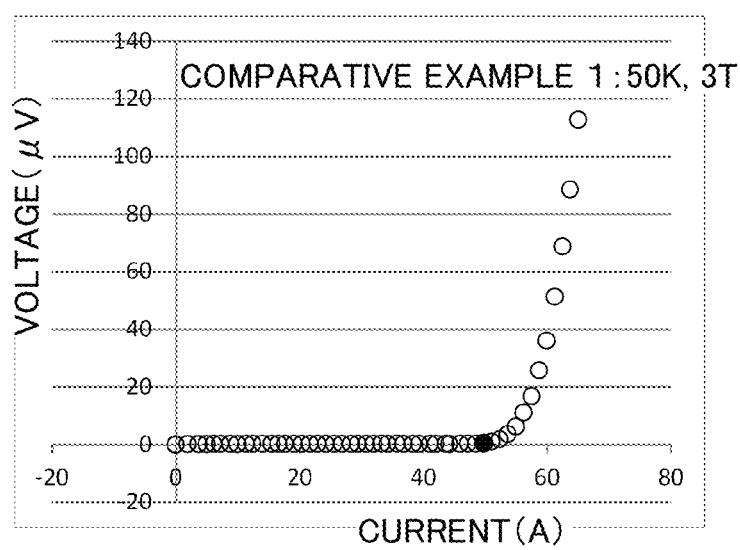
Figure 20A:
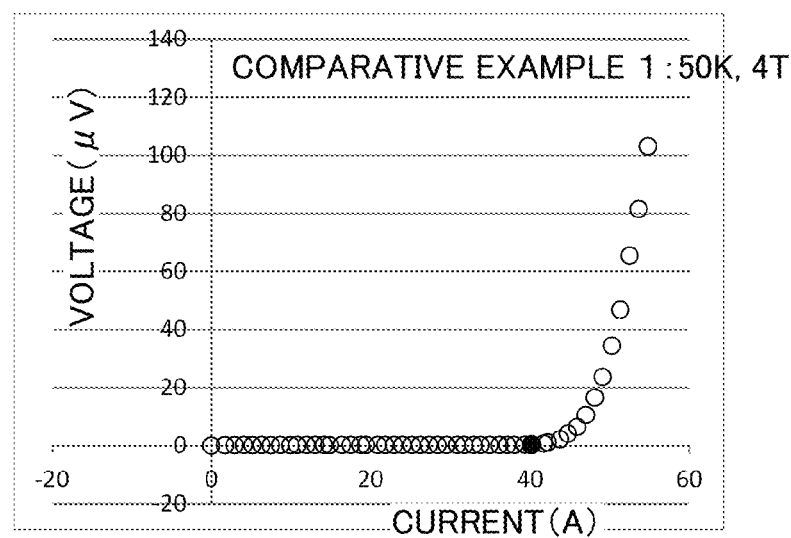
FIGS. 20A, 20B, and 20C are graphs illustrating a current voltage characteristic in Comparative Example 1.
Figure 20B:
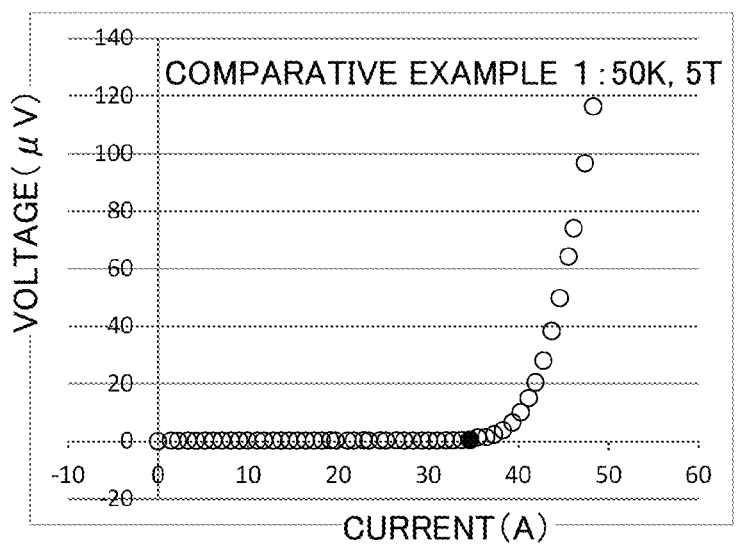
Figure 20C:
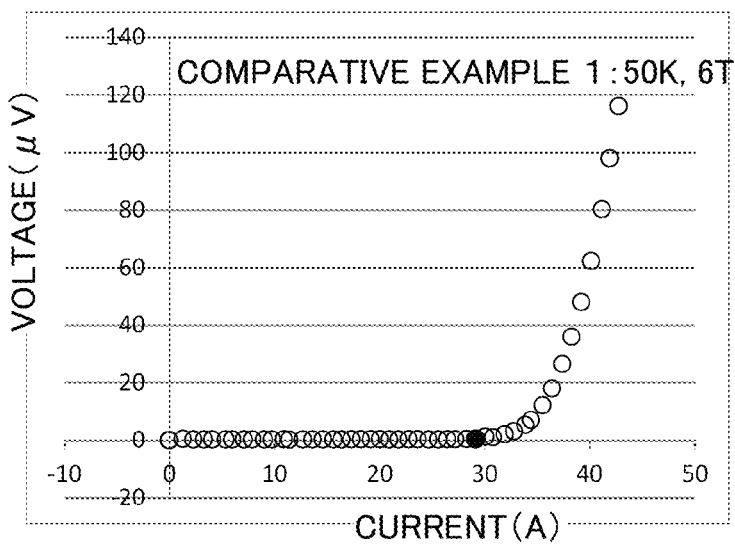
Figure 21A:
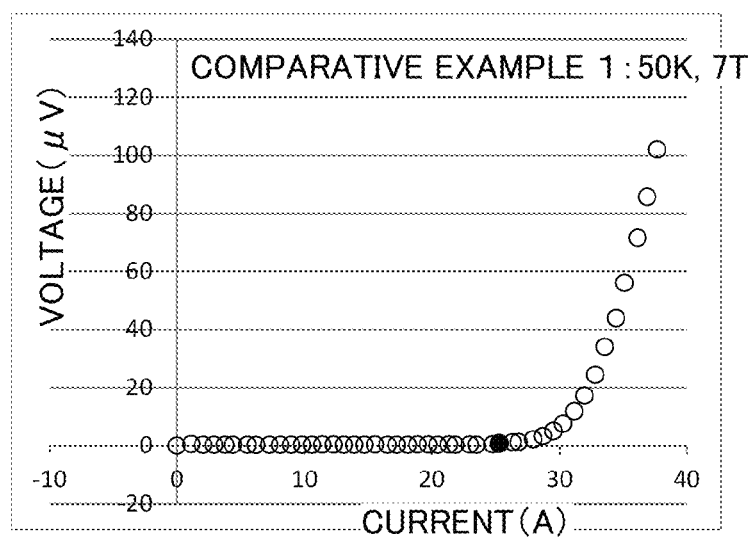
FIGS. 21A, 21B, and 21C are graphs illustrating a current voltage characteristic in Comparative Example 1.
Figure 21B:
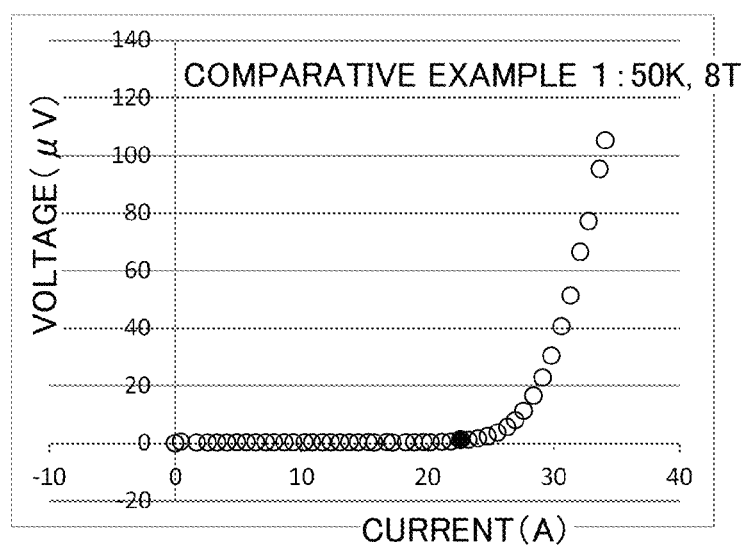
Figure 21C:
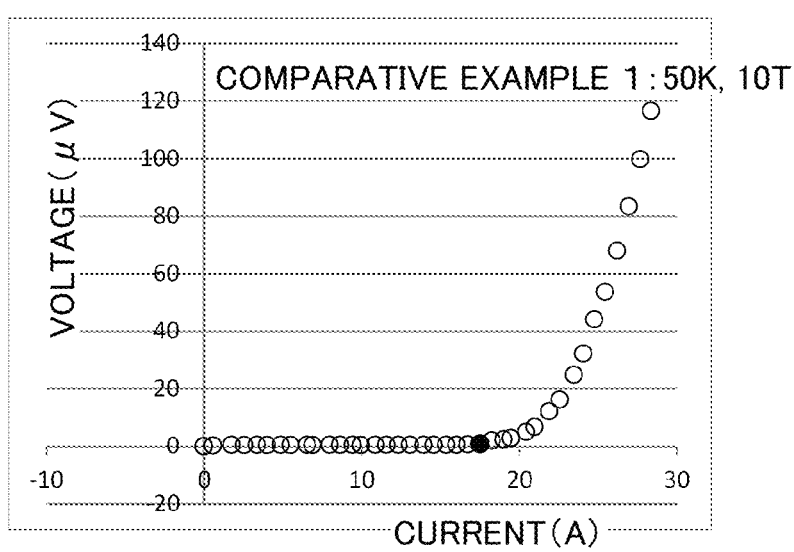
Figure 22A:
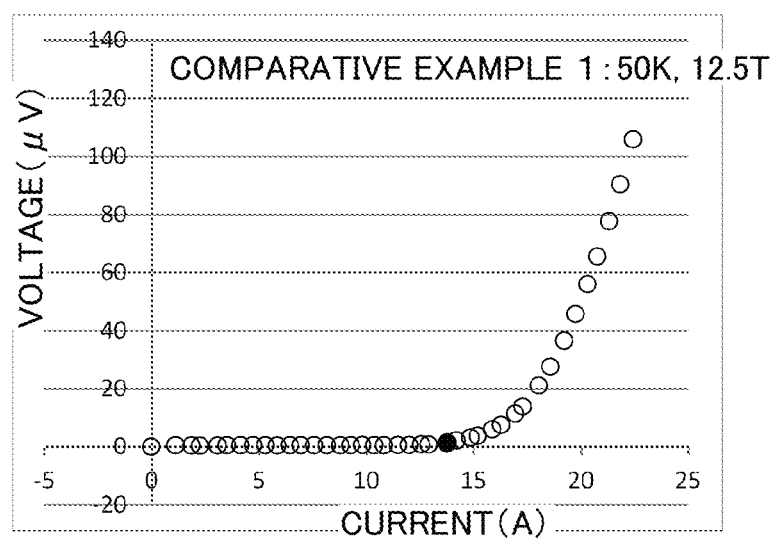
FIGS. 22A and 22B are graphs illustrating a current voltage characteristic in Comparative Example 1.
Figure 22B:
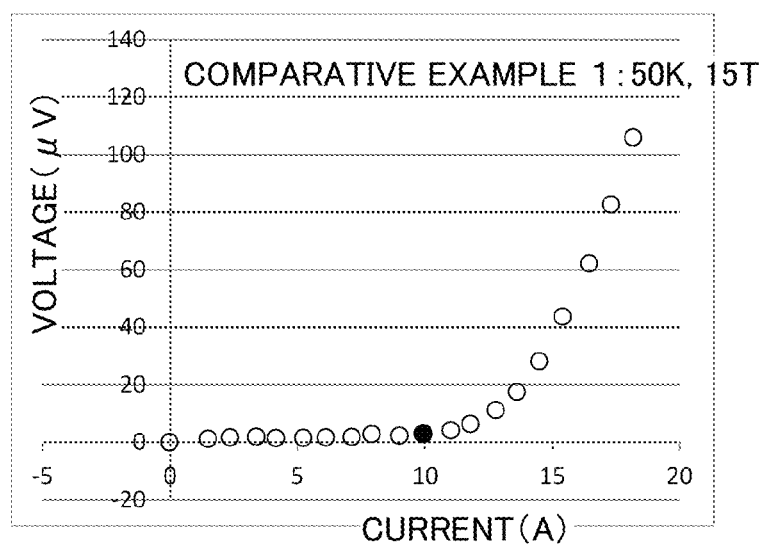
Figure 23A:
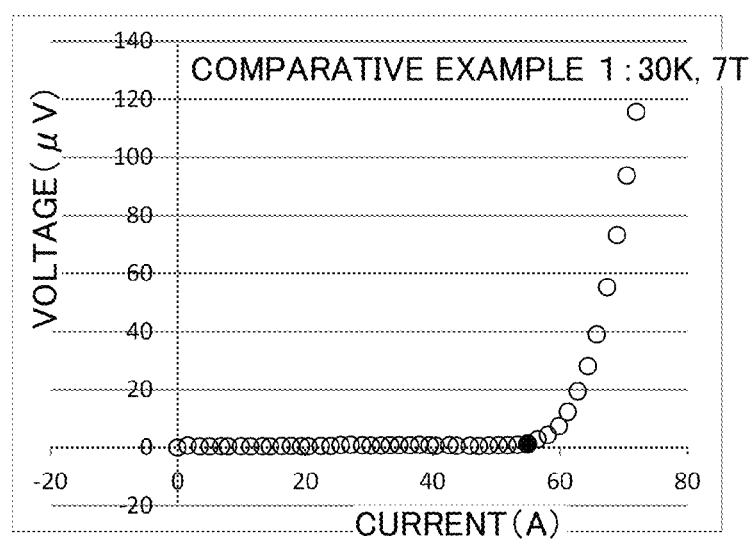
FIGS. 23A, 23B, and 23C are graphs illustrating a current voltage characteristic in Comparative Example 1.
Figure 23B:
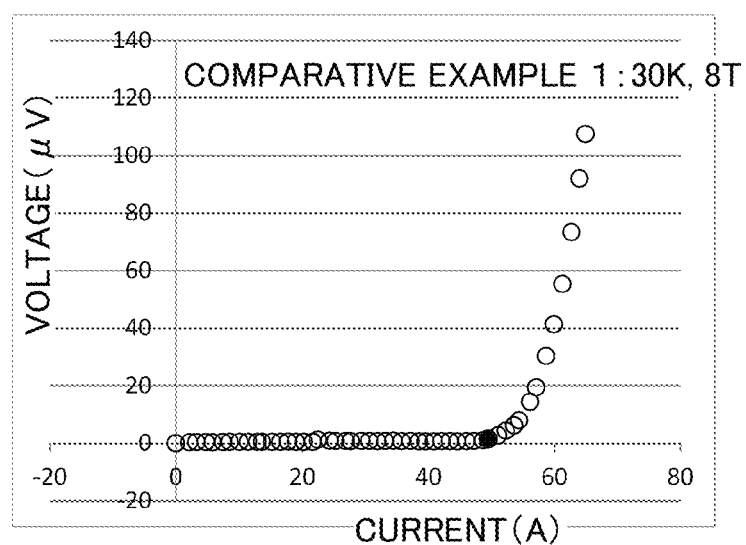
Figure 23C:
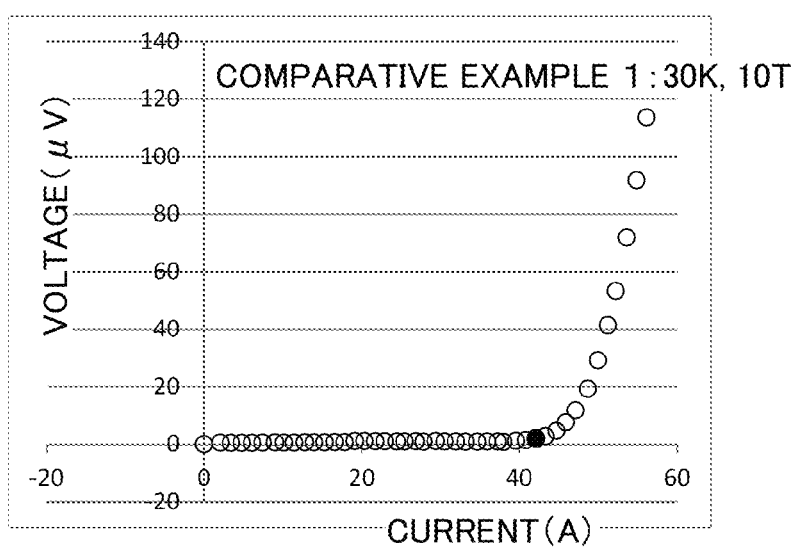
Figure 24A:
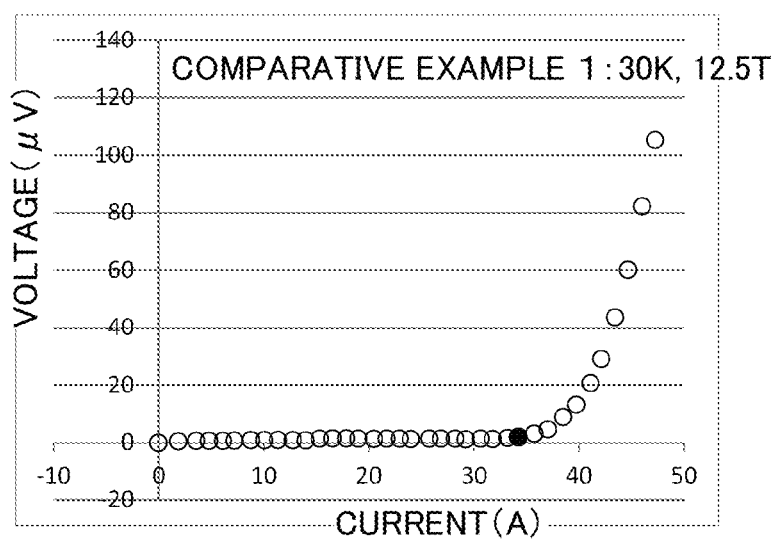
FIGS. 24A and 24B are graphs illustrating a current voltage characteristic in Comparative Example 1.
Figure 24B:
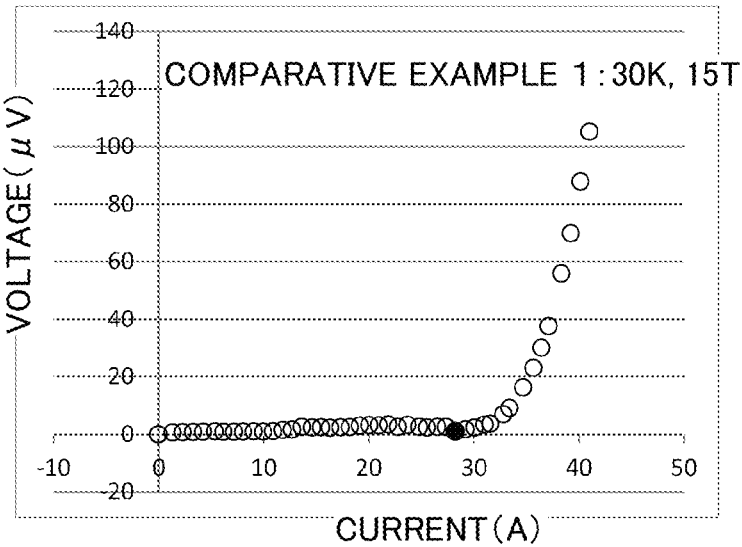
Figure 25A:
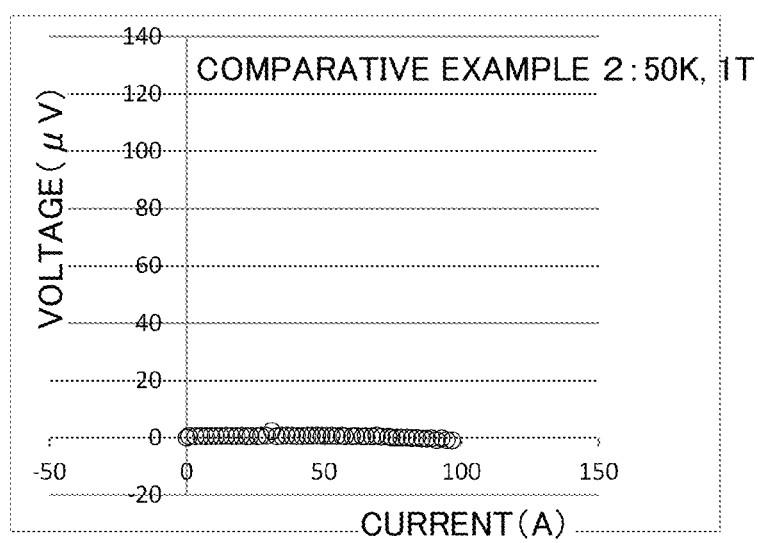
FIGS. 25A, 25B, and 25C are graphs illustrating a current voltage characteristic in Comparative Example 2.
Figure 25B:
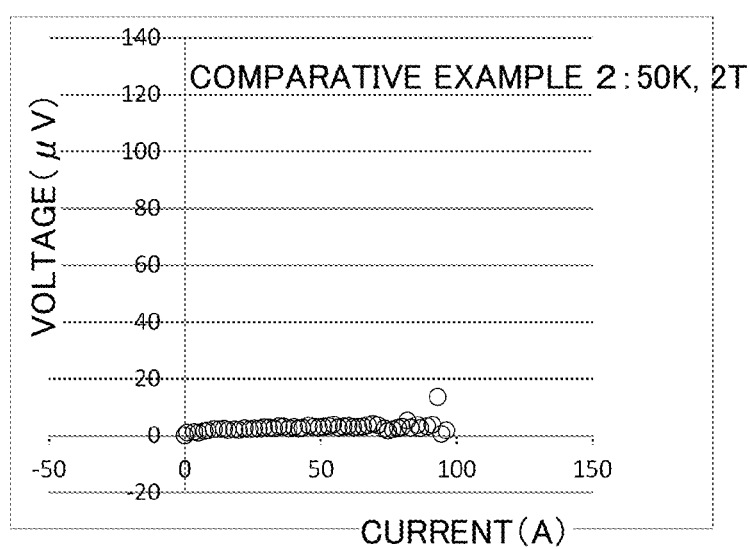
Figure 25C:
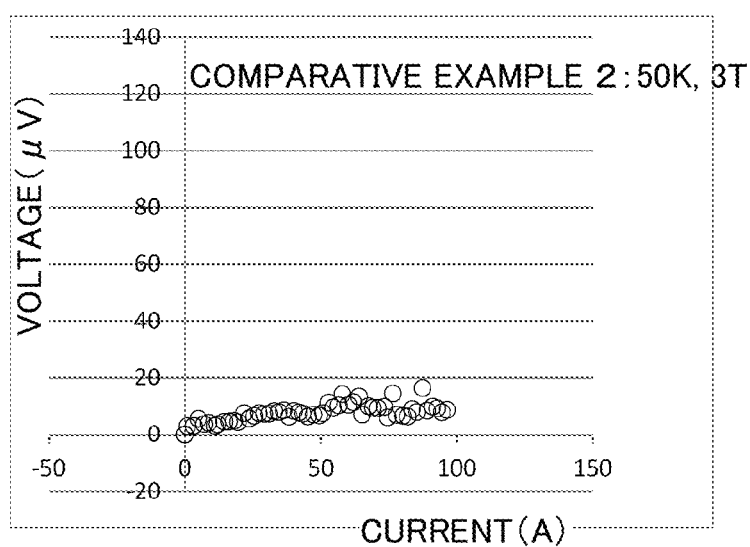
Figure 26A:
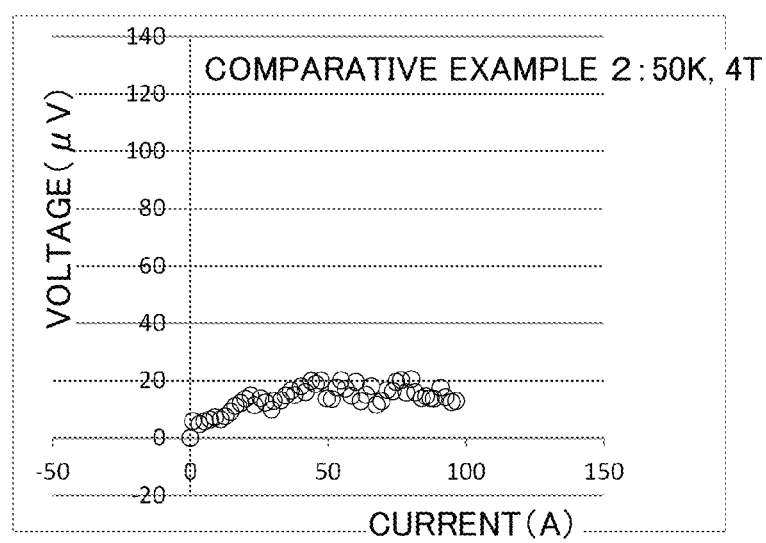
FIGS. 26A, 26B, and 26C are graphs illustrating a current voltage characteristic in Comparative Example 2.
Figure 26B:
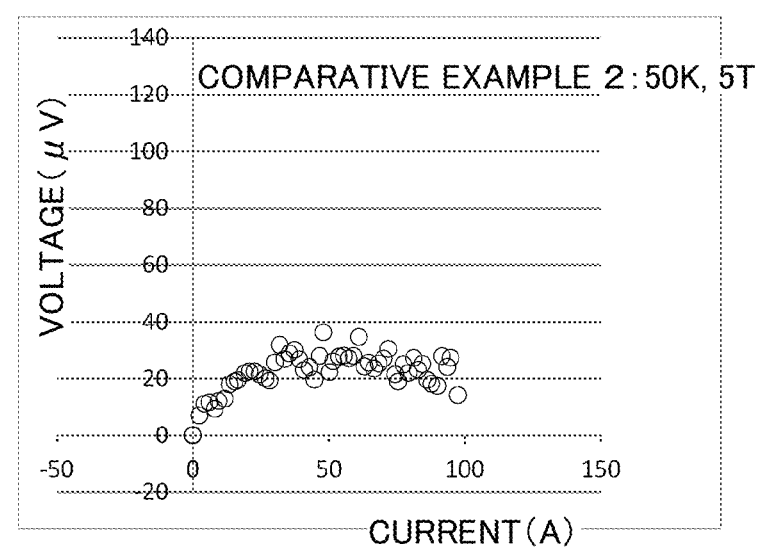
Figure 26C:
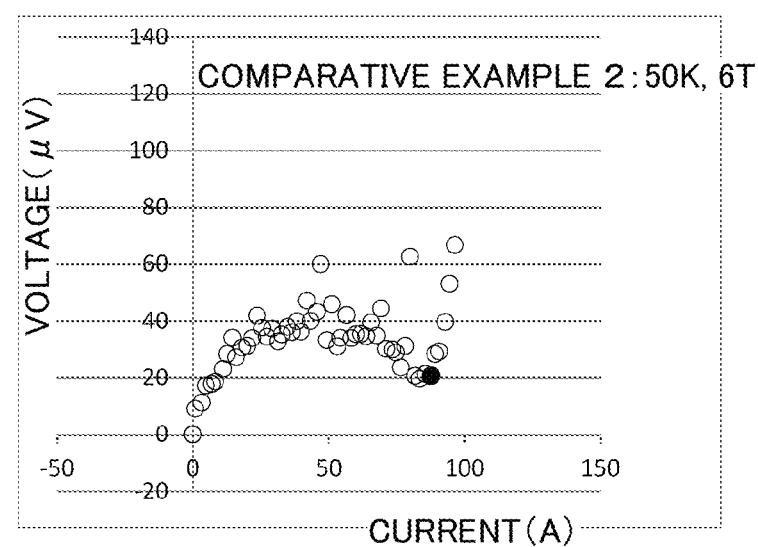
Figure 27A:
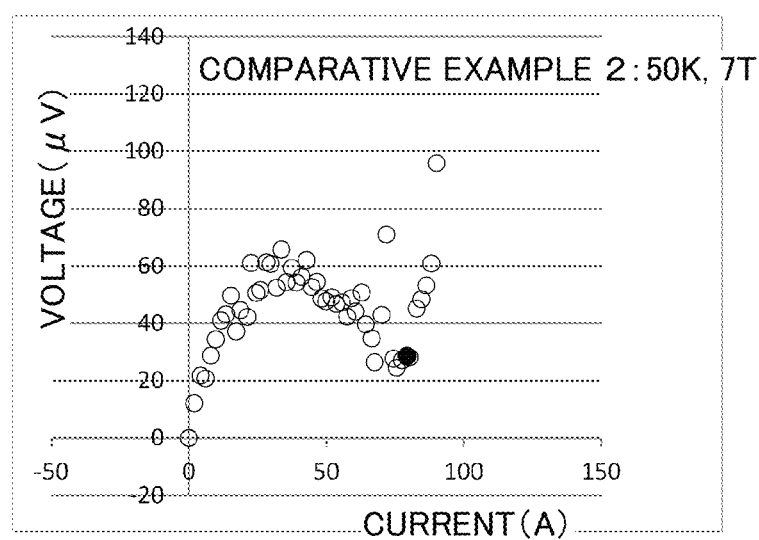
FIGS. 27A, 27B, and 27C are graphs illustrating a current voltage characteristic in Comparative Example 2.
Figure 27B:
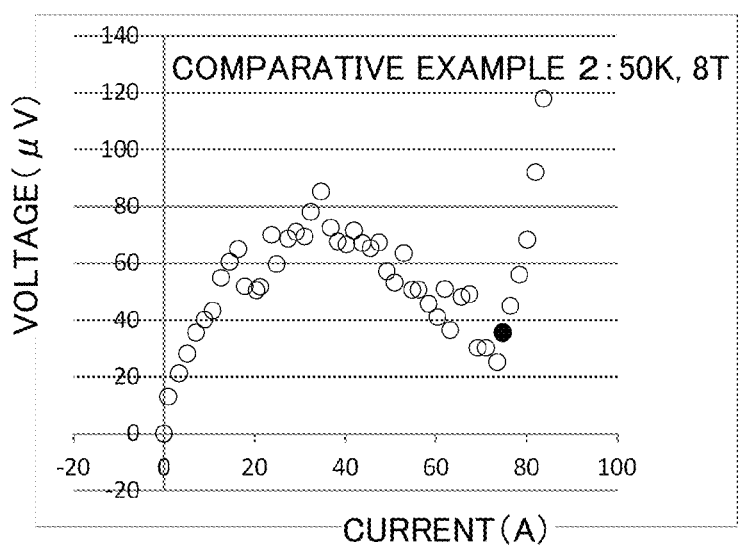
Figure 27C:
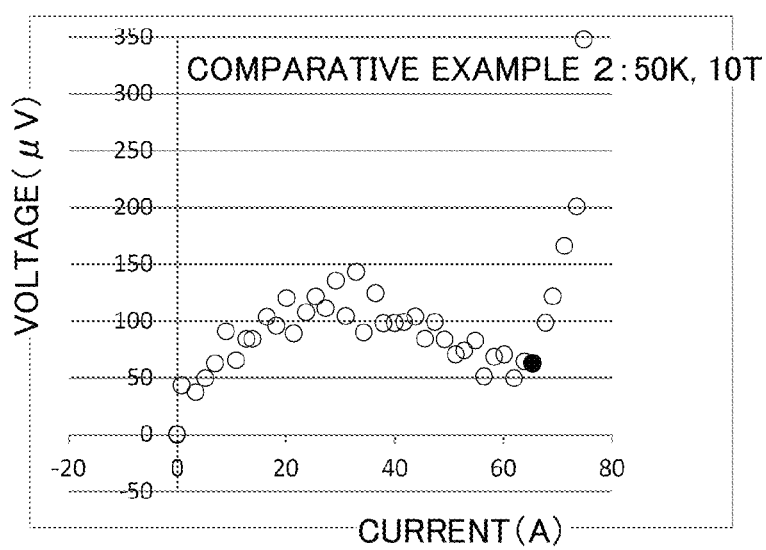
Figure 28A:
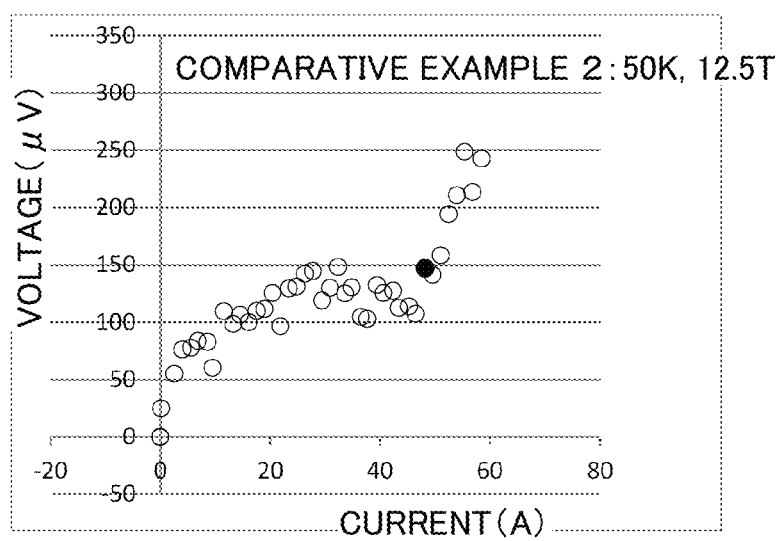
FIGS. 28A and 28B are graphs illustrating a current voltage characteristic in Comparative Example 2.
Figure 28B:
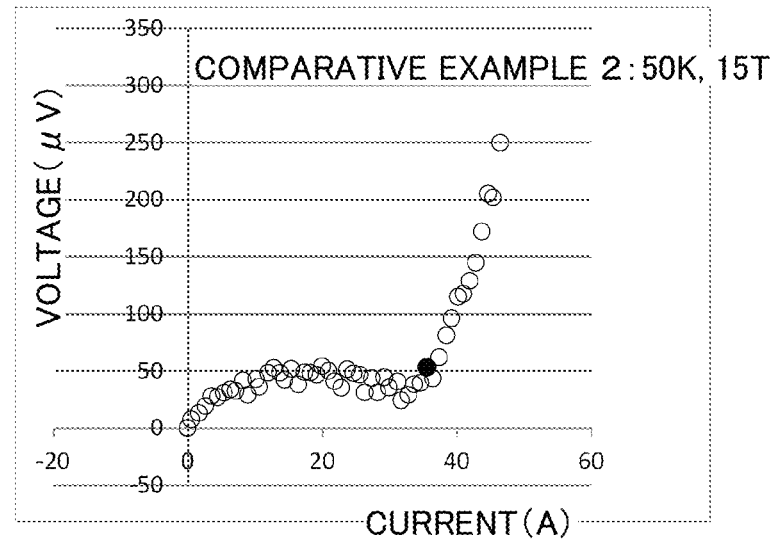
Figure 29A:
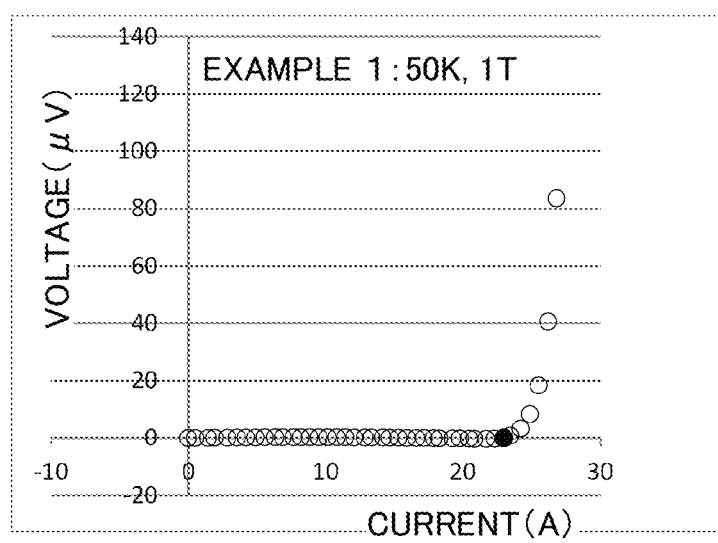
FIGS. 29A, 29B, and 29C are graphs illustrating a current voltage characteristic in Example 1.
Figure 29B:
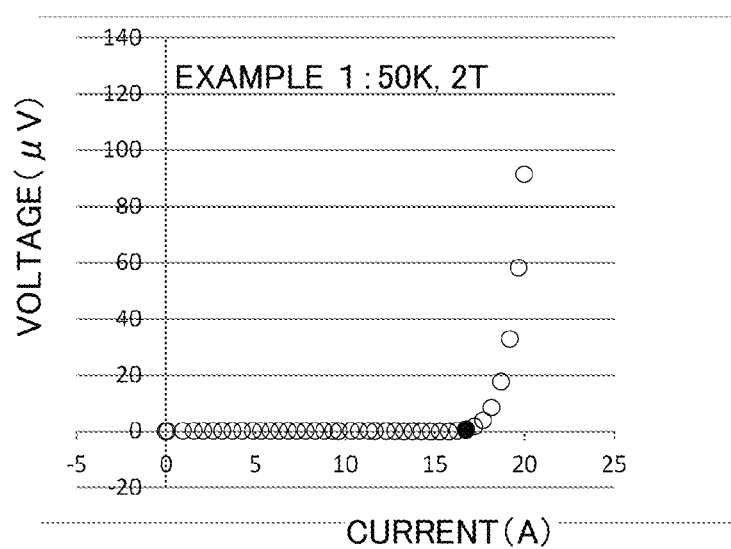
Figure 29C:
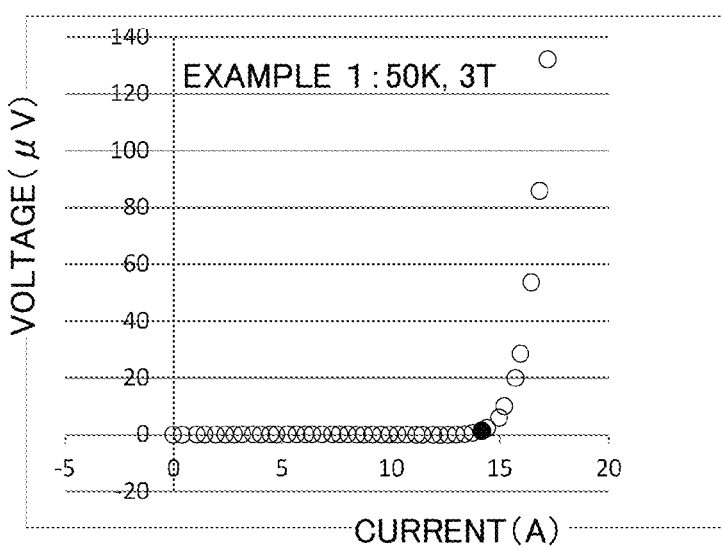
Figure 30A:
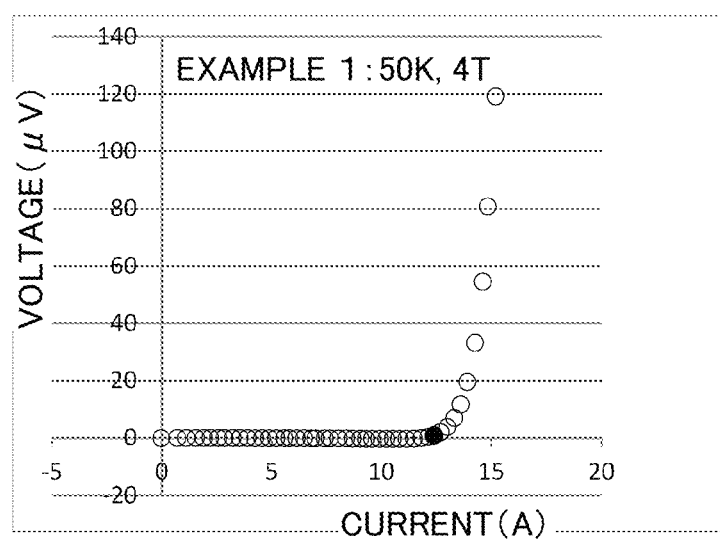
FIGS. 30A, 30B, and 30C are graphs illustrating a current voltage characteristic in Example 1.
Figure 30B:
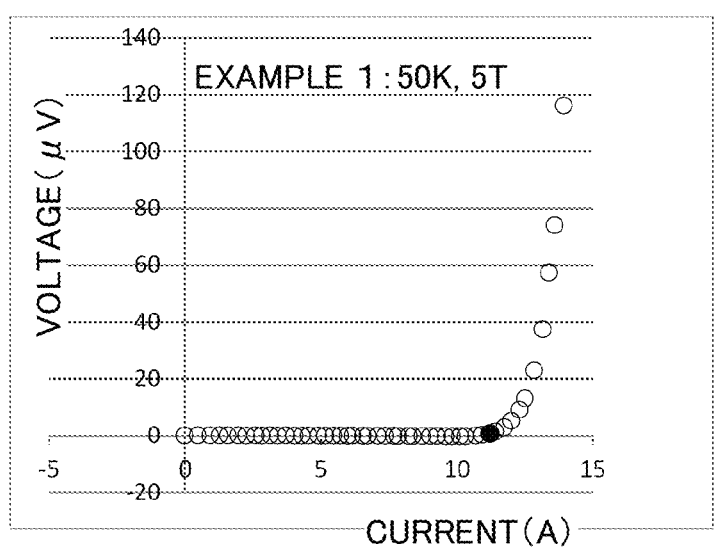
Figure 30C:
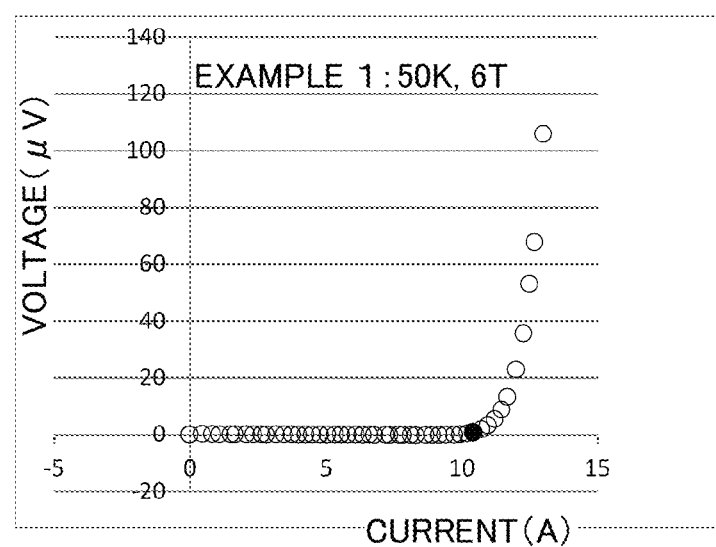
Figure 31A:
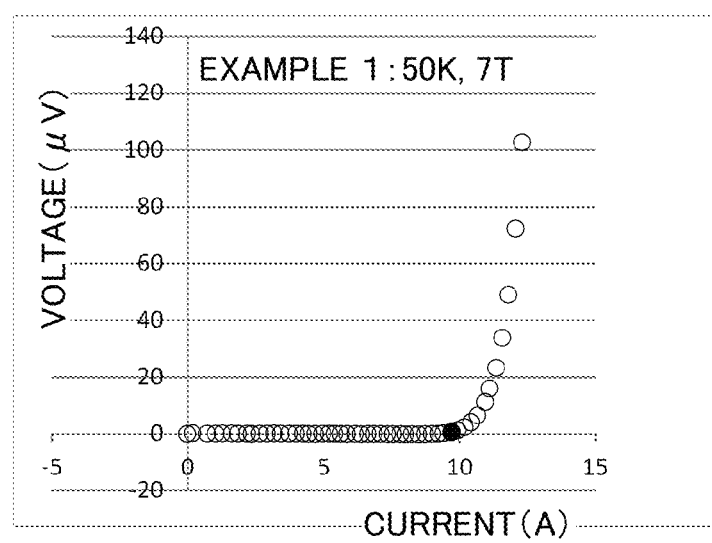
FIGS. 31A, 31B, and 31C are graphs illustrating a current voltage characteristic in Example 1.
Figure 31B:
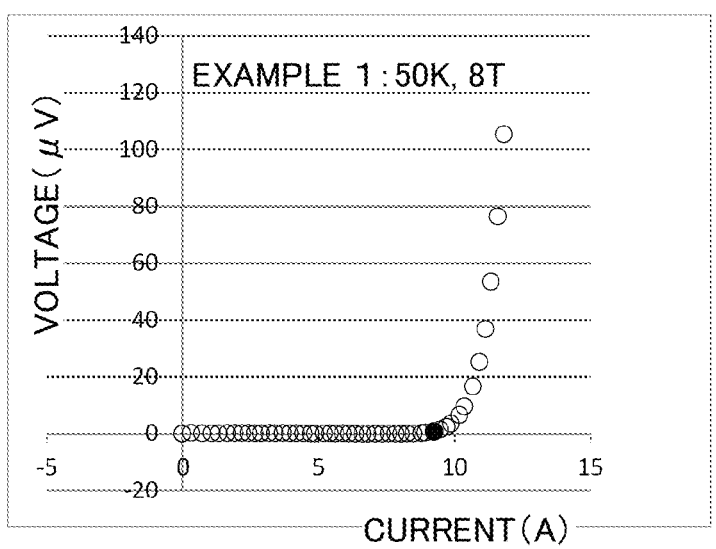
Figure 31C:
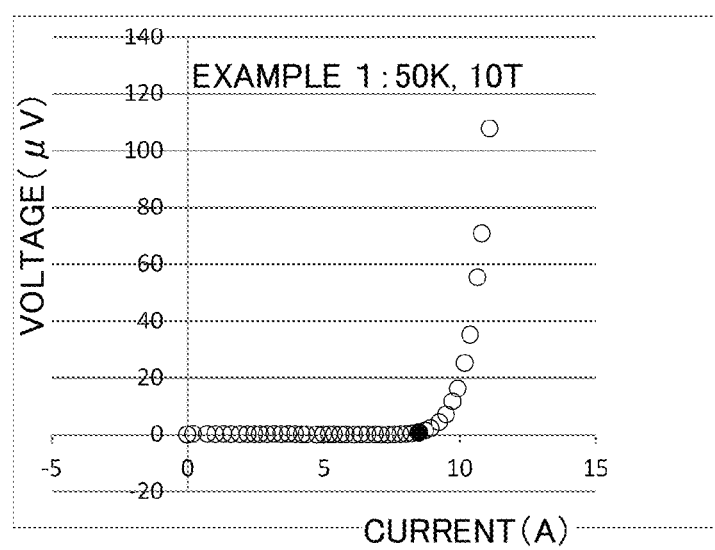
Figure 32A:
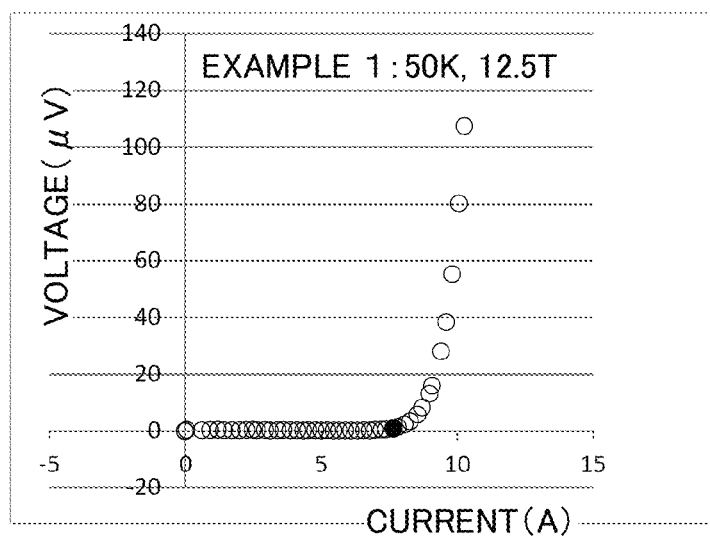
FIGS. 32A and 32B are graphs illustrating a current voltage characteristic in Example 1.
Figure 32B:
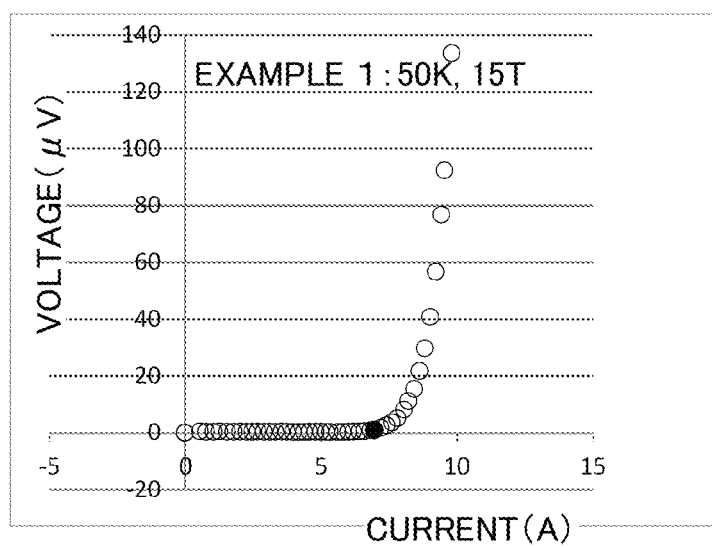
Figure 33A:
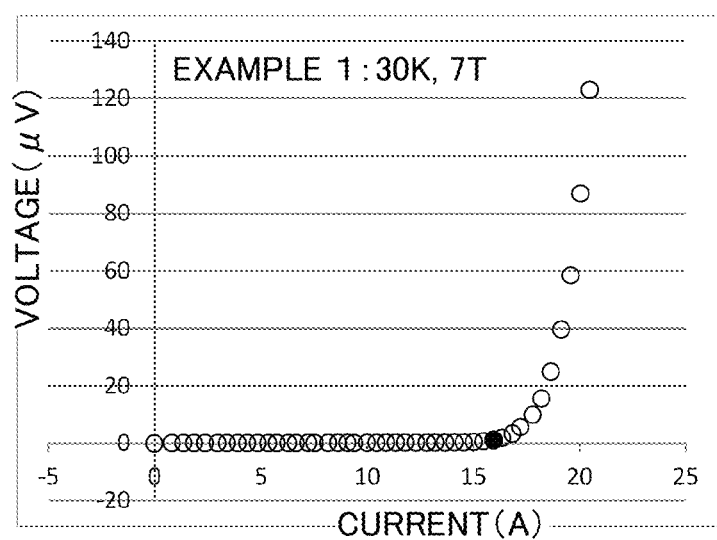
FIGS. 33A, 33B, and 33C are graphs illustrating a current voltage characteristic in Example 1.
Figure 33B:
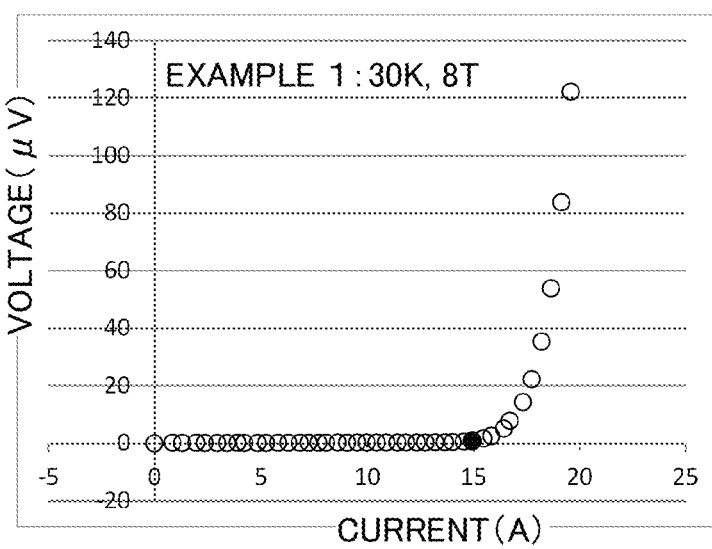
Figure 33C:
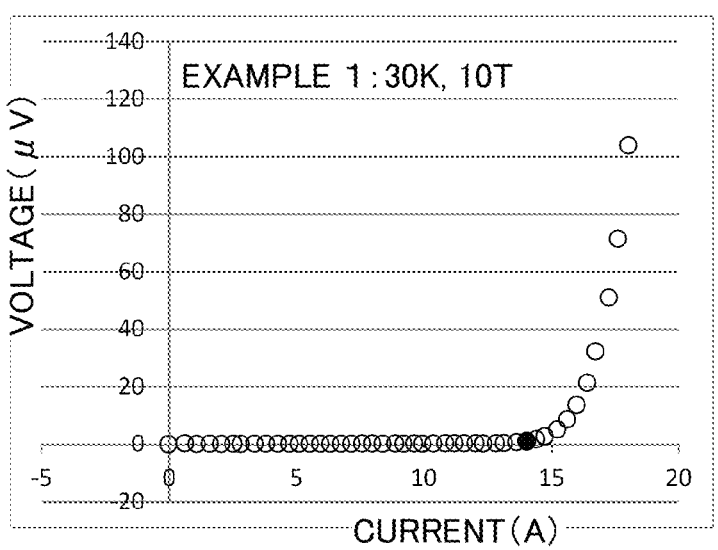
Figure 34A:
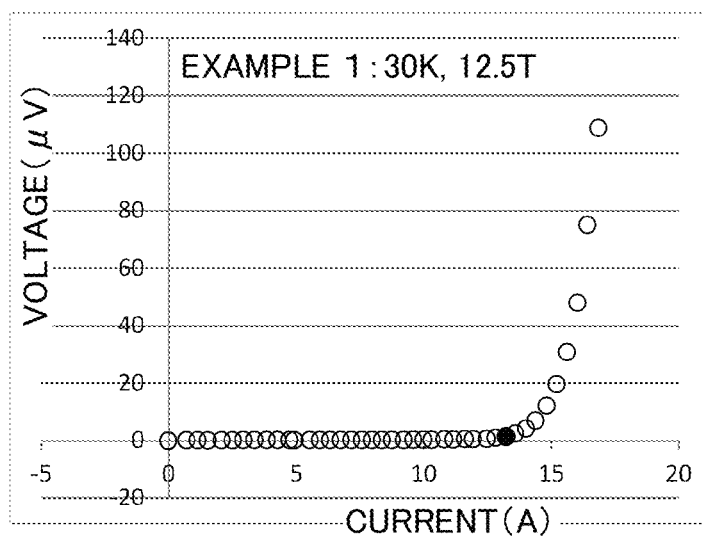
FIGS. 34A and 34B are graphs illustrating a current voltage characteristic in Example 1.
Figure 34B:
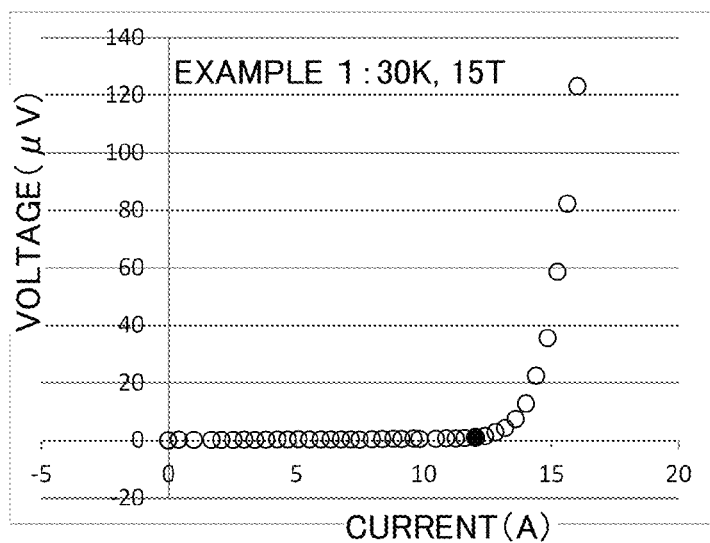
Figure 35A:
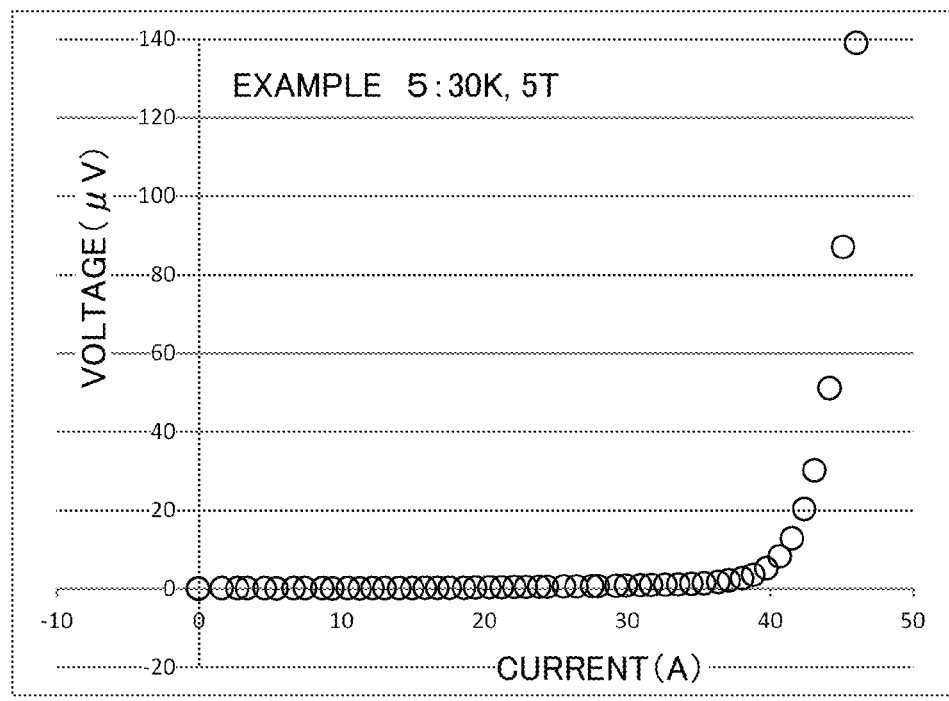
FIGS. 35A and 35B are graphs illustrating a current voltage characteristic in Example 5.
Figure 35B:
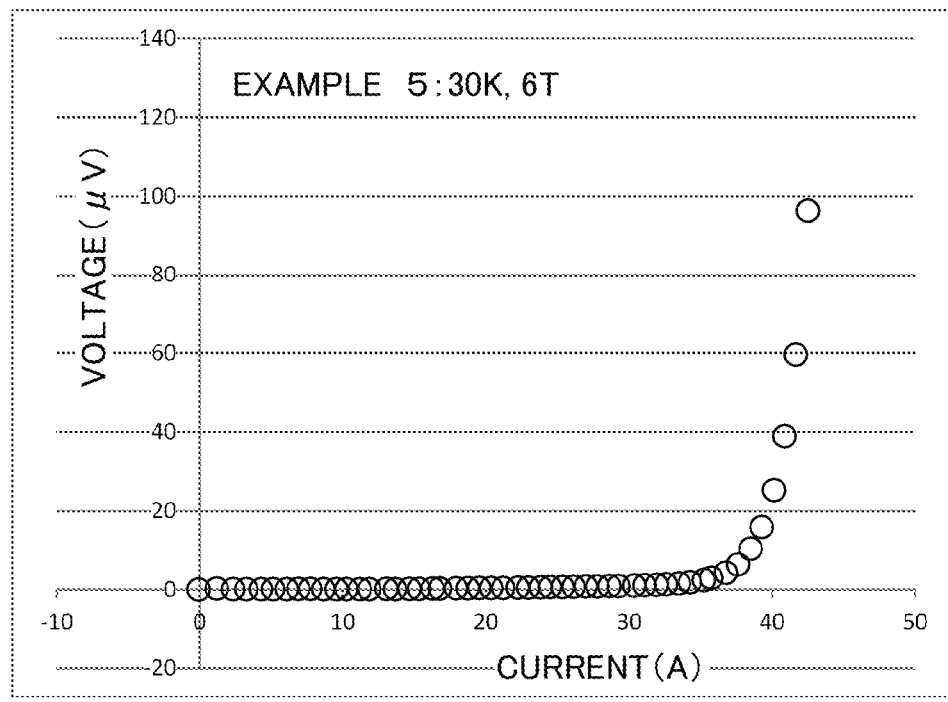
Figure 36A:
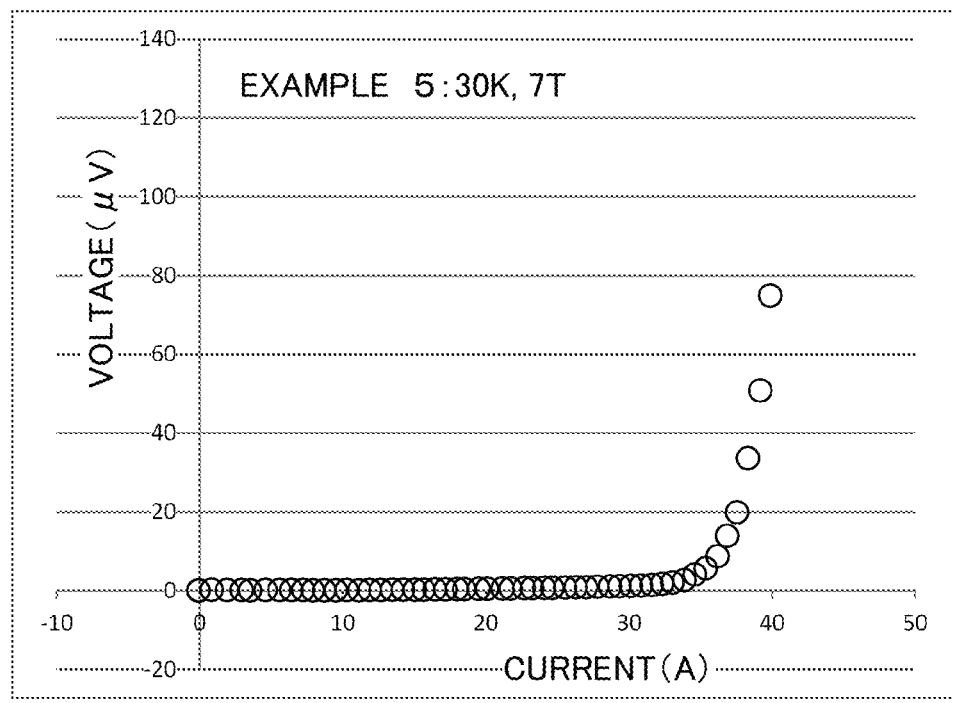
FIGS. 36A and 36B are graphs illustrating a current voltage characteristic in Example 5.
Figure 36B:
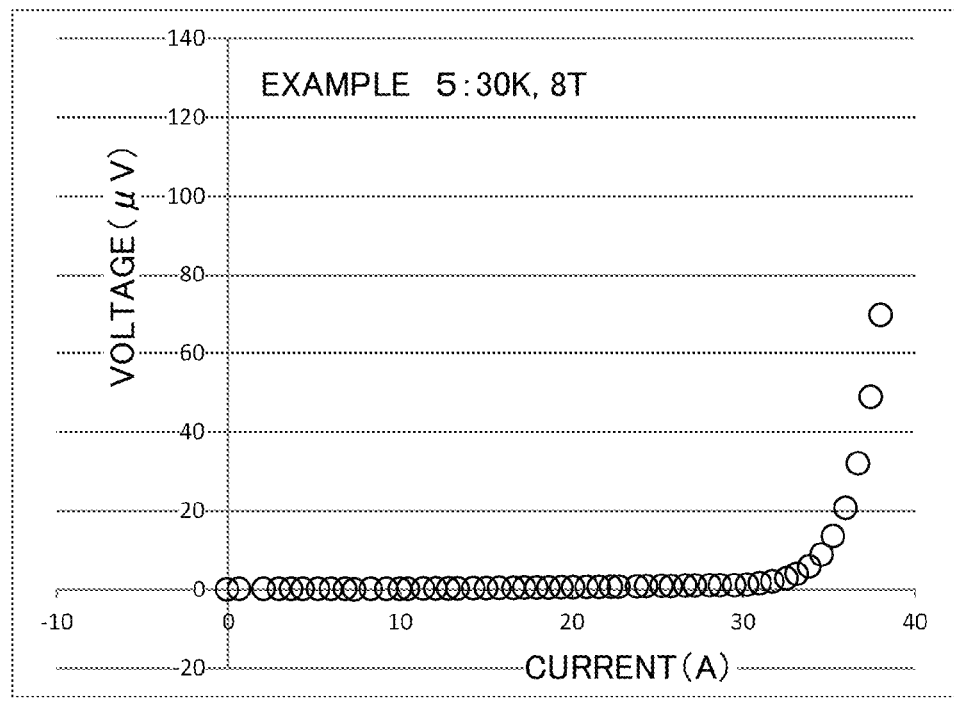
Figure 37A:
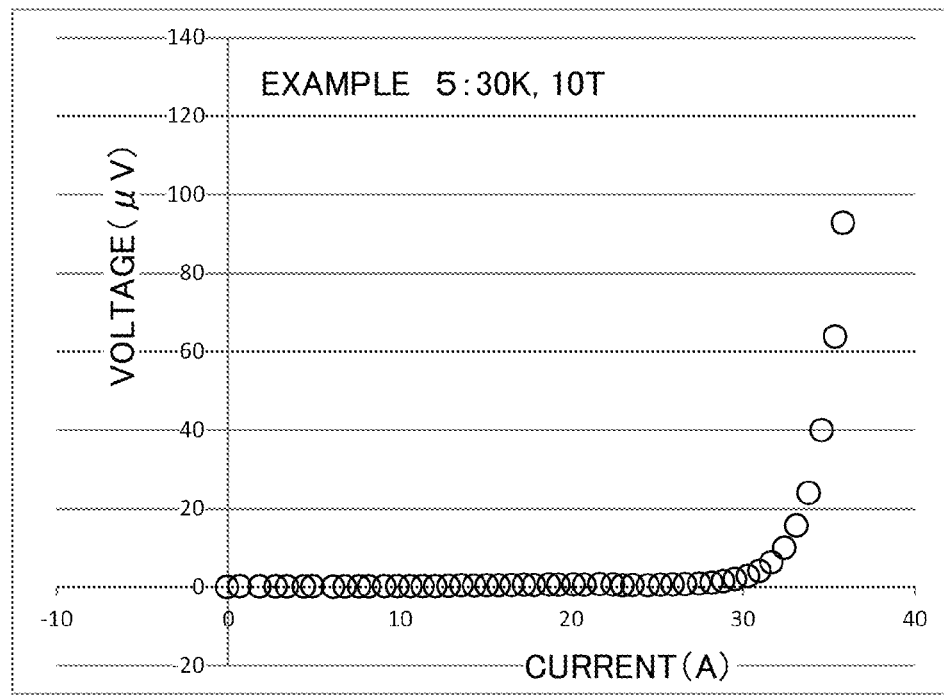
FIGS. 37A and 37B are graphs illustrating a current voltage characteristic in Example 5.
Figure 37B:
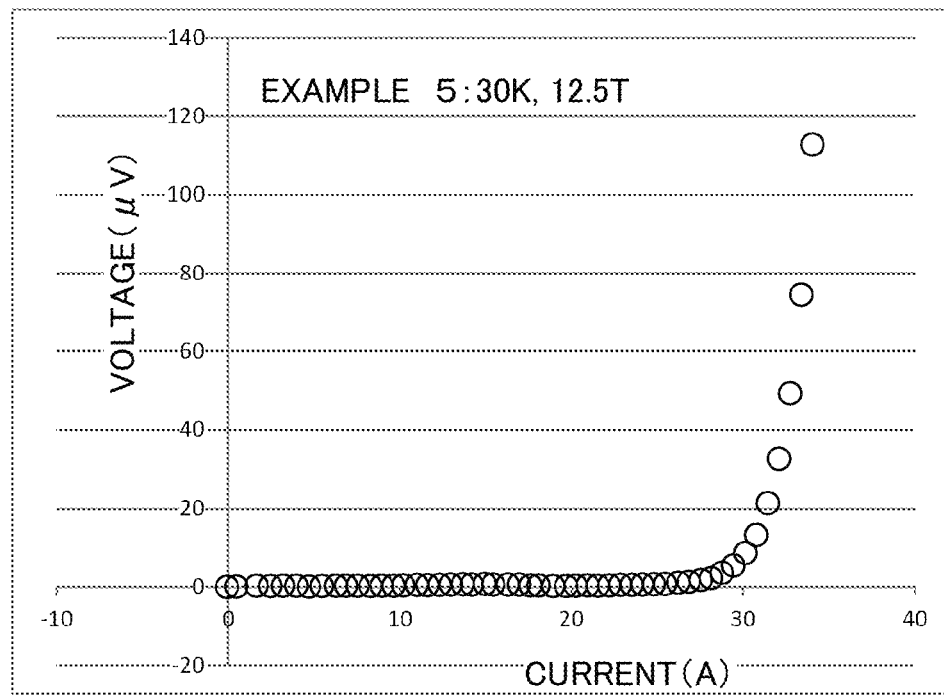
Figure 38A:
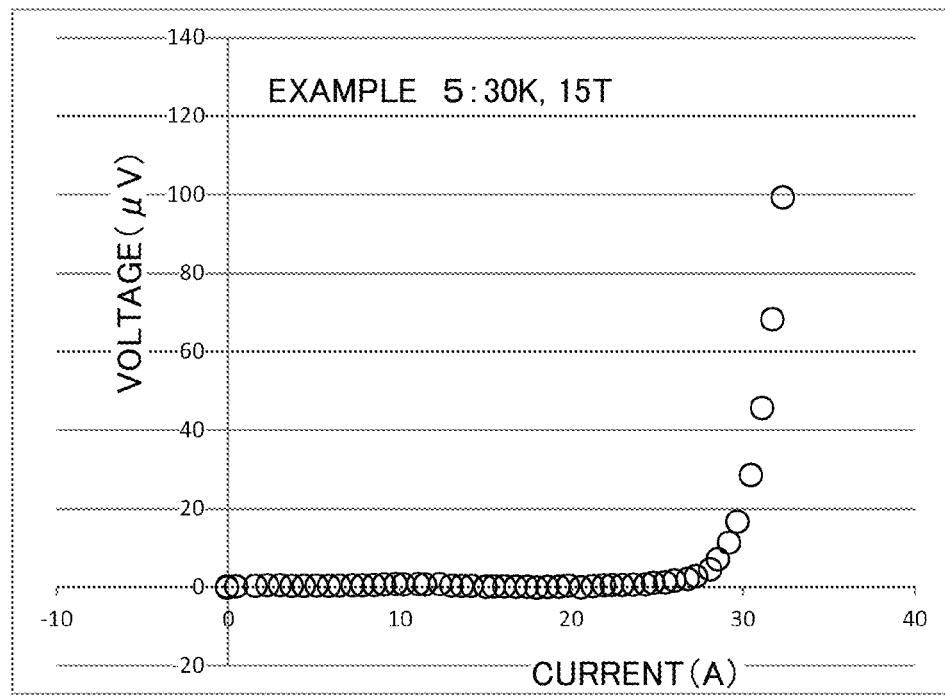
FIGS. 38A and 38B are graphs illustrating a current voltage characteristic in Example 5.
Figure 38B:
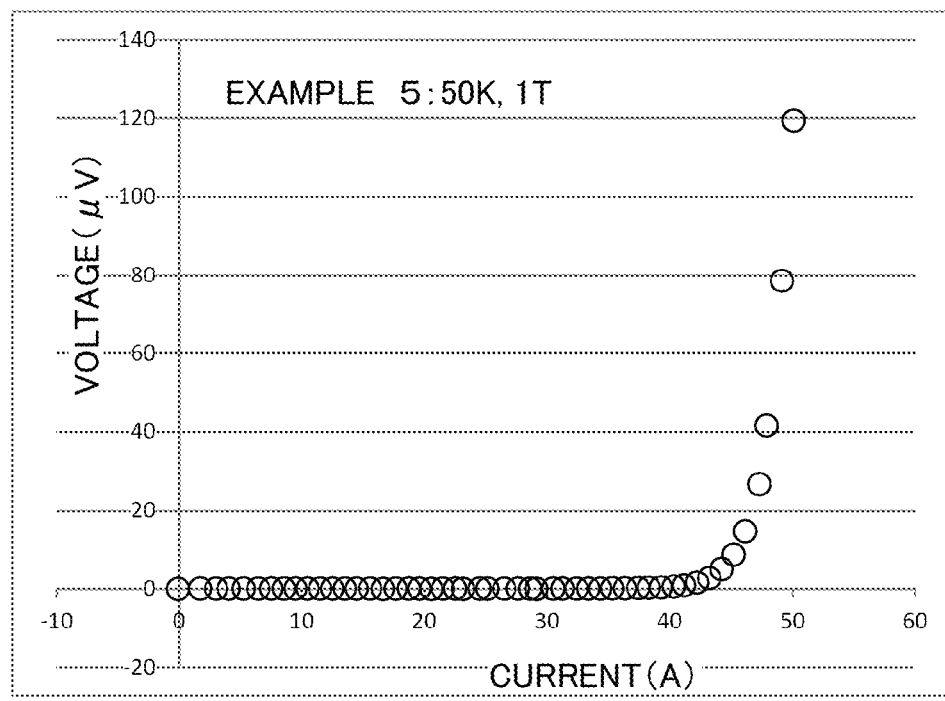
Figure 39A:
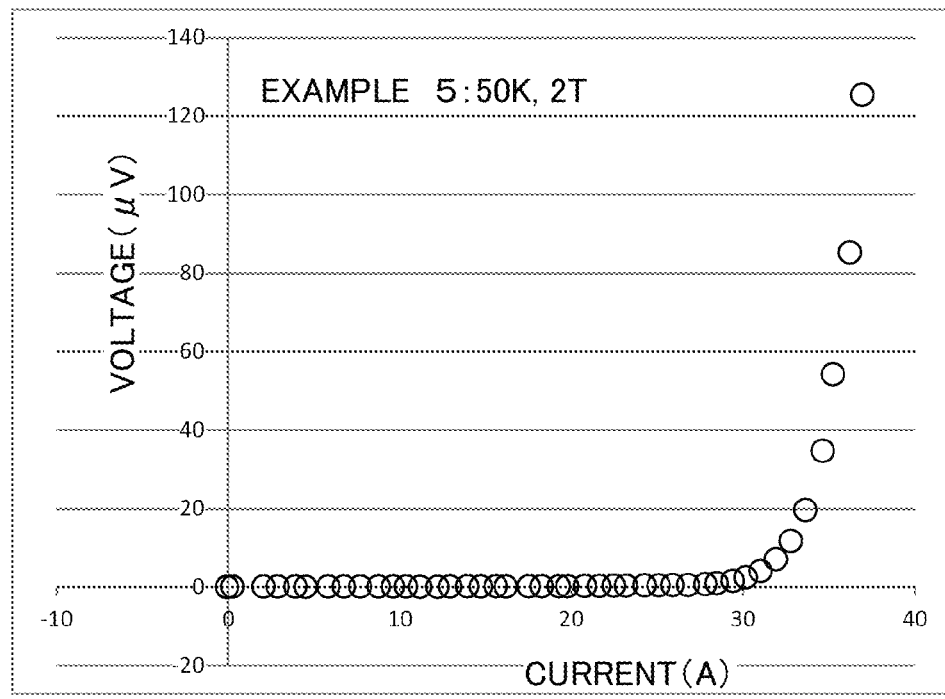
FIGS. 39A and 39B are graphs illustrating a current voltage characteristic in Example 5.
Figure 39B:
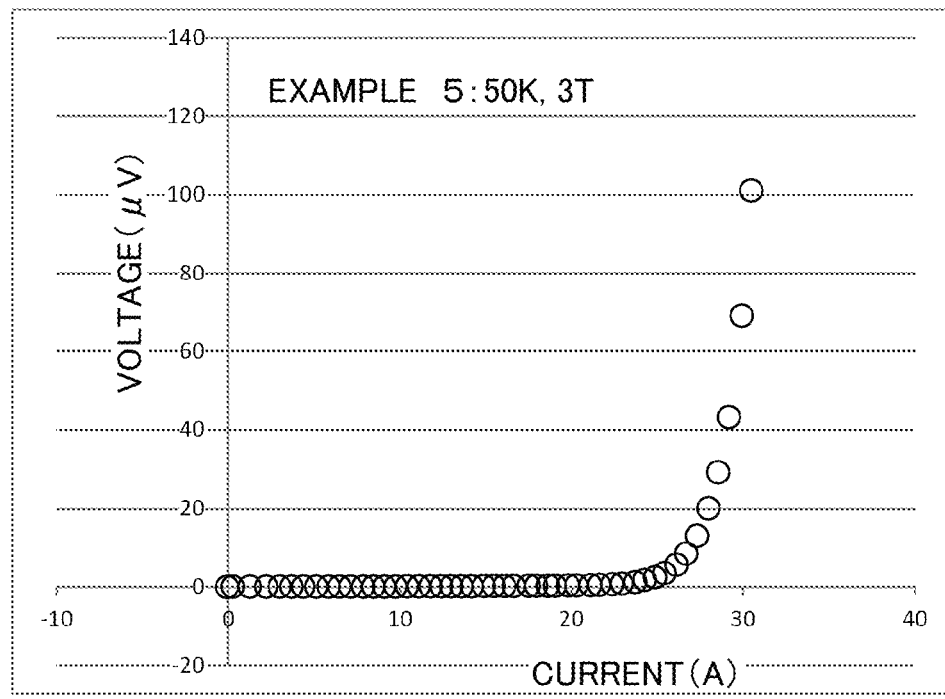
Figure 40A:
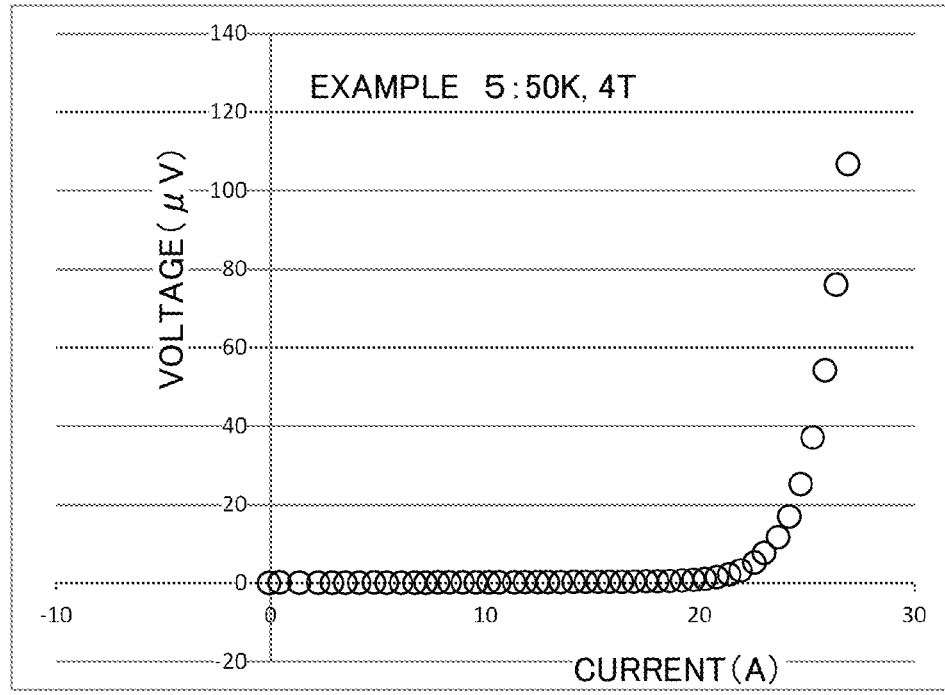
FIGS. 40A and 40B are graphs illustrating a current voltage characteristic in Example 5.
Figure 40B:
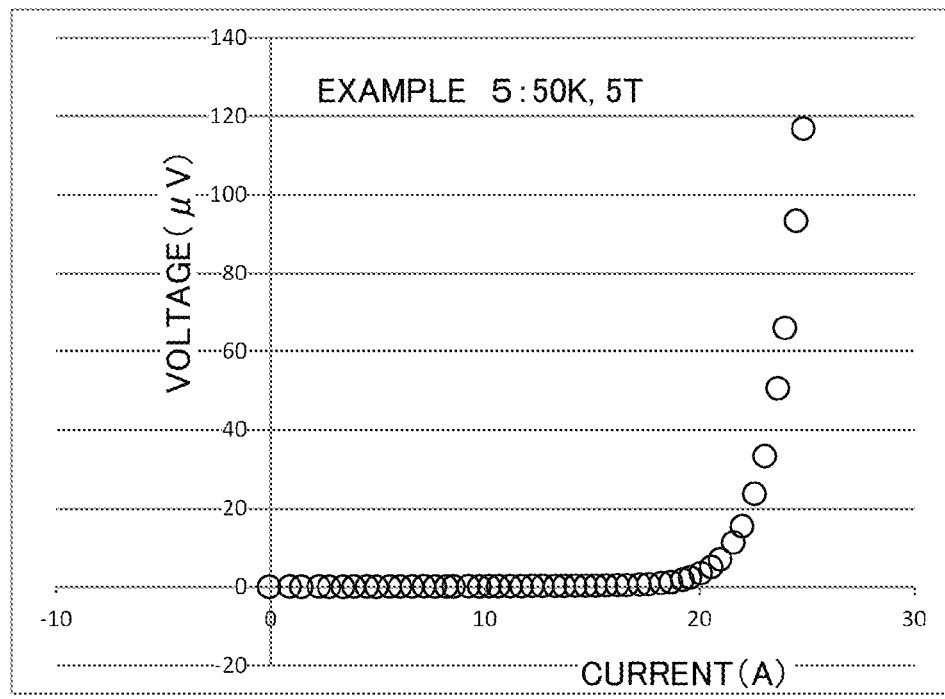

FIG. 18 is a block diagram of the superconducting device of the present embodiment. The superconducting device of the present embodiment is a heavy particle radiotherapeutic device 200.

The heavy particle radiotherapeutic device 200 includes an incidence system 50, a synchrotron accelerator 52, a beam transport system 54, an irradiation system 56, and a control system 58.

For example, the incidence system 50 generates a carbon ion used for a therapy, and performs preliminary acceleration for incidence on the synchrotron accelerator 52. For example, the incidence system 50 includes an ion generation source and a linear accelerator.

The synchrotron accelerator 52 accelerates a carbon ion beam incident from the incidence system 50 to an energy suitable for a therapy. The superconducting coil 100 of the first or second embodiment is used for the synchrotron accelerator 52.

The beam transport system 54 transports the carbon ion beam incident from the synchrotron accelerator 52 to the irradiation system 56. For example, the beam transport system 54 includes a deflection electromagnet.

The irradiation system 56 irradiates a patient as an irradiation target with the carbon ion beam incident from the beam transport system 54. For example, the irradiation system 56 includes a rotary gantry capable of irradiating a patient with the carbon ion beam from any direction. The superconducting coil 100 of the first or second embodiment is used for the rotary gantry.

The control system 58 controls the incidence system 50, the synchrotron accelerator 52, the beam transport system 54, and the irradiation system 56. For example, the control system 58 is a computer.

In the heavy particle radiotherapeutic device 200 of the present embodiment, the superconducting coil 100 of the first or second embodiment is used for the synchrotron accelerator 52 and the rotary gantry. Therefore, a quenching burning accident is suppressed, and a high reliability is realized. In addition, the superconducting coil 100 may generate a stable magnetic field, and therefore can irradiate an affected part with an ion beam with a high accuracy.

Hereinafter, Examples are described.

EXAMPLES

In the following Examples, a solution or a superconductor having a Perovskite structure is formed by mixing many metal acetates. In a Y-based superconductor having a Perovskite structure, Y or an element in a lanthanoid group is present in a Y site (rare earth site), and Ba and Cu are present in the other sites. A ratio thereamong is 1:2:3. Therefore, by paying attention to a metal element used in the Y site, description is made as follows.

In the following Example, four kinds of elements (three kinds of elements in a part) are used as an element in the Y site. PA for generating an artificial pin and SA for assisting PA. MA for acting as a matrix phase. Finally, CA necessary for forming a cluster, having a small ionic radius. Only Pr can be used for PA. Nd, Sm, Eu, and Gd can be used for SA. Tb, Dy, Ho, and Y can be used for MA. Er, Tm, Yb, and Lu can be used for CA. As the third CARP, Gd can be used also as a part of MA.

In most Examples, PA=SA and PA+SA=CA are satisfied in terms of the number of moles (the number of atoms). The number obtained by subtracting PA+SA+CA from the total number is equal to MA. PA+SA+MA+CA=100% is satisfied. For example, it is assumed that there is a mixing ratio of 4%Pr(PA), 4%Sm(SA), 84%Y(MA), and 8%Lu(CA). Here, this is described as 4%Pr4%Sm—Y-8%Lu. However, when the number of large elements is the same as the number of small elements in a cluster portion, that is, when PA+SA=CA is satisfied, the content of CA is omitted, and this case is described as 4%Pr4%Sm—Y—Lu. In addition, when PA=SA is satisfied and the kind of SA is one, the content thereof is also omitted. That is, the above case is described as 4%PrSm—Y—Lu. This description indicates 4%Pr4%Sm-84%Y-8%Lu.

24B illustrate a measurement result at a temperature of 30 K. The black dot indicates a data point which is assumed to be a point of reaching an Ic value.

TABLE 2

| Magnetic field strength | T | | 1 | 2 | 3 | 4 | 5 | 6 | 7 | 8 | 10 | 12.5 | 15 |
|---|---|---|---|---|---|---|---|---|---|---|---|---|---|
| delta V BG | | µV | 0.200 | | | | | | | | | | |
| Comparative example 1 (50K) | V(IBC) | µV | 2.52 | 5.08 | 16.18 | 20.35 | 36.05 | 59.78 | 65.59 | 84.99 | 143.14 | 148.20 | 54.02 |
| | Ic | A | 200 | 170 | 140 | 120 | 100 | 87.6 | 79.3 | 74.7 | 65.3 | 48.1 | 35.5 |
| | If(IBC) | | 0.013 | 0.030 | 0.116 | 0.170 | 0.361 | 0.682 | 0.827 | 1.138 | 2.192 | 3.081 | 1.522 |
| Comparative example 1 (50K) | V(IBC) | µV | 0.22 | 0.09 | 0.13 | 0.10 | 0.14 | 0.36 | 0.40 | 0.43 | 0.34 | 0.43 | 2.62 |
| | Ic | A | 91.5 | 64.5 | 51.5 | 42 | 35.5 | 30 | 25.5 | 22.6 | 17.8 | 13.8 | 10 |
| | If(IBC) | | 0.002 | 0.001 | 0.003 | 0.002 | 0.004 | 0.012 | 0.016 | 0.019 | 0.019 | 0.031 | 0.262 |
| Comparative example 2 (30K) | V(IBC) | µV | | | | | 0.77 | 0.73 | 0.71 | 1.10 | 0.94 | 1.38 | 3.27 |
| | Ic | A | | | | | 70 | 62 | 55.5 | 49.5 | 42 | 35 | 29.5 |
| | If(IBC) | | | | | | 0.011 | 0.012 | 0.013 | 0.022 | 0.022 | 0.039 | 0.111 |
| Example 1 (50K) | V(IBC) | µV | 0.31 | 0.06 | 0.00 | 0.18 | 0.11 | 0.15 | 0.17 | 0.16 | 0.14 | 0.29 | 0.33 |
| | Ic | A | 24.2 | 17.2 | 14.16 | 12.385 | 11.2 | 10.4 | 9.71 | 9.24 | 8.5 | 7.65 | 6.95 |
| | If(IBC) | | 0.013 | 0.003 | 0.000 | 0.015 | 0.010 | 0.014 | 0.018 | 0.017 | 0.016 | 0.038 | 0.047 |
| Example 1 (30K) | V(IBC) | µV | | | | | 0.21 | 0.13 | 0.16 | 0.18 | 0.18 | 0.37 | 0.46 |
| | Ic | A | | | | | 18 | 16.8 | 15.95 | 14.9 | 14 | 13.2 | 12 |
| | If(IBC) | | | | | | 0.012 | 0.008 | 0.010 | 0.012 | 0.013 | 0.028 | 0.038 |
| Example 5 (50K) | V(IBC) | µV | 0.00 | 0.00 | 0.00 | 0.00 | 0.00 | | | | | | |
| | Ic | A | 23 | 16 | 13.2 | 11.3 | 10.2 | | | | | | |
| | If(IBC) | | 0.000 | 0.000 | 0.000 | 0.000 | 0.000 | | | | | | |
| Example 5 (30K) | V(IBC) | µV | | | | | | 0.06 | 0.06 | 0.10 | 0.15 | 0.22 | 0.39 | 0.74 |
| | Ic | A | | | | | | 20.6 | 19.2 | 18.3 | 17.6 | 16.1 | 14.8 | 13.8 |
| | If(IBC) | | | | | | | 0.003 | 0.003 | 0.005 | 0.009 | 0.014 | 0.026 | 0.054 |

An element is described in the order of a lanthanoid group element having a smaller atomic number, and is described in the order of PA, SA, MA, and CA. When Y is used for MA, Y is described in the end. PA+SA, MA, and CA are joined with a bar. That is, this is described as 4%Pr4%Sm—Y—Lu. There is also a case where no SA is contained. However, even when PA+SA=CA is satisfied in this case, the content of CA can be omitted. For example, a case of 4%Pr—Y-4%Lu is described as 4%Pr—Y—Lu.

Comparative Example 1

As Comparative Example 1, a superconducting wire containing a Dy$_2$O$_3$ artificial pin, manufactured by a TFA-MOD method was evaluated. The superconducting wire part has a width of 4 mm, and it is estimated that a film thickness is about 2 µm. The superconducting wire was cut into 3 cm, and a current terminal was attached to each of ends thereof. In addition, two voltage terminals were attached in the superconducting wire at an interval of 1 cm. A sample was placed in a device for freezer cooling, a current and a voltage thereof were measured (IV measurement) by applying a magnetic field, and V(IBC) and If(IBC) were determined by an IBC indirect measurement method.

Measurement was performed under a condition of a temperature of 50 K and a magnetic field of 1 T to 15 T or a condition of a temperature of 30 K and a magnetic field of 5 T to 15 T.

Table 2 indicates a measurement result of V(IBC) and If(IBC). A noise (delta VBG) of a background was determined to be 0.20 µV from the observation result.

FIGS. 19A, 19B, 19C, 20A, 20B, 20C, 21A, 21B, 21C, 22A, 22B, 23A, 23B, 23C, 24A, and 24B are graphs illustrating a current voltage characteristic in Comparative Example 1. FIGS. 19A, 19B, 19C, 20A, 20B, 20C, 21A, 21B, 21C, 22A, and 22B illustrate a measurement result at a temperature of 50 K, and FIGS. 23A, 23B, 23C, 24A, and As FIGS. 19A, 19B, 19C, 20A, 20B, 20C, 21A, 21B, 21C, 22A, and 22B illustrate, a stable result having low V(IBC) was obtained. However, Table 2 indicates that a numerical value of If(IBC) is increased, that is, is deteriorated along with increase in a magnetic field.

At 50 K/5 T, If(IBC)=0.004, which was extremely close to zero and was a stable result, was obtained. However, a numerical value of If(IBC) is increased along with increase in a magnetic field strength, and is 0.031 exceeding 0.020 which is a provisional boundary value at 12.5 T. In other words, a numerical value of If(IBC) is 0.019 or less at 10 T or less, and it is found that the numerical value is equal to or less than a boundary value.

A measurement result of If(IBC) at 30 K was almost the same as that at 50 K. At 15 T, slight improvement was observed, but a good result almost the same was obtained. It was also found that large improvement was not observed at 30 K.

It seems that the measurement result of a current voltage characteristic in FIGS. 21A, 21B, 21C, 22A, and 22B has a change because correction has not been performed with an Ic value. However, it has been found that there is not a large change when a value of If(IBC) is taken. It was considered that an influence of IBC would be observed more clearly at a higher temperature. However, a difference between 50 K and 30 K was not observed.

Comparative Example 2

As Comparative Example 2, a superconducting wire containing a BZO artificial pin, manufactured by a physical deposition method was evaluated in place of the superconducting wire containing the Dy$_2$O$_3$ artificial pin in Comparative Example 1. The superconducting wire part has a width of 4 mm, and it is estimated that a film thickness is about 1 µm. The superconducting wire was cut into 3 cm, and a current terminal was attached to each of ends thereof. In addition, two voltage terminals were attached in the superconducting wire at an interval of 1 cm. A sample was placed in a device for freezer cooling, IV measurement was performed by applying a magnetic field, and V(IBC) and If(IBC) were determined in a similar manner to Comparative Example 1.

Measurement was performed under a condition of a temperature of 50 K and a magnetic field of 1 T to 15 T.

Table 2 indicates a measurement result of V(IBC) and If(IBC). FIGS. 25A, 25B, 25C, 26A, 26B, 26C, 27A, 27B, 27C, 28A, and 28B are graphs illustrating a current voltage characteristic in Comparative Example 2. The black dot indicates a data point which is assumed to be a point of reaching an Ic value.

As clear from graphs in FIGS. 25A, 25B, 25C, 26A, 26B, 26C, 27A, 27B, 27C, 28A, and 28B, V(IBC) clearly indicating disturbance in voltage is observed at 2 T or higher at 50 K. If(IBC) in Table 2 has a value 0.013 at 1 T, which is the only value lower than 0.020 as a provisional boundary value, and has a largely deteriorated value at 2 T or higher. At 50 K/5 T, If(IBC) is 0.361, as large as about 100 times the value in Comparative Example 1, close to a noise of a background.

In the superconducting wire in Comparative Example 2, If(IBC) is increased continuously along with increase in a magnetic field strength, and reaches 3.08 at 12.5 T. This measurement result indirectly indicates that a coil may cause a quenching burning accident due to an influence of IBC.

It is not considered that even the superconducting wire in Comparative Example 2 improves If(IBC) dramatically at least at 30 K, and there is a high possibility that If(IBC) is much larger than 0.020 even at 30 K. It is estimated that this leads to a quenching burning accident.

Considering that the superconducting wire in Comparative Example 1 has succeeded in a current limiter, by manufacturing a superconducting wire satisfying If(IBC) ≤0.020, an influence of IBC can be suppressed, and the superconducting wire may succeed as a product. In other words, this means that a superconductor having Tc=90.7 K is manufactured and an artificial pin is formed therein while the Tc is maintained.

Even when a material suppressing an influence of IBC is developed, it seems that it will take four to five years before the material is formed into a long wire material, and is actually formed into a coil, and a current close to an Ic value flows therein in actual measurement. However, as long as the material has a numerical value of If(IBC) at an almost equal level to the superconducting wire in Comparative Example 1 and acts as an artificial pin, it is considered that a stable system can be formed while a quenching burning accident of a coil is prevented.

Example 1

First, two kinds of coating solutions for a superconductor were synthesized and purified according to the flowchart illustrated in FIG. 6. Powdery hydrates of $Pr(OCOCH_3)_3$, $Sm(OCOCH_3)_3$, $Y(OCOCH_3)_3$, $Lu(OCOCH_3)_3$, $Ba(OCOCH_3)_2$, and $Cu(OCOCH_3)_2$ as metal acetates were dissolved in ion exchange water at a metal ion molar ratio of 0.01:0.01:0.96:0.02:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 1Mi-1%PrSm—Y—Lu (substance described in Example 1, Y-based material with impurity) was obtained.

Similarly, powdery hydrates of $Pr(OCOCH_3)_3$, $Sm(OCOCH_3)_3$, $Y(OCOCH_3)_3$, $Lu(OCOCH_3)_3$, $Ba(OCOCH_3)_2$, and $Cu(OCOCH_3)_2$ as metal acetates were dissolved in ion exchange water at a metal ion molar ratio of 0.02:0.02:0.92:0.04:2:3 or 0.04:0.04:0.84:0.08:2:3, were mixed with $CF_3COOH$ in an equal reaction molar amount, and were stirred. Each of the resulting mixed solutions was put in an eggplant-shaped flask, and was subjected to a reaction and purification in a rotary evaporator under reduced pressure for 12 hours. Semitransparent blue substances 1Mi-2%PrSm—Y—Lu and 1Mi-4%PrSm—Y—Lu were obtained.

Each of the obtained semitransparent blue substances 1Mi-1%PrSm—Y—Lu, 1Mi-2%PrSm—Y—Lu, and 1Mi-4%PrSm—Y—Lu contained water or acetic acid as a byproduct of a reaction at the time of synthesis of a solution in an amount of about 7 wt %.

The obtained semitransparent blue substances 1Mi-1%PrSm—Y—Lu, 1Mi-2%PrSm—Y—Lu, and 1Mi-4%PrSm—Y—Lu were each completely dissolved in methanol having a weight about 100 times each of the substances (f in FIG. 6), and the solutions were subjected to a reaction and purification again in a rotary evaporator under reduced pressure for 12 hours to obtain semitransparent blue substances 1M-1%PrSm—Y—Lu (substance described in Example 1, Y-based material without impurity), 1M-2%PrSm—Y—Lu, and 1M-4%PrSm—Y—Lu, respectively.

The semitransparent blue substances 1M-1%PrSm—Y—Lu, 1M-2%PrSm—Y—Lu, and 1M-4%PrSm—Y—Lu were each dissolved in methanol (j in FIG. 6), and were diluted using a measuring flask to obtain 1.50 mol/l coating solutions 1Cs-1%PrSm—Y—Lu (Example 1, coating solution for Y-based superconductor) and 1Cs-4%PrSm—Y—Lu in terms of a metal ion, respectively. A film was formed by using the coating solutions 1Cs-1%PrSm—Y—Lu, 1Cs-2%PrSm—Y—Lu, and 1Cs-4%PrSm—Y—Lu by a spin coating method at a maximum rotation number of 2000 rpm.

Subsequently, calcining was performed in an atmosphere of pure oxygen at 400° C. or lower according to the profile illustrated in FIG. 8. Subsequently, firing was performed in a 1000 ppm oxygen-mixed argon gas at 800° C. according to the profile illustrated in FIG. 9, and annealing was performed in pure oxygen at 525° C. or lower. The superconducting films 1FS-1%PrSm—Y—Lu (Example 1, Y-based film of superconductor), 1FS-2%PrSm—Y—Lu, and 1FS-4%PrSm—Y—Lu were obtained.

FIGS. 4 and 5 illustrate a result of measurement for the superconducting films 1FS-1%PrSm—Y—Lu and 1FS-4%PrSm—Y—Lu by a 2θ/ω method in XRD measurement. From FIGS. 4 and 5, it was confirmed that only one peak was obtained at almost the same position as a YBCO(00n) peak. In addition, a satisfactory peak intensity was confirmed. This is one of evidences indicating that an added rare earth element forms a continuous Perovskite structure without being separated.

Next, FIG. 3 illustrates a high magnification TEM observation result of the superconducting film 1FS-2%PrSm—Y—Lu. As FIG. 3 illustrates, a structure in which a continuous Perovskite structure is maintained in the entire structure is illustrated. A lattice constant thereof is almost the same as that of YBCO. Therefore, this is a result capable of confirming that Pr, Sm, and Lu are incorporated into a rare earth site to form a continuous Perovskite structure.

FIG. 3 illustrates a HAADF-STEM image, and an element having a large atomic weight emits light brightly. In the regular patterns in three rows in a horizontal direction, brighter two rows indicate Ba, and the other one row indicates a rare earth. In the solid line frame, the central portion is bright compared with bright Ba at both ends. In the broken line frame, the central portion is dark. This indicates that a cluster obtained by assembling Pr, Sm, and Lu is formed in the solid line frame.

The superconducting films 1FS-1%PrSm—Y—Lu and 1FS-4%PrSm—Y—Lu were each disposed in liquid nitrogen, and a superconducting characteristic thereof was measured under a self-magnetic field by an induction method. Jc values thereof were 6.3 and 6.2 $MA/cm^2$ (77 K, 0 T), respectively. These Jc values are relatively satisfactory. A 5 times degradation phenomenon caused by ultimate dispersion of PrBCO should have been confirmed if the Jc value of the above latter sample 1FS-4%PrSm—Y—Lu was reduced by 20%, but was not confirmed. It is considered that this indicates a result that atom-replaced artificial pins are clustered, assembled, and accumulated in some places.

FIG. 11 illustrates a result of measuring a Jc value of each of the superconducting films 1FS-1%PrSm—Y—Lu, 1FS-2%PrSm—Y—Lu, and 1FS-4%PrSm—Y—Lu in a magnetic field of 1 to 5 T at 77 K. The horizontal axis of FIG. 11 indicates a magnetic field using T as a unit, and the vertical axis thereof indicates a Jc value and is a logarithmic axis.

Any one of these samples has a Jc value equal to or lower than that of YBCO at 1 T. However, it is found that the samples have Jc values almost equal to that of YBCO at 3 T and have better Jc values at 5 T. This indicates that a magnetic field characteristic has been improved in CARP.

In order to examine an influence of IBC for FS-4%PrSm—Y—Lu, Jc-B-T measurement was performed at 1 to 15 T at 50 K and at 5 to 15 T at 30 K. Table 2 and FIGS. 29A, 29B, 29C, 30A, 30B, 30C, 31A, 31B, 31C, 32A, 32B, 33A, 33B, 33C, 34A, and 34B illustrate a result thereof. In FIGS. 29A, 29B, 29C, 30A, 30B, 30C, 31A, 31B, 31C, 32A, 32B, 33A, 33B, 33C, 34A, and 34B, the black dot indicates a data point which is assumed to be a point of reaching an Ic value.

FIGS. 29A, 29B, 29C, 30A, 30B, 30C, 31A, 31B, 31C, 32A, and 32B indicate a result obtained by examining V(IBC) at 50 K. A fluctuation of a voltage is hardly confirmed at 15 T or less. A sample has a thickness of only 220 nm. Therefore, in order to correct an influence thereof, If(IBC) was examined and summarized, and Table 2 indicates a result thereof. Table 2 indicates that If(IBC)≤0.020 is satisfied at 10 T or less at 50 K. This is almost the same result as the superconducting wire in Comparative Example 1.

It is considered that a reason why almost the same result as the superconducting wire in Comparative Example 1 was obtained is that an influence of IBC was small because a YBCO superconductor as MA maintained Tc=90.7 K. Furthermore, the superconductor in Example also indicates a result of improvement of a magnetic field characteristic in Jc-B measurement indicating an effect of an artificial pin. This experimental result indicates that a magnetic field characteristic could be improved while an influence of IBC was avoided.

FIGS. 33A, 33B, 33C, 34A, and 34B indicate a result obtained by examining V(IBC) at 30 K. FIGS. 33A, 33B, 33C, 34A, and 34B indicate a stable result having a small fluctuation of a voltage. By comparing If(IBC) values obtained by correcting an influence of a current value, it has been found that If(IBC)≤0.020 is satisfied at 10 T or less at 30 K from Table 2. It is considered that a reason why the sample is stable like the superconducting wire in Comparative Example 1 is that the sample has a similar structure to Comparative Example 1 and has a Tc value of 90.7 K.

CARP has a structure which is considered to have an influence of IBC equal to or lower than a $Dy_2O_3$ artificial pin. In addition, the $Dy_2O_3$ artificial pin does not have an effect for improving a magnetic field characteristic, but CARP has an effect for improving a magnetic field characteristic. By forming a superconducting wire containing CARP into a coil and mounting the coil in a superconducting device, a stable operation can be expected, and it is considered that a possibility of a quenching burning accident can be reduced largely.

In a Y-based superconducting wire, CARP has not been realized so far. This is because a firing condition is quite different between PrBCO and YBCO. Optimal oxygen partial pressures thereof are 1 ppm and 1000 ppm, respectively, which are conditions under which one of PrBCO and YBCO is surely decomposed in a physical deposition method. In addition, in formation of a superconductor in a bulk body, it is difficult to realize a structure of CARP by sharing the same Perovskite structure. This is because a condition for forming a film of one of PrBCO and YBCO is a condition for decomposing the other.

It is not easy to form a structure of CARP by a TFA-MOD method, either. This is because only a small amount of impurities in a solution decompose one substance when a film is formed under a film-formation condition of the other substance during firing. In addition, a clustering phenomenon is desirably used in order to adjust the size of an artificial pin. There is no example in which PrBCO, LuBCO, or the like is mixed with YBCO intentionally or SmBCO is mixed therewith as a support element. It is considered that CARP having a magnetic field characteristic has been introduced for the first time in a TFA-MOD method having mass productivity and an achievement result, and that a superconductor having low If(IBC) and a low possibility of a quenching burning accident has been formed.

Example 2

First, two kinds of coating solutions for a superconductor were synthesized and purified according to the flowchart illustrated in FIG. 6. Powdery hydrates of $Pr(OCOCH_3)_3$, $Sm(OCOCH_3)_3$, $Y(OCOCH_3)_3$, $Tm(OCOCH_3)_3$, $Ba(OCOCH_3)_2$, and $Cu(OCOCH_3)_2$ as metal acetates were dissolved in ion exchange water at a metal ion molar ratio of 0.01:0.01:0.96:0.02:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 2Mi-1%PrSm—Y—Tm (substance described in Example 2, Y-based material with impurity) was obtained.

Similarly, powdery hydrates of $Pr(OCOCH_3)_3$, $Sm(OCOCH_3)_3$, $Y(OCOCH_3)_3$, $Yb(OCOCH_3)_2$, $Ba(OCOCH_3)_2$, and $Cu(OCOCH_3)_2$ as metal acetates were dissolved in ion exchange water at a metal ion molar ratio of 0.01:0.01:0.84:0.02:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 2Mi-1%PrSm—Y—Yb was obtained.

Each of the obtained semitransparent blue substances 2Mi-1%PrSm—Y—Tm and 2Mi-1%PrSm—Y—Yb contained water or acetic acid as a byproduct of a reaction at the time of synthesis of a solution in an amount of about 7 wt %.

The obtained semitransparent blue substances 2Mi-1%PrSm—Y—Tm and 2Mi-1%PrSm—Y—Yb were each completely dissolved in methanol having a weight about 100 times each of the substances (f in FIG. 6), and the solutions were subjected to a reaction and purification again in a rotary evaporator under reduced pressure for 12 hours to obtain semitransparent blue substances 2M-1%PrSm—Y—Tm (substance described in Example 2, Y-based material without impurity) and 2M-1%PrSm—Y—Yb, respectively.

The semitransparent blue substances 2M-1%PrSm—Y—Tm and 2M-1%PrSm—Y—Yb were dissolved in methanol (j in FIG. 6), and were diluted using a measuring flask to obtain 1.50 mol/l coating solutions 2Cs-1%PrSm—Y—Tm (Example 2, coating solution for Y-based superconductor) and 2Cs-1%PrSm—Y—Yb in terms of a metal ion, respectively. A film was formed by using the coating solutions 2Cs-1%PrSm—Y—Tm and 2Cs-1%PrSm—Y—Yb by a spin coating method at a maximum rotation number of 2000 rpm.

Subsequently, calcining was performed in an atmosphere of pure oxygen at 400° C. or lower according to the profile illustrated in FIG. 8. Firing was performed in a 1000 ppm oxygen-mixed argon gas at 800° C. according to the profile illustrated in FIG. 9, and annealing was performed in pure oxygen at 525° C. or lower. The superconducting films 2FS-1%PrSm—Y—Tm (Example 2, Y-based film of superconductor) and 2FS-1%PrSm—Y—Yb were obtained.

Measurement was performed for the superconducting films 2FS-1%PrSm—Y—Tm and 2FS-1%PrSm—Y—Yb by a 2θ/ω method in XRD measurement, and it was confirmed that only one peak was obtained at almost the same position as a YBCO(00n) peak. In addition, a satisfactory peak intensity was confirmed. It is considered that that an added rare earth element forms a continuous Perovskite structure without being separated.

The superconducting films 2FS-1%PrSm—Y—Tm and 2FS-1%PrSm—Y—Yb were each disposed in liquid nitrogen, and a superconducting characteristic thereof was measured under a self-magnetic field by an induction method. Jc values thereof were 6.1 and 6.0 MA/cm$^2$ (77 K, 0 T), respectively. It is considered that these Jc values are relatively satisfactory. A 5 times degradation phenomenon caused by ultimate dispersion of PrBCO is not easily confirmed because of corresponding to 5% degradation in the above samples. However, it is considered that clustering has occurred in view of a magnetic field characteristic described below.

A Jc value of each of the superconducting films 2FS-1%PrSm—Y—Tm and 2FS-1%PrSm—Y—Yb was measured in a magnetic field of 1 to 5 T at 60 K, and improvement of a Jc value could be confirmed at 60 K.

In order to examine an influence of IBC for the superconducting film 2FS-1%PrSm—Y—Tm, Jc-B-T measurement was performed at 1 to 15 T at 50 K and at 5 to 15 T at 30 K. The superconducting film 2FS-1%PrSm—Y—Tm obtained a result satisfying If(IBC)≤0.20 at 7 T or less at each of 50 K and 30 K. The superconducting film 2FS-1%PrSm—Y—Yb obtained a result satisfying If(IBC)≤0.20 at 8 T or less.

A region of an effective magnetic field strength was slightly different from a case where CA was Lu, but an effect for improving a magnetic field characteristic as an artificial pin could be confirmed while an influence of IBC was avoided. Particularly, an experimental result indicates that use of Tm or Yb for Lu increases a nucleation frequency and that an effect for improving a magnetic field characteristic is exhibited at a lower temperature.

In addition, an influence of IBC is small. Therefore, it is considered that by incorporation of these superconducting wires into a system as a coil, a stable superconduction application system hardly causing a quenching burning accident can be formed. It seems that a coil having a small influence of IBC also has excellent stability of a magnetic field, and the coil is advantageous also for application to a system requiring a high magnetic field accuracy.

It has been found that an effect of CARP is maintained even when Tm or Yb is used for a CA site in place of Lu, and that a coil hardly causing a quenching burning accident will be formed.

Example 3

First, a coating solution for a superconductor was synthesized and purified according to the flowchart illustrated in FIG. 6. Powdery hydrates of Pr(OCOCH$_3$)$_3$, Gd(OCOCH$_3$)$_3$, Y(OCOCH$_3$)$_3$, Tm(OCOCH$_3$)$_3$, Ba(OCOCH$_3$)$_2$, and Cu(OCOCH$_3$)$_2$ as metal acetates were dissolved in ion exchange water at a metal ion molar ratio of 0.02:0.48:0.48:0.02:2:3, were mixed with CF$_3$COOH in an equal reaction molar amount, and were stirred. The resulting mixed solution was put in an eggplant-shaped flask, and was subjected to a reaction and purification in a rotary evaporator under reduced pressure for 12 hours. A semitransparent blue substance 3Mi-2%Pr—GdY—Tm (substance described in Example 3, Y-based material with impurity) was obtained.

The obtained semitransparent blue substance 3Mi-2%Pr—GdY—Tm contained water or acetic acid as a byproduct of a reaction at the time of synthesis of a solution in an amount of about 7 wt %.

The obtained semitransparent blue substance 3Mi-2%Pr—GdY—Tm was completely dissolved in methanol having a weight about 100 times the substance (f in FIG. 6), and the solution was subjected to a reaction and purification again in a rotary evaporator under reduced pressure for 12 hours to obtain a semitransparent blue substance 3M-2%Pr—GdY—Tm (substance described in Example 3, Y-based material without impurity).

The semitransparent blue substance 3M-2%Pr—GdY—Tm was dissolved in methanol (j in FIG. 6), and was diluted using a measuring flask to obtain a 1.50 mol/l coating solution 3Cs-2%Pr—GdY—Tm (Example 3, coating solution for Y-based superconductor) in terms of a metal ion. A film was formed by using the coating solution 3Cs-2%Pr—GdY—Tm by a spin coating method at a maximum rotation number of 2000 rpm.

Subsequently, calcining was performed in an atmosphere of pure oxygen at 400° C. or lower according to the profile illustrated in FIG. 8. Subsequently, firing was performed in a 1000 ppm oxygen-mixed argon gas at 800° C. according to the profile illustrated in FIG. 9, and annealing was performed in pure oxygen at 525° C. or lower. The superconducting film 3FS-2%Pr—GdY—Tm (Example 3, Y-based film of superconductor) was obtained.

Measurement was performed for the superconducting film 3FS-2%Pr—GdY—Tm by a 2θ/ω method in XRD measurement, and it was confirmed that only one peak was obtained in a lower angle side of a YBCO(00n) peak. In addition, a satisfactory peak intensity was confirmed. It is considered that that an added rare earth element forms a continuous Perovskite structure without being separated.

The superconducting film 3FS-2%Pr—GdY—Tm was disposed in liquid nitrogen, and a superconducting characteristic thereof was measured under a self-magnetic field by an induction method. A Jc value thereof was 5.7 MA/cm$^2$ (77 K, 0 T). This Jc value is relatively satisfactory. A 5 times degradation phenomenon caused by ultimate dispersion of PrBCO corresponds to 10% degradation in the above samples. However, Jc degradation at such a level has not been observed. It is considered that CARP has been formed.

A Jc value of the superconducting film 3FS-2%Pr—GdY—Tm was measured in a magnetic field of 1 or 5 T at 77 K, and an improvement effect that a Jc value became 1.3 times at 77 K could be confirmed.

In order to examine an influence of IBC for the superconducting film 3FS-2%Pr—GdY—Tm, Jc-B-T measurement was performed at 1 to 15 T at 50 K and at 5 to 15 T at 30 K. The superconducting film 3FS-2%Pr—GdY—Tm obtained a result satisfying If(IBC)≤0.020 at 6 T or less at 50 K and at 7 T or less at 30 K.

The present Example is an artificial pin in which MA is formed of Gd and Y, called the third CARP described in the second embodiment. A force of an artificial pin at such a level as expected has not been obtained. Therefore, conditions may be insufficient, but it is considered that a superconductor hardly causing a quenching burning accident has been formed. It is considered that by incorporating this superconductor into a coil and incorporating the coil into a superconducting device, a superconduction application device system hardly causing a quenching burning accident and having less disturbance in a magnetic field can be built.

Example 4

First, a coating solution for a superconductor was synthesized and purified according to the flowchart illustrated in FIG. 6. Powdery hydrates of Pr(OCOCH$_3$)$_3$, Sm(OCOCH$_3$)$_3$, Y(OCOCH$_3$)$_3$, Yb(OCOCH$_3$)$_3$, Ba(OCOCH$_3$)$_2$, and Cu(OCOCH$_3$)$_2$ as metal acetates were dissolved in ion exchange water at a metal ion molar ratio of 0.10:0.10:0.60:0.20:2:3, were mixed with CF$_3$COOH in an equal reaction molar amount, and were stirred. The resulting mixed solution was put in an eggplant-shaped flask, and was subjected to a reaction and purification in a rotary evaporator under reduced pressure for 12 hours. A semitransparent blue substance 4Mi-10%PrSm—Y—Yb (substance described in Example 4, Y-based material with impurity) was obtained.

The obtained semitransparent blue substance 4Mi-10%PrSm—Y—Yb contained water or acetic acid as a byproduct of a reaction at the time of synthesis of a solution in an amount of about 7 wt %.

The obtained 4Mi-10%PrSm—Y—Yb was completely dissolved in methanol having a weight about 100 times the substance (f in FIG. 6), and the solution was subjected to a reaction and purification again in a rotary evaporator under reduced pressure for 12 hours to obtain a semitransparent blue substance 4M-10%PrSm—Y—Yb (substance described in Example 4, Y-based material without impurity).

The semitransparent blue substance 4M-10%PrSm—Y—Yb was dissolved in methanol (j in FIG. 6), and was diluted using a measuring flask to obtain a 1.50 mol/l coating solution 4Cs-10%PrSm—Y—Yb (Example 4, coating solution for Y-based superconductor) in terms of a metal ion.

Similarly, a coating solution for YBCO 4Cs—Y was prepared, and the following solutions were prepared by diluting and mixing 4Cs—Y with 4Cs-10%PrSm—Y—Yb. 4Cs-1%PrSm—Y—Yb, 4Cs-1000ppmPrSm—Y—Yb, 4Cs-100ppmPrSm—Y—Yb, 4Cs-10ppmPrSm—Y—Yb, 4Cs-1ppmPrSm—Y—Yb, 4Cs-100ppbPrSm—Y—Yb, 4Cs-10ppbPrSm—Y—Yb, and 4Cs-1ppbPrSm—Y—Yb were obtained.

A film was formed by using the coating solutions 4Cs-10%PrSm—Y—Yb, 4Cs-1%PrSm—Y—Yb, 4Cs-1000ppmPrSm—Y—Yb, 4Cs-100ppmPrSm—Y—Yb, 4Cs-10ppmPrSm—Y—Yb, 4Cs-1ppmPrSm—Y—Yb, 4Cs-100ppbPrSm—Y—Yb, 4Cs-10ppbPrSm—Y—Yb, and 4Cs-1ppbPrSm—Y—Yb by a spin coating method at a maximum rotation number of 2000 rpm.

Subsequently, calcining was performed in an atmosphere of pure oxygen at 400° C. or lower according to the profile illustrated in FIG. 8. Subsequently, firing was performed in a 1000 ppm oxygen-mixed argon gas at 800° C. according to the profile illustrated in FIG. 9, and annealing was performed in pure oxygen at 525° C. or lower. The superconducting films 4FS-10%PrSm—Y—Yb (Example 4, Y-based film of superconductor), 4FS-1%PrSm—Y—Yb, 4FS-1000ppmPrSm—Y—Yb, 4FS-100ppmPrSm—Y—Yb, 4FS-10ppmPrSm—Y—Yb, 4FS-1ppmPrSm—Y—Yb, 4FS-100ppbPrSm—Y—Yb, 4FS-10ppbPrSm—Y—Yb, and 4FS-1ppbPrSm—Y—Yb were obtained.

Measurement was performed for the superconducting films 4FS-10%PrSm—Y—Yb, 4FS-1%PrSm—Y—Yb, 4FS-1000ppmPrSm—Y—Yb, 4FS-100ppmPrSm—Y—Yb, 4FS-10ppmPrSm—Y—Yb, 4FS-1ppmPrSm—Y—Yb, 4FS-100ppbPrSm—Y—Yb, 4FS-10ppbPrSm—Y—Yb, and 4FS-1ppbPrSm—Y—Yb by a 2θ/ω method in XRD measurement. It was confirmed that only one peak was obtained at almost the same position as a YBCO(00n) peak in each of all the samples. In addition, a satisfactory peak intensity was confirmed. It is considered that an added rare earth element forms a continuous Perovskite structure without being separated.

The superconducting films 4FS-10%PrSm—Y—Yb, 4FS-1%PrSm—Y—Yb, 4FS-1000ppmPrSm—Y—Yb, 4FS-100ppmPrSm—Y—Yb, 4FS-10ppmPrSm—Y—Yb, 4FS-1ppmPrSm—Y—Yb, 4FS-100ppbPrSm—Y—Yb, 4FS-10ppbPrSm—Y—Yb, and 4FS-1ppbPrSm—Y—Yb were each disposed in liquid nitrogen, and a superconducting characteristic thereof was measured under a self-magnetic field by an induction method. Jc values were 5.5, 5.8, 6.0, 6.1, 6.0, 6.2, 6.0, 6.2, and 6.1 MA/cm$^2$ (77 K, 0 T), respectively. It is considered that all of these Jc values are relatively satisfactory. A 5 times degradation phenomenon caused by ultimate dispersion of PrBCO is not observed, and it is considered that CARP has been formed.

A Jc value of each of the superconducting films 4FS-10%PrSm—Y—Yb, 4FS-1%PrSm—Y—Yb, 4FS-1000ppmPrSm—Y—Yb, 4FS-100ppmPrSm—Y—Yb, 4FS-10ppmPrSm—Y—Yb, 4FS-1ppmPrSm—Y—Yb, 4FS-100ppbPrSm—Y—Yb, 4FS-10ppbPrSm—Y—Yb, and 4FS-1ppbPrSm—Y—Yb was measured in a magnetic field of 1 or 5 T at 77 K. When the content of Pr was 10 ppb or more, a Jc value was improved to 1.3 times at 77 K. When the content of Pr was 1 ppb, a Jc value was about one time, and an effect was not recognized.

In order to examine an influence of IBC for the superconducting films 4FS-10%PrSm—Y—Yb, 4FS-1%PrSm—Y—Yb, 4FS-1000ppmPrSm—Y—Yb, 4FS-100ppmPrSm—Y—Yb, 4FS-10ppmPrSm—Y—Yb, 4FS-1ppmPrSm—Y—Yb, 4FS-100ppbPrSm—Y—Yb, and 4FS-10ppbPrSm—Y—Yb, Jc-B-T measurement was performed at 1 to 15 T at 50 K and at 5 to 15 T at 30 K. For all the samples, If(IBC)≤0.020 could be confirmed at 10 T or less at 50 K or 30 K. It is considered that this result indicates that an influence of IBC is not caused when the amount of a cluster is small.

The artificial pin in Example 4 is the second CARP, and can reduce an influence of IBC by clustering. A coil formed using the superconductor in the present Example hardly causes a quenching burning accident, and has excellent stability of a magnetic field. Therefore, it is considered that a superconducting device hardly causing a quenching burning accident and having excellent stability of a magnetic field can be formed.

Example 5

A coating solution for a superconductor was synthesized and purified according to the flowchart illustrated in FIG. 6. Powdery hydrates of $Pr(OCOCH_3)_3$, $Sm(OCOCH_3)_3$, $Y(OCOCH_3)_3$, $Tm(OCOCH_3)_3$, $Ba(OCOCH_3)_2$, and $Cu(OCOCH_3)_2$ as metal acetates were dissolved in ion exchange water at a metal ion molar ratio of 0.02:0.02:0.92:0.04:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 5Mi-2%PrSm—Y—Tm (substance described in Example 5, Y-based material with impurity) was obtained.

Similarly, powdery hydrates of $Pr(OCOCH_3)_3$, $Sm(OCOCH_3)_3$, $Y(OCOCH_3)_3$, $Tm(OCOCH_3)_3$, $Ba(OCOCH_3)_2$, and $Cu(OCOCH_3)_3$, as metal acetates were dissolved in ion exchange water at a metal ion molar ratio of 0.01:0.01:0.96:0.02:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 5Mi-1%PrSm—Y—Tm was obtained.

Each of the obtained semitransparent blue substances 5Mi-2%PrSm—Y—Tm and 5Mi-1%PrSm—Y—Tm contained water or acetic acid as a byproduct of a reaction at the time of synthesis of a solution in an amount of about 7 wt %.

The obtained semitransparent blue substances 5Mi-2%PrSm—Y—Tm and 5Mi-1%PrSm—Y—Tm were each completely dissolved in methanol having a weight about 100 times the substance (f in FIG. 6), and the solutions were subjected to a reaction and purification again in a rotary evaporator under reduced pressure for 12 hours to obtain semitransparent blue substances 5M-2%PrSm—Y—Tm (substance described in Example 5, Y-based material without impurity) and 5M-1%PrSm—Y—Tm, respectively.

The semitransparent blue substances 5M-2%PrSm—Y—Tm and 5M-1%PrSm—Y—Tm were dissolved in methanol (j in FIG. 6), and were diluted using a measuring flask to obtain 1.50 mol/l coating solutions 5Cs-2%PrSm—Y—Tm (Example 5, coating solution for Y-based superconductor) and 5Cs-1%PrSm—Y—Tm in terms of a metal ion, respectively.

A film was formed by using the coating solutions 5Cs-2%PrSm—Y—Tm and 5Cs-1%PrSm—Y—Tm by a spin coating method at a maximum rotation number of 2000 rpm. Calcining was performed in an atmosphere of pure oxygen at 400° C. or lower according to the profile illustrated in FIG. 8. Firing was performed in a 1000 ppm oxygen-mixed argon gas at 800° C. according to the profile illustrated in FIG. 9, and annealing was performed in pure oxygen at 525° C. or lower. The superconducting films 5FS-2%PrSm—Y—Tm (Example 5, Y-based film of superconductor) and 5FS-1%PrSm—Y—Tm were obtained.

Measurement was performed for the superconducting films 5FS-2%PrSm—Y—Tm and 5FS-1%PrSm—Y—Tm by a 2θ/ω method in XRD measurement, and it was confirmed that a peak was obtained at almost the same position as a YBCO(00n) peak.

Measurement was performed for the superconducting films 5FS-2%PrSm—Y—Tm and 5FS-1%PrSm—Y—Tm by a 2θ/ω method in XRD measurement. A small different phase of a BaCu-based complex oxide was observed, but approximately the same peaks as the single peaks of YBCO (00n) were observed. Each of the peaks was one peak without being separated. A YBCO (006) peak at 2θ=46.68 degrees was clearly one peak without being separated.

A peak intensity was sufficiently strong, and it is estimated that all the materials formed a Perovskite structure. That is, this indicates that PrBCO, SmBCO, and TmBCO are incorporated into a Perovskite structure of YBCO in this system.

FIG. 16 illustrates a result obtained by performing Jc measurement of the superconducting films 5FS-2%PrSm—Y—Tm and 5FS-1%PrSm—Y—Tm at 30 K at 1 to 5 T. The upper data (circle mark) in FIG. 16 indicates the present sample. FIG. 16 also illustrates measurement results of YBCO containing no CARP, indicated by a crossed mark and a broken line.

The content of CARP in the superconducting film 5FS-2%PrSm—Y—Tm is 8%. It is estimated that a characteristic is lowered by this content around 30 K/5 T. However, as indicated by the result in FIG. 16, a Jc value much higher than that of YBCO was obtained. Detailed data of lattice mismatch of Yb and Tm with respect to Y during firing at 800° C. is unclear, but it is considered that the mismatch amounts are about 3% and about 2%, respectively. According to this difference in lattice mismatch, Tm may have a nucleation frequency about 10 times larger than Yb, or may have a nucleation velocity about 10 times higher than Yb.

The CARP forming model indicates that the number of CARP in a unit volume becomes about 10 times in a case where the nucleation velocity is about 10 times higher. The size of CARP is proportional to an inverse of a cube root thereof. Therefore, it is considered that a CARP radius is 0.46 times. Tm was used under a condition in which an effect was slightly observed in Yb excess CARP, and the size of CARP became smaller rapidly. Therefore, it is considered that a quantum magnetic flux was easily trapped by CARP to exhibit an effect.

In order to confirm the effect, FIG. 16 also illustrates a measurement result of the superconducting film 5FS-1%PrSm—Y—Tm containing CARP in the half amount in a magnetic field. White circle data in FIG. 16 indicates this. CARP in this superconducting film has the same size and the half number theoretically. A result of almost the half was obtained. Strictly speaking, it is considered that the result is in the middle of a reduction amount of CARP as an obstacle and 5FS-2%PrSm—Y—Tm. However, it is considered that the difference was not observed due to being buried in experimental errors.

As indicated by this result, it is theoretically understood that CARP exhibits an effect by using Tm or an element closer to MA than Tm for CA. This is because the size of CARP can be explained by the CARP forming model. The size of CARP is determined by a nucleation frequency and the amount of substances present there. Therefore, an effect is exhibited by a combination of MA and CA having a large nucleation frequency.

From experiments so far, a simple substance which can be used for MA is Y or Gd. However, it is known that a solution is obtained by mixing. As CA with respect to such MA, Er or Tm is good, and it is also considered that the size is adjusted by adding Yb partially. Of course, it is also possible to make an adjustment by mixing an element having a smaller atomic number than Er partially. By this combination, a characteristic improvement at 30 K, which is considered to be particularly important in practical use, has been observed.

As described above, a combination in which an artificial pin to improve a characteristic at 30 K is formed particularly easily has been found by applying the CARP forming model. This is mainly a superconductor using Er or Tm for CA and using Y or the like for MA. In addition, it is considered that a combination matched with this model will exhibit an effect. It seems that the above combination is good particularly for exhibiting an effect at 30 K.

The above CARP has another characteristic, and does not lower Tc of a superconductor. In addition, experimental data indicates that an inner bypass current is hardly generated.

FIGS. 34A, 34B, 35A, 35B, 36A, 36B, 37A, 37B, 38A, 38B, 39A, 39B, 40A, and 40B are graphs illustrating a current voltage characteristic in Example 5. These illustrate a result at the time of Jc-B-T measurement of the superconducting film 5FS-2%PrSm—Y—Tm. As indicated by the figures, a noise at the time of IV measurement is at an extremely low level.

Data in Example 5 is indicated in a lower side of Table 2. Note that data at 50 K includes only data measured at 1 to 5 T. All the data at 50 K is zero in an experimental error range. In addition, data at 30 K is also almost zero except that a value is slightly increased at 15 T. This result matches with estimation obtained from a model that a voltage due to an inner bypass current of CARP is not generated theoretically. In addition, this result also matches with a theory that a voltage due to an inner bypass current does not depend on a pin size even when the pin size of CARP is reduced. The data also supports that the CARP is an artificial pin which has not been achieved so far.

Example 6

A coating solution for a superconductor was synthesized and purified according to the flowchart illustrated in FIG. 6. Powdery hydrates of $Pr(OCOCH_3)_3$, $Sm(OCOCH_3)_3$, $Y(OCOCH_3)_3$, $Er(OCOCH_3)_3$, $Ba(OCOCH_3)_2$, and $Cu(OCOCH_3)_2$ as metal acetates were dissolved in ion exchange water at a metal ion molar ratio of 0.02:0.02:0.92:0.04:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 6Mi-2%PrSm—Y—Er (substance described in Example 6, Y-based material with impurity) was obtained.

Similarly, powdery hydrates of $Pr(OCOCH_3)_3$, $Sm(OCOCH_3)_3$, $Y(OCOCH_3)_3$, $Tm(OCOCH_3)_3$, $Ba(OCOCH_3)_2$, and $Cu(OCOCH_3)_2$ as metal acetates were dissolved in ion exchange water at a metal ion molar ratio of 0.02:0.02:0.92:0.04:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 6Mi-2%PrSm—Y—Tm was obtained.

Furthermore, similarly, powdery hydrates of $Pr(OCOCH_3)_3$, $Sm(OCOCH_3)_3$, $Y(OCOCH_3)_3$, $Yb(OCOCH_3)_3$, $Ba(OCOCH_3)_2$, and $Cu(OCOCH_3)_2$ as metal acetates were dissolved in ion exchange water at a metal ion molar ratio of 0.02:0.02:0.92:0.04:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 6Mi-2%PrSm—Y—Yb was obtained.

Each of the obtained semitransparent blue substances 6Mi-2%PrSm—Y—Er, 6Mi-2%PrSm—Y—Tm, and 6Mi-2%PrSm—Y—Yb contained water or acetic acid as a byproduct of a reaction at the time of synthesis of a solution in an amount of about 7 wt %.

The obtained semitransparent blue substances 6Mi-2%PrSm—Y—Er, 6Mi-2%PrSm—Y—Tm, and 6Mi-2%PrSm—Y—Yb were each completely dissolved in methanol having a weight about 100 times the substance (f in FIG. 6), and the solutions were subjected to a reaction and purification again in a rotary evaporator under reduced pressure for 12 hours to obtain semitransparent blue substances 6M-2%PrSm—Y—Er (substance described in Example 6, Y-based material without impurity), 6M-2%PrSm—Y—Tm, and 6M-2%PrSm—Y—Yb, respectively.

The semitransparent blue substances 6M-2%PrSm—Y—Er, 6M-2%PrSm—Y—Tm, and 6M-2%PrSm—Y—Yb were dissolved in methanol (j in FIG. 6), and were diluted using a measuring flask to obtain 1.50 mol/l coating solutions 6Cs-2%PrSm—Y—Er (Example 6, coating solution for Y-based superconductor), 6Cs-2%PrSm—Y—Tm, and 6Cs-2%PrSm—Y—Yb in terms of a metal ion, respectively.

The coating solutions 6Cs-2%PrSm—Y—Er and 6Cs-2%PrSm—Y—Tm were mixed with each other at 1:9, 2:8, and 3:7 to obtain coating solutions 6Cs-2%PrSm—Y-0.4%Er3.6%Tm, 6Cs-2%PrSm—Y-0.8%Er3.2%Tm, and 6Cs-2%PrSm—Y-1.2%Er2.8%Tm, respectively.

The coating solutions 6Cs-2%PrSm—Y—Tm and 6Cs-2%PrSm—Y—Yb were mixed with each other at 8:2, 6:4, and 4:6 to obtain coating solutions 6Cs-2%PrSm—Y-3.2%Tm0.8%Yb, 6Cs-2%PrSm—Y-2.4%Tm1.6%Yb, and 6Cs-2%PrSm—Y-1.6%Tm2.4%Yb, respectively.

A film was formed by using the coating solutions 6Cs-2%PrSm—Y-0.4%Er3.6%Tm, 6Cs-2%PrSm—Y-0.8%Er3.2%Tm, 6Cs-2%PrSm—Y-1.2%Er2.8%Tm, 6Cs-2%PrSm—Y-3.2%Tm0.8%Yb, 6Cs-2%PrSm—Y-2.4%Tm1.6%Yb, and 6Cs-2%PrSm—Y-1.6%Tm2.4%Yb by a spin coating method at a maximum rotation number of 2000 rpm. Calcining was performed in an atmosphere of pure oxygen at 400° C. or lower according to the profile illustrated in FIG. 8. Firing was performed in a 1000 ppm oxygen-mixed argon gas at 800° C. according to the profile illustrated in FIG. 9, and annealing was performed in pure oxygen at 525° C. or lower. The superconducting films 6FS-2%PrSm—Y-0.4%Er3.6%Tm (Example 6, Y-based film of superconductor), 6FS-2%PrSm—Y-0.8%Er3.2%Tm, 6FS-2%PrSm—Y-1.2%Er2.8%Tm, 6FS-2%PrSm—Y-3.2%Tm0.8%Yb, 6FS-2%PrSm—Y-2.4%Tm1.6%Yb, and 6FS-2%PrSm—Y-1.6%Tm2.4%Yb were obtained.

Measurement was performed for the superconducting films 6FS-2%PrSm—Y-0.4%Er3.6%Tm, 6FS-2%PrSm—Y-0.8%Er3.2%Tm, 6FS-2%PrSm—Y-1.2%Er2.8%Tm, 6FS-2%PrSm—Y-3.2%Tm0.8%Yb, 6FS-2%PrSm—Y-2.4%Tm1.6%Yb, and 6FS-2%PrSm—Y-1.6%Tm2.4%Yb by a 2θ/ω method in XRD measurement, and it was confirmed that a peak was obtained at almost the same position as a YBCO(00n) peak.

Measurement was performed for the superconducting films 6FS-2%PrSm—Y-0.4%Er3.6%Tm, 6FS-2%PrSm—Y-0.8%Er3.2%Tm, 6FS-2%PrSm—Y-1.2%Er2.8%Tm, 6FS-2%PrSm—Y-3.2%Tm0.8%Yb, 6FS-2%PrSm—Y-2.4%Tm1.6%Yb, and 6FS-2%PrSm—Y-1.6%Tm2.4%Yb by a 2θ/ω method in XRD measurement. A small different phase of a BaCu-based complex oxide was observed, but approximately the same peaks as the single peaks of YBCO (00n) were observed. Each of the peaks was one peak without being separated. A YBCO (006) peak at 2θ=46.68 degrees was clearly one peak without being separated.

A peak intensity was sufficiently strong, and it is estimated that all the materials formed a Perovskite structure. That is, this indicates that PrBCO, SmBCO, ErBCO, TmBCO, and YbBCO are incorporated into a Perovskite structure of YBCO in this system.

Jc measurement of the superconducting films 6FS-2%PrSm—Y-0.4%Er3.6%Tm, 6FS-2%PrSm—Y-0.8%Er3.2%Tm, 6FS-2%PrSm—Y-1.2%Er2.8%Tm, 6FS-2%PrSm—Y-3.2%Tm0.8%Yb, 6FS-2%PrSm—Y-2.4%Tm1.6%Yb, and 6FS-2%PrSm—Y-1.6%Tm2.4%Yb was performed at 30 K at 5 T. Results thereof (MA/cm$^2$) were 2.13, 2.39, 2.60, 1.65, 1.44, and 1.21, respectively.

Argument on lattice mismatch of Tm and Yb has been described above. As a ratio of Yb was increased, the size of CARP was increased, and a stronger tendency that a characteristic at 30 K/5 T was reduced was observed. This result also matches with the CARP forming model that the nucleation velocity determines the size of CARP.

On the other hand, a sample obtained by adding a small amount of Er to Tm had a characteristic largely increased. This also indicates that the nucleation velocity of Er is much larger than that of Tm, and suggests that the size of CARP is reduced. It is considered that a characteristic at 30 K/5 T was thereby improved.

A noise of the superconducting films 6FS-2%PrSm—Y-0.4%Er3.6%Tm, 6FS-2%PrSm—Y-0.8%Er3.2%Tm, 6FS-2%PrSm—Y-1.2%Er2.8%Tm, 6FS-2%PrSm—Y-3.2%Tm0.8%Yb, 6FS-2%PrSm—Y-2.4%Tm1.6%Yb, and 6FS-2%PrSm—Y-1.6%Tm2.4%Yb at the time of IV measurement at 30 K/5 T was about 1/100 to 1/300 of that of a superconducting film into which a BZO artificial pin had been introduced, obtained by a physical deposition method. This result indicates that the noise is almost zero.

In this case, the CARPs formed in the superconductors measured in the above Examples have different sizes. However, from calculation of current bypass due to a superconducting current and CARP, it is theoretically known that a current flows in a bypass without depending on R as a CARP radius. Based on this result, all the voltages due to an inner bypass current should be about 1/300. However, a voltage of about 1/100 was also confirmed. However, it is considered that this voltage level has no problem in practical use.

In trial manufacturing of a coil to be applied to a heavy particle radiotherapeutic device, a superconducting film including a BZO artificial pin, formed by a PLD method obtained an actually measured value of 0.1%, ten times larger than 0.01% as a required magnetic field accuracy at 5 T. This makes it impossible to irradiate an affected part of a patient with a particle beam accurately.

However, when a coils is manufactured using a wire material including the CARP pin developed this time, it is considered that the magnetic field accuracy is improved by about 100 times, and there is a high possibility that an accuracy at 5 T is 0.001%. It takes a few more years in order to manufacture a coil by applying this technology to a long wire material. Therefore, a magnetic field accuracy formed is unclear at present. However, it is considered that about 100 times improvement will be obtained in a noise voltage due to an inner bypass current. Improvement of ten times in accuracy will be achieved easily, and there is a high possibility that a technology to provide a Y-based coil at a practical use level for the first time will be obtained.

In Examples, a heavy particle radiotherapeutic device has been exemplified as a superconducting device. However, the present disclosure can be applied to a superconducting device such as a superconducting magnetically-levitated train or a nuclear fusion furnace.

While certain embodiments have been described, these embodiments have been presented by way of example only, and are not intended to limit the scope of the inventions. Indeed, the superconducting coil and the superconducting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A superconducting coil comprising a superconducting wire including an oxide superconductor layer,
    the oxide superconductor layer having a continuous Perovskite structure including rare earth elements, barium (Ba), and copper (Cu),
    the rare earth elements include a first element, at least one second element, at least one third element, and at least one fourth element, the first element being praseodymium (Pr), the at least one second element being selected from the group consisting of neodymium (Nd), samarium (Sm), europium (Eu), and gadolinium (Gd), the at least one third element being selected from the group consisting of yttrium (Y), terbium (Tb), dysprosium (Dy), and holmium (Ho), and the at least one fourth element being selected from the group consisting of erbium (Er), thulium (Tm), ytterbium (Yb), and lutetium (Lu), and
    the oxide superconductor layer comprising a first area and a second area, when brightness of barium in a HAADF-STEM (High-Angle Annular Dark Field Scanning Transmission Electron Microscopy) image being represented by I(Ba) and brightness in the HAADF-STEM image of an rare earth element sandwiched by barium being represented by I(RE), I(RE)/I(Ba) in the first area being 1.3 times or more I(RE)/I(Ba) in the second area.

2. The superconducting coil according to claim 1, wherein the at least one second element is selected from the group consisting of neodymium (Nd) and samarium (Sm), the at least one third element is selected from the group consisting of yttrium (Y), dysprosium (Dy), and holmium (Ho), and the at least one fourth element is selected from the group consisting of erbium (Er) and thulium (Tm).

3. The superconducting coil according to claim 1, wherein the at least one second element is samarium (Sm), the at least one third element is selected from the group consisting of yttrium (Y) and holmium (Ho), and the at least one fourth element is thulium (Tm).

4. The superconducting coil according to claim 1, wherein the oxide superconductor layer includes fluorine (F) of $2.0 \times 10^{15}$ atoms/cc or more and $5.0 \times 10^{19}$ atoms/cc or less and carbon (C) of $1.0 \times 10^{17}$ atoms/cc or more and $5.0 \times 10^{20}$ atoms/cc or less.

5. The superconducting coil according to claim 1, wherein when the number of atoms of the rare earth elements is N(RE), and the number of atoms of the at least one third element is N(MA), N(MA)/N(RE)≥0.6 is satisfied.

6. The superconducting coil according to claim 1, wherein when the number of atoms of the rare earth elements is N(RE), and the number of atoms of the first element is N(PA), 0.00000001≤N(PA)/N(RE) is satisfied.

7. The superconducting coil according to claim 1, wherein when the number of atoms of the rare earth elements is N(RE), the number of atoms of the first element is N(PA), and the number of atoms of the at least one second element is N(SA), (N(PA)+N(SA))/N(RE)≤0.2 is satisfied.

8. The superconducting coil according to claim 1, wherein when the number of atoms of the first element is N(PA), the number of atoms of the at least one second element is N(SA), and the number of atoms of the at least one fourth element is N(CA), 0.8×N(CA)≤N(PA)+N(SA)≤1.2×N(CA) is satisfied.

9. The superconducting coil according to claim 1, wherein
the superconducting wire further includes a tape-shaped substrate and a metal layer, and
the oxide superconductor layer is disposed between the substrate and the metal layer.

10. A superconducting device comprising the superconducting coil according to claim 1.

11. A superconducting coil comprising a superconducting wire including an oxide superconductor layer,
the oxide superconductor layer having a continuous Perovskite structure including rare earth elements, barium (Ba), and copper (Cu),
the rare earth elements including a first element, at least one second element, and at least one third element, the first element being praseodymium (Pr), the at least one second element being selected from the group consisting of gadolinium (Gd), yttrium (Y), terbium (Tb), dysprosium (Dy), and holmium (Ho), and the at least one third element being selected from the group consisting of erbium (Er), thulium (Tm), ytterbium (Yb), and lutetium (Lu), and
the oxide superconductor layer comprising a first area and a second area, when brightness of barium in a HAADF-STEM (High-Angle Annular Dark Field Scanning Transmission Electron Microscopy) image being represented by I(Ba) and brightness in the HAADF-STEM image of an rare earth element sandwiched by barium being represented by I(RE), I(RE)/I(Ba) in the first area being 1.3 times or more I(RE)/I(Ba) in the second area.

12. The superconducting coil according to claim 11, wherein the oxide superconductor layer includes fluorine of $2.0 \times 10^{15}$ atoms/cc or more and $5.0 \times 10^{19}$ atoms/cc or less and carbon of $1.0 \times 10^{17}$ atoms/cc or more and $5.0 \times 10^{20}$ atoms/cc or less.

13. The superconducting coil according to claim 11, wherein when the number of atoms of the rare earth elements is N(RE), and the number of atoms of the at least second element is N(MA), N(MA)/N(RE)≥0.6 is satisfied.

14. The superconducting coil according to claim 11, wherein when the number of atoms of the rare earth elements is N(RE), and the number of atoms of the first element is N(PA), 0.00000001≤N(PA)/N(RE) is satisfied.

15. The superconducting coil according to claim 11, wherein when the number of atoms of the rare earth elements is N(RE), and the number of atoms of the first element is N(PA), N(PA)/N(RE)≤0.2 is satisfied.

16. The superconducting coil according to claim 11, wherein
the superconducting wire further includes a tape-shaped substrate and a metal layer, and
the oxide superconductor layer is disposed between the substrate and the metal layer.

17. A superconducting device comprising the superconducting coil according to claim 11.

* * * * *